(12) United States Patent
Kinzer et al.

(10) Patent No.: US 10,305,472 B1
(45) Date of Patent: May 28, 2019

(54) HALF BRIDGE DRIVER CIRCUITS

(71) Applicant: Navitas Semiconductor, Inc., El Segundo, CA (US)

(72) Inventors: Daniel Marvin Kinzer, El Segundo, CA (US); Santosh Sharma, Laguna Nigel, CA (US); Ju Zhang, Monterey Park, CA (US)

(73) Assignee: Navitas Semiconductor, Inc., El Segundo, CA (US)

( * ) Notice: Subject to any disclaimer, the term of this patent is extended or adjusted under 35 U.S.C. 154(b) by 0 days.

(21) Appl. No.: 15/961,781

(22) Filed: Apr. 24, 2018

Related U.S. Application Data

(63) Continuation of application No. 15/431,641, filed on Feb. 13, 2017, now Pat. No. 9,960,764, which is a continuation of application No. 14/877,574, filed on Oct. 7, 2015, now Pat. No. 9,571,093, which is a
(Continued)

(51) Int. Cl.
| | |
|---|---|
| *H02M 1/08* | (2006.01) |
| *H02M 1/084* | (2006.01) |
| *H02M 1/088* | (2006.01) |
| *H02M 1/38* | (2007.01) |
| *H02M 1/36* | (2007.01) |
| *H02M 3/158* | (2006.01) |

(Continued)

(52) U.S. Cl.
CPC .......... *H03K 17/687* (2013.01); *H02M 1/36* (2013.01); *H02M 1/38* (2013.01); *H02M 3/1588* (2013.01); *H03K 19/017509* (2013.01); *H03K 2217/0063* (2013.01); *H03K 2217/0072* (2013.01)

(58) Field of Classification Search
CPC ........ H02M 1/08; H02M 1/084; H02M 1/088; H02M 1/38; H02M 1/36; H02M 3/1588
See application file for complete search history.

(56) References Cited

U.S. PATENT DOCUMENTS

| | | |
|---|---|---|
| 4,698,530 A | 10/1987 | Thomson |
| 5,079,744 A | 1/1992 | Tobita et al. |
| | (Continued) | |

FOREIGN PATENT DOCUMENTS

| | | |
|---|---|---|
| CN | 101572490 | 11/2009 |
| CN | 101621871 | 6/2010 |
| | (Continued) | |

OTHER PUBLICATIONS

DA8801 Integrated 650V GaN Half Bridge Power IC, Dialog Semiconductor, Available Online at http://www.dialogsemiconductor.com/products/da8801, Jan. 3, 2017, 6 pages (of-record in parent application).
(Continued)

*Primary Examiner* — Timothy J. Dole
*Assistant Examiner* — Sisay G Tiku
(74) *Attorney, Agent, or Firm* — Kilpatrick Townsend & Stockton LLP

(57) ABSTRACT

GaN-based half bridge power conversion circuits employ control, support and logic functions that are monolithically integrated on the same devices as the power transistors. In some embodiments, a low side GaN device communicates through one or more level shift circuits with a high side GaN device. Both the high side and the low side devices may have one or more integrated control, support and logic functions.

17 Claims, 39 Drawing Sheets

Related U.S. Application Data continuation-in-part of application No. 14/667,531, filed on Mar. 24, 2015, now Pat. No. 9,647,476.

(60) Provisional application No. 62/127,725, filed on Mar. 3, 2015, provisional application No. 62/051,160, filed on Sep. 16, 2014.

(51) Int. Cl.
*H03K 17/687* (2006.01)
*H03K 19/0175* (2006.01)

(56) References Cited

U.S. PATENT DOCUMENTS

| | | | |
|---|---|---|---|
| 5,138,200 A * | 8/1992 | Barsanti | H03K 17/063 326/88 |
| 5,274,274 A | 12/1993 | Leman et al. | |
| 5,502,412 A | 3/1996 | Tam et al. | |
| 5,545,955 A | 8/1996 | Wood | |
| 5,808,879 A | 9/1998 | Liu et al. | |
| 6,166,971 A | 12/2000 | Tamura et al. | |
| 6,211,706 B1 | 4/2001 | Choi et al. | |
| 6,229,342 B1 | 5/2001 | Noble et al. | |
| 6,304,094 B2 | 10/2001 | Gilliam | |
| 6,307,399 B1 | 10/2001 | Lien et al. | |
| 6,317,000 B1 | 11/2001 | Ivanov et al. | |
| 6,353,345 B1 | 3/2002 | Yushan et al. | |
| 6,365,930 B1 | 4/2002 | Schillaci et al. | |
| 6,590,914 B1 | 7/2003 | Tanase et al. | |
| 6,593,622 B2 | 7/2003 | Sammon et al. | |
| 6,605,963 B2 | 8/2003 | Kitamoto et al. | |
| 6,614,633 B1 | 9/2003 | Kohno | |
| 7,254,000 B1 * | 8/2007 | Smith | H02H 7/1213 323/224 |
| 7,385,375 B2 | 6/2008 | Rozman et al. | |
| 7,724,046 B2 | 5/2010 | Wendt et al. | |
| 7,808,222 B2 | 10/2010 | Ueunten | |
| 7,881,029 B1 | 2/2011 | Li et al. | |
| 7,928,950 B2 | 4/2011 | Osame et al. | |
| 8,044,699 B1 | 10/2011 | Kelly et al. | |
| 8,134,400 B2 * | 3/2012 | Yamamoto | H03K 17/168 326/62 |
| 8,144,441 B2 | 3/2012 | Ping et al. | |
| 8,324,934 B1 | 12/2012 | Truong et al. | |
| 8,593,211 B2 | 11/2013 | Forghani-Zadeh et al. | |
| 8,659,275 B2 | 2/2014 | Bahramian et al. | |
| 8,823,012 B2 | 9/2014 | Lidow et al. | |
| 8,970,262 B2 | 3/2015 | Weis et al. | |
| 9,064,722 B2 | 6/2015 | Bedell et al. | |
| 9,225,163 B2 | 12/2015 | Cao et al. | |
| 9,264,022 B2 | 2/2016 | Kihara | |
| 9,276,413 B1 | 3/2016 | Zhang | |
| 9,374,858 B2 | 6/2016 | Ni | |
| 9,401,612 B2 | 7/2016 | Kinzer et al. | |
| 9,413,166 B2 | 8/2016 | Rupp et al. | |
| 9,525,410 B2 | 12/2016 | Shin et al. | |
| 9,537,338 B2 | 1/2017 | Kinzer et al. | |
| 9,570,927 B2 | 2/2017 | Kinzer et al. | |
| 9,571,093 B2 | 2/2017 | Kinzer et al. | |
| 9,577,530 B1 | 2/2017 | Ribarich et al. | |
| 9,685,869 B1 | 6/2017 | Kinzer et al. | |
| 9,712,058 B1 * | 7/2017 | Newlin | H02M 3/158 |
| 9,716,395 B2 | 7/2017 | Kinzer et al. | |
| 9,722,609 B2 | 8/2017 | Kinzer et al. | |
| 9,831,867 B1 | 11/2017 | Kinzer et al. | |
| 9,859,732 B2 | 1/2018 | Kinzer et al. | |
| 10,135,275 B2 | 11/2018 | Kinzer et al. | |
| 10,170,922 B1 | 1/2019 | Kinzer et al. | |
| 2003/0067339 A1 | 4/2003 | Yamamoto et al. | |
| 2005/0134533 A1 * | 6/2005 | Sasada | G09G 3/294 345/60 |
| 2005/0151236 A1 | 7/2005 | Oliver et al. | |
| 2005/0219017 A1 | 10/2005 | Shirakawa | |
| 2006/0256586 A1 | 11/2006 | Ohshima et al. | |
| 2006/0256589 A1 | 11/2006 | Choi et al. | |
| 2007/0063678 A1 | 3/2007 | Yoshikawa et al. | |
| 2007/0170465 A1 | 7/2007 | Kwon et al. | |
| 2007/0285066 A1 | 12/2007 | Lipcsei et al. | |
| 2008/0012542 A1 | 1/2008 | Liu et al. | |
| 2008/0054979 A1 | 3/2008 | Nagumo et al. | |
| 2008/0062595 A1 | 3/2008 | Ping et al. | |
| 2008/0136390 A1 | 6/2008 | Briere | |
| 2008/0284482 A1 | 11/2008 | Ishikawa et al. | |
| 2009/0052216 A1 | 2/2009 | Iwabuchi et al. | |
| 2009/0180304 A1 | 7/2009 | Bahramian et al. | |
| 2009/0256617 A1 * | 10/2009 | Ochi | H03F 3/2173 327/333 |
| 2009/0284288 A1 | 11/2009 | Zhang et al. | |
| 2010/0019279 A1 | 1/2010 | Chen et al. | |
| 2010/0025730 A1 | 2/2010 | Heikman et al. | |
| 2010/0060320 A1 | 3/2010 | Lee | |
| 2010/0140660 A1 | 6/2010 | Wu et al. | |
| 2010/0253296 A1 | 10/2010 | Huang et al. | |
| 2010/0315163 A1 * | 12/2010 | Takagi | H03F 3/217 330/207 A |
| 2010/0315748 A1 | 12/2010 | Kwong et al. | |
| 2011/0025397 A1 | 2/2011 | Wang et al. | |
| 2011/0049526 A1 | 3/2011 | Chu et al. | |
| 2011/0157949 A1 | 6/2011 | Bahramian | |
| 2011/0204928 A1 | 8/2011 | Umezaki et al. | |
| 2011/0212585 A1 | 9/2011 | Huang et al. | |
| 2011/0215746 A1 | 9/2011 | Ikoshi et al. | |
| 2011/0216563 A1 | 9/2011 | Ribarich et al. | |
| 2011/0284862 A1 | 11/2011 | Zhang | |
| 2011/0316494 A1 | 12/2011 | Kitamura et al. | |
| 2012/0126765 A1 * | 5/2012 | Stone | H02M 1/36 323/283 |
| 2012/0220089 A1 | 8/2012 | Imada et al. | |
| 2012/0274366 A1 | 11/2012 | Briere et al. | |
| 2012/0293231 A1 | 11/2012 | Nishijima et al. | |
| 2012/0319758 A1 | 12/2012 | Kobayashi et al. | |
| 2013/0009674 A1 | 1/2013 | Reese et al. | |
| 2013/0051113 A1 | 2/2013 | Kwon et al. | |
| 2013/0056744 A1 | 3/2013 | Mishra et al. | |
| 2013/0063123 A1 | 3/2013 | Liang | |
| 2013/0063195 A1 | 3/2013 | Youssef et al. | |
| 2013/0076322 A1 | 3/2013 | Tateno et al. | |
| 2013/0099768 A1 | 4/2013 | Yonezawa et al. | |
| 2013/0119393 A1 | 5/2013 | Zhu et al. | |
| 2013/0146891 A1 | 6/2013 | Xin et al. | |
| 2013/0162923 A1 | 6/2013 | Umezaki et al. | |
| 2013/0193485 A1 | 8/2013 | Akiyama et al. | |
| 2013/0194003 A1 | 8/2013 | Takayama et al. | |
| 2013/0200938 A1 | 8/2013 | Yao et al. | |
| 2013/0240893 A1 | 9/2013 | Bedell et al. | |
| 2013/0241520 A1 | 9/2013 | Kim et al. | |
| 2013/0241621 A1 * | 9/2013 | Forghani-Zadeh | H03K 17/08122 327/315 |
| 2013/0248931 A1 | 9/2013 | Saito et al. | |
| 2013/0249017 A1 | 9/2013 | Kwon et al. | |
| 2013/0265029 A1 | 10/2013 | Akiyama et al. | |
| 2013/0343143 A1 | 12/2013 | Jung | |
| 2014/0001479 A1 | 1/2014 | Kudymov et al. | |
| 2014/0015586 A1 | 1/2014 | Hirler et al. | |
| 2014/0048810 A1 | 2/2014 | Umezaki et al. | |
| 2014/0070627 A1 | 3/2014 | Briere et al. | |
| 2014/0070786 A1 | 3/2014 | Guerra et al. | |
| 2014/0091311 A1 | 4/2014 | Jeon et al. | |
| 2014/0092637 A1 | 4/2014 | Minoura et al. | |
| 2014/0092638 A1 | 4/2014 | Nishimori et al. | |
| 2014/0167069 A1 | 6/2014 | Vielemeyer et al. | |
| 2014/0175454 A1 | 6/2014 | Roberts et al. | |
| 2014/0191281 A1 | 7/2014 | Yamaji et al. | |
| 2014/0225162 A1 | 8/2014 | Briere et al. | |
| 2014/0266389 A1 | 9/2014 | Sadwick et al. | |
| 2014/0300413 A1 | 10/2014 | Høyerby et al. | |
| 2014/0337603 A1 | 11/2014 | Watanabe et al. | |
| 2014/0347116 A1 | 11/2014 | Kihara et al. | |
| 2014/0347905 A1 | 11/2014 | Takizawa | |
| 2014/0353673 A1 | 12/2014 | Kotani et al. | |
| 2014/0361343 A1 | 12/2014 | Sriram | |
| 2014/0375372 A1 | 12/2014 | Ikeda | |

(56) References Cited

U.S. PATENT DOCUMENTS

| | | | |
|---|---|---|---|
| 2015/0034957 | A1 | 2/2015 | Chiu et al. |
| 2015/0042918 | A1 | 2/2015 | Umezaki et al. |
| 2015/0130428 | A1 | 5/2015 | Shao et al. |
| 2015/0137135 | A1 | 5/2015 | Hill et al. |
| 2015/0160678 | A1 | 6/2015 | Kadowaki et al. |
| 2015/0162424 | A1 | 6/2015 | Briere et al. |
| 2015/0162832 | A1 | 6/2015 | Briere |
| 2015/0255547 | A1 | 9/2015 | Yuan et al. |
| 2015/0256157 | A1 | 9/2015 | Kozuma |
| 2015/0263001 | A1 | 9/2015 | Saito et al. |
| 2015/0263620 | A1 | 9/2015 | Huang |
| 2015/0311196 | A1 | 10/2015 | Hirler et al. |
| 2015/0357422 | A1 | 12/2015 | Liao |
| 2015/0358003 | A1 | 12/2015 | Kihara |
| 2016/0013179 | A1 | 1/2016 | Miura |
| 2016/0056282 | A1 | 2/2016 | Yamaji |
| 2016/0065086 | A1 | 3/2016 | Zojer et al. |
| 2016/0079785 | A1 | 3/2016 | Kinzer et al. |
| 2016/0079844 | A1 | 3/2016 | Kinzer et al. |
| 2016/0079853 | A1 | 3/2016 | Kinzer |
| 2016/0079854 | A1 | 3/2016 | Kinzer et al. |
| 2016/0079964 | A1 | 3/2016 | Zhang et al. |
| 2016/0079975 | A1 | 3/2016 | Kinzer et al. |
| 2016/0079978 | A1 | 3/2016 | Kinzer et al. |
| 2016/0079979 | A1 | 3/2016 | Kinzer et al. |
| 2016/0086881 | A1 | 3/2016 | Standing |
| 2016/0086938 | A1 | 3/2016 | Kinzer |
| 2016/0118894 | A1 | 4/2016 | Zhang et al. |
| 2016/0141352 | A1 | 5/2016 | Sung |
| 2016/0173096 | A1 | 6/2016 | Nagatsuka et al. |
| 2016/0173097 | A1 | 6/2016 | Nagatsuka et al. |
| 2016/0240471 | A1 | 8/2016 | Mizan et al. |
| 2016/0247748 | A1 | 8/2016 | Kinzer et al. |
| 2016/0277008 | A1* | 9/2016 | Green ................... H02M 3/158 |
| 2016/0277012 | A1* | 9/2016 | Abesingha ............... H03K 5/14 |
| 2016/0307826 | A1 | 10/2016 | Klowak et al. |
| 2016/0322116 | A1 | 11/2016 | Bae et al. |
| 2016/0336926 | A1 | 11/2016 | Kinzer et al. |
| 2016/0372920 | A1 | 12/2016 | Kinzer et al. |
| 2017/0025267 | A1 | 1/2017 | Chu et al. |
| 2017/0093283 | A1* | 3/2017 | Leoncini ............... H02M 3/158 |
| 2017/0155391 | A1 | 6/2017 | Kinzer et al. |
| 2017/0162483 | A1 | 6/2017 | Kinzer |
| 2017/0163258 | A1 | 6/2017 | Kinzer et al. |
| 2017/0324263 | A1 | 11/2017 | Kinzer et al. |
| 2018/0102661 | A1 | 4/2018 | Kinzer et al. |
| 2018/0205373 | A1* | 7/2018 | Hokazono ............... H02M 1/08 |

FOREIGN PATENT DOCUMENTS

| | | |
|---|---|---|
| CN | 101572490 | 5/2012 |
| CN | 107005163 | 8/2017 |
| EP | 1120835 | 8/2001 |
| EP | 2763320 | 8/2014 |
| GB | 2244400 | 11/1991 |
| JP | 2000260451 | 9/2000 |
| JP | 2001308462 | 11/2001 |
| JP | 2013106027 | 5/2013 |
| TW | I626822 | 6/2008 |
| TW | 201401775 A | 1/2014 |
| TW | 201404038 A | 1/2014 |
| TW | 201618276 | 5/2016 |
| TW | 201622327 | 6/2016 |
| TW | 201624669 | 7/2016 |
| TW | 201624924 | 7/2016 |
| TW | 201629665 | 8/2016 |
| TW | 201804277 | 2/2018 |
| TW | I628780 B | 7/2018 |
| TW | I649969 | 2/2019 |
| WO | 2014171190 | 10/2014 |
| WO | 2016044474 | 3/2016 |
| WO | 2016044479 | 3/2016 |
| WO | 2016044480 | 3/2016 |
| WO | 2016044481 | 3/2016 |

OTHER PUBLICATIONS

Dialog Semiconductor Enters Gallium Nitride (GaN) Market with First Integrated Devices Targeting Fast Charging Power Adapters (news with additional features), Business Wire, A Berkshire Hathaway Company, Available Online at http://www.businesswire.com/news/home/20160824006260/en/Dialog-Semiconductor-Ente, Aug. 25, 2016, 3 pages ((of-record in parent application).
Advisory Action dated Apr. 20, 2016 in U.S. Appl. No. 14/667,319 in 4 pages (of-record in parent application).
Advisory Action dated Jan. 9, 2017 in U.S. Appl. No. 14/667,319 in 4 pages (of-record in parent application).
Final Office Action dated Feb. 16, 2016 in U.S. Appl. No. 14/667,319 in 9 pages (of-record in parent application).
Final Office Action dated Sep. 15, 2016 in U.S. Appl. No. 14/667,319 in 9 pages (of-record in parent application).
Applicant-Initiated Interview Summary with notification date of Dec. 14, 2015 in U.S. Appl. No. 14/667,319 in 8 pages (of-record in parent application).
First Action Interview Pilot Program Pre-Interview Communication dated Nov. 20, 2015 in U.S. Appl. No. 14/667,319 in 5 pages (of-record in parent application).
Non-Final Office Action dated Apr. 14, 2017 in U.S. Appl. No. 14/667,319 in 22 pages (of-record in parent application).
Final Office Action dated Jul. 5, 2016 in U.S. Appl. No. 14/667,319 in 8 pages (of-record in parent application).
Notice of Allowance dated Aug. 25, 2017 in U.S. Appl. No. 14/667,319 in 9 pages (of-record in parent application).
Restriction Requirement dated Aug. 13, 2015 in U.S. Appl. No. 14/667,319, 6 pages (of-record in parent application).
Supplemental Notice of Allowance dated Nov. 16, 2017 in U.S. Appl. No. 14/667,319, 2 pages (of-record in parent application).
Advisory Action dated Apr. 14, 2016 in U.S. Appl. No. 14/667,329 in 2 pages (of-record in parent application).
Final Office Action dated Feb. 18, 2016 in U.S. Appl. No. 14/667,329 in 11 pages (of-record in parent application).
Final Office Action dated Sep. 28, 2016 in U.S. Appl. No. 14/667,329 in 6 pages (of-record in parent application).
Non-Final Office Action dated Jan. 5, 2016 in U.S. Appl. No. 14/667,329 in 10 pages (of-record in parent application).
Non-Final Office Action dated May 25, 2016 in U.S. Appl. No. 14/667,329 in 11 pages (of-record in parent application).
Non-Final Office Action dated Aug. 17, 2016 in U.S. Appl. No. 14/667,329 in 13 pages (of-record in parent application).
Notice of Allowance dated Nov. 1, 2016 in U.S. Appl. No. 14/667,329 in 10 pages (of-record in parent application).
Non-Final Office Action dated Jun. 29, 2017 in U.S. Appl. No. 14/667,515, 9 pages (of-record in parent application).
Notice of Allowance dated Jan. 10, 2018 in U.S. Appl. No. 14/667,515, 9 pages (of-record in parent application).
Final Office Action dated Feb. 9, 2016 in U.S. Appl. No. 14/667,523 in 7 pages (of-record in parent application).
Non-Final Office Action dated Jul. 30, 2015 in U.S. Appl. No. 14/667,523 in 22 pages (of-record in parent application).
Notice of Allowance dated Jun. 22, 2016 in U.S. Appl. No. 14/667,523, 2 pages (of-record in parent application).
Notice of Allowance dated Mar. 10, 2016 in U.S. Appl. No. 14/667,523 in 8 pages (of-record in parent application).
Advisory Action dated Jul. 14, 2016 in U.S. Appl. No. 14/667,531 in 3 pages (of-record in parent application).
Final Office Action dated Jun. 9, 2016 in U.S. Appl. No. 14/667,531 in 22 pages (of-record in parent application).
Final Office Action dated Nov. 29, 2016 in U.S. Appl. No. 14/667,531 in 32 pages (of-record in parent application).
Non-Final Office Action dated Apr. 1, 2016 in U.S. Appl. No. 14/667,531 in 18 pages (of-record in parent application).
Non-Final Office Action dated Sep. 1, 2016 in U.S. Appl. No. 14/667,531 in 30 pages (of-record in parent application).
Notice of Allowance dated Jan. 23, 2017 in U.S. Appl. No. 14/667,531 in 10 pages (of-record in parent application).
Notice of Allowance dated Apr. 7, 2017 for U.S. Appl. No. 14/667,531, in 3 pages (of-record in parent application).

(56) References Cited

OTHER PUBLICATIONS

Non-Final Office Action dated Aug. 26, 2016 in U.S. Appl. No. 14/728,874, 12 pages (of-record in parent application).
Notice of Allowance dated Nov. 16, 2016 in U.S. Appl. No. 14/728,874, 8 pages (of-record in parent application).
First Action Interview Pilot Program Pre-Interview Communication dated Mar. 14, 2017 in U.S. Appl. No. 14/737,259, 4 pages (of-record in parent application).
Notice of Allowance dated Apr. 17, 2017 in U.S. Appl. No. 14/737,259, 16 pages (of-record in parent application).
Non Final Office Action dated Feb. 7, 2017 in U.S. Appl. No. 14/743,815, 18 pages (of-record in parent application).
Non-Final Office Action dated Feb. 9, 2017 in U.S. Appl. No. 14/857,497, 30 pages (of-record in parent application).
Restriction Requirement dated Sep. 28, 2016 in U.S. Appl. No. 14/857,497, 6 pages (of-record in parent application).
Notice of Allowance dated Dec. 14, 2016 in U.S. Appl. No. 14/877,574 in 32 pages (of-record in parent application).
Notice of Allowance dated Jan. 18, 2017 in U.S. Appl. No. 14/968,688, 11 pages (of-record in parent application).
Restriction Requirement dated Sep. 23, 2016 in U.S. Appl. No. 14/968,688, 6 pages (of-record in parent application).
Non-Final Office Action dated Jan. 25, 2018 in U.S. Appl. No. 15/219,248, 9 pages (of-record in parent application).
Restriction Requirement dated Nov. 1, 2017 in U.S. Appl. No. 15/219,248, 6 pages (of-record in parent application).
Corrected Notice of Allowance dated May 22, 2017 in U.S. Appl. No. 15/360,123, 6 pages (of-record in parent application).
Notice of Allowance dated Feb. 7, 2017 in U.S. Appl. No. 15/360,123, 13 pages (of-record in parent application).
Notice of Allowance dated Apr. 7, 2017 in U.S. Appl. No. 15/431,632, 7 pages (of-record in parent application).
Non-Final Office Action dated Aug. 30, 2017 in U.S. Appl. No. 15/431,641, 26 pages (of-record in parent application).
Notice of Allowance dated Nov. 20, 2017 in U.S. Appl. No. 15/431,641, 12 pages (of-record in parent application).
Supplemental Notice of Allowance dated Apr. 5, 2018 in U.S. Appl. No. 15/431,641, 2 pages (of-record in parent application).
Supplemental Notice of Allowance dated Dec. 4, 2017 in U.S. Appl. No. 15/431,641, 2 pages (of-record in parent application).
Supplemental Notice of Allowance dated Feb. 23, 2018 in U.S. Appl. No. 15/431,641, 2 pages (of-record in parent application).
Supplemental Notice of Allowance dated Jan. 11, 2018 in U.S. Appl. No. 15/431,641, 2 pages (of-record in parent application).
Notice of Allowance dated Oct. 12, 2017 in U.S. Appl. No. 15/439,785, 17 pages (of-record in parent application).
Restriction Requirement dated Jul. 31, 2017 in U.S. Appl. No. 15/439,785, 9 pages (of-record in parent application).
First Action Interview Pilot Program Pre-Interview Communication dated Mar. 30, 2018 in U.S. Appl. No. 15/838,026, 4 pages (of-record in parent application).
Office Action dated Dec. 18, 2017 in China Application No. CN201580049750.0, 9 pages (of-record in parent application).
Micrel, Inc. 85V Half-Bridge MOSFET Drivers with Adaptive Dead Time and Shoot-Through Protection, Nov. 11, 2013. Retrieved from the Internet:<URL: http://www.micrel.com/index.php/products/power-management-ics/mosfet-drevers/half-bridge/article/7.html., see pp. 1-16 and figures 1-9 (of-record in parent application).
International Search Report and Written Opinion dated Dec. 24, 2015 in PCT Application No. PCT/US2015/05017, 11 pages (of-record in parent application).
International Preliminary Report on Patentability dated Mar. 30, 2017 in PCT Application No. PCT/US2015/050510, 6 pages (of-record in parent application).
International Search Report and Written Opinion dated Jan. 14, 2016 in PCT Application No. PCT/US2015/050510, 9 pages (of-record in parent application).
International Preliminary Report on Patentability dated Mar. 30, 2017 in PCT Application No. PCT/US2015/050516, 10 pages (of-record in parent application).
International Search Report and Written dated Dec. 28, 2015 in PCT Application No. PCT/US2015/050516, 13 pages (of-record in parent application).
PCT/US2015/050517, International Preliminary Report on Patentability dated Mar. 30, 2017, 8 pages (of-record in parent application).
International Search Report and Written Opinion dated Dec. 24, 2015 in International Application No. PCT/US2015/050517 in 11 pages (of-record in parent application).
PCT/US2015/050519, International Preliminary Report on Patentability dated Mar. 30, 2017, 9 pages (of-record in parent application).
International Search Report and Written Opinion dated Dec. 23, 2015 in International Application No. PCT/US2015/050519 in 12 pages (of-record in parent application).
Texas Instruments LM5113 5A, 100V Half-Bridge Gate Driver for Enhancement Mode GaN FETs', Apr. 2013. Retrieved from the Internet:<URL:http://www.ti.com/product/lm5113>See pp. 1-10 and figures 1-3 (of-record in parent application).
Notice of Decision to Grant dated Feb. 22, 2018 in International Application No. TW104130652, 3 pages (of-record in parent application).
Office Action dated Oct. 30, 2017 in International Application No. TW104130652, 3 pages (of-record in parent application).
Notice of Decision to Grant dated Oct. 5, 2017 in International Application No. TW104130660, 6 pages (of-record in parent application).
Notice of Decision to Grant dated Mar. 2, 2018 in International Application No. TW104130695, 3 pages (of-record in parent application).
Office Action dated Dec. 6, 2017 in International Application No. TW104130695, 3 pages (of-record in parent application).
Office Action for TW104130694 dated Apr. 18, 2018, 7 pages.
First Action Interview Office Action Summary for U.S. Appl. No. 15/838,026 dated Jun. 4, 2018, 6 pages.
First Action Interview Pilot Program Pre-Interview Communication for U.S. Appl. No. 15/903,398 dated Jun. 4, 2018, 5 pages.
Notice of Allowance for U.S. Appl. No. 15/219,248 dated Aug. 15, 2018, 8 pages.
Notice of Allowance for U.S. Appl. No. 15/903,398 dated Aug. 15, 2018, 19 pages.
Corrected Notice of Allowability for U.S. Appl. No. 15/219,248 dated Sep. 26, 2018, 2 pages.
Corrected Notice of Allowability for U.S. Appl. No. 15/219,248 dated Oct. 17, 2018, 2 pages.
U.S. Appl. No. 15/838,026, "Notice of Allowance", dated Nov. 28, 2018, 9 pages.
Taiwan Patent Publication No. TW104130694, "Notice of Decision to Grant", dated Oct. 30, 2018, 3 pages.
Taiwan Patent Application No. TW107143302, "Office Action", dated Mar. 25, 2019, 3 pages.

\* cited by examiner

HALF BRIDGE DRIVER CIRCUITS

CROSS REFERENCE TO RELATED APPLICATIONS

This application is a continuation of U.S. application Ser. No. 15/431,641, for "HALF BRIDGE DRIVER CIRCUITS," filed on Feb. 13, 2017, U.S. Pat. No. 9,960,764, which is a continuation of U.S. application Ser. No. 14/877,574, for "HALF BRIDGE DRIVER CIRCUITS," filed on Oct. 7, 2015, U.S. Pat. No. 9,571,093, which is a continuation in part of U.S. application Ser. No. 14/667,531, for "INTEGRATED BIAS SUPPLY, REFERENCE AND BIAS CURRENT CIRCUITS FOR GAN DEVICES," filed on Mar. 24, 2015, U.S. Pat. No. 9,647,476, which claims priority to U.S. provisional patent application No. 62/051,160, for "HYBRID HALF-BRIDGE DRIVER USING GAN AND SILICON DEVICES" filed on Sep. 16, 2014 and to U.S. provisional patent application Ser. No. 62/127,725, for "HALF BRIDGE POWER CONVERSION CIRCUITS USING GAN AND SILICON DEVICES" filed on Mar. 3, 2015, which are hereby incorporated by reference in their entirety for all purposes.

FIELD

The present invention relates generally to power conversion circuits and in particular to power conversion circuits utilizing one or more GaN-based semiconductor devices.

BACKGROUND

Electronic devices such as computers, servers and televisions, among others, employ one or more electrical power conversion circuits to convert one form of electrical energy to another. Some electrical power conversion circuits convert a high DC voltage to a lower DC voltage using a circuit topology called a half bridge converter. As many electronic devices are sensitive to the size and efficiency of the power conversion circuit, new half bridge converter circuits and components may be required to meet the needs of new electronic devices.

SUMMARY

One inventive aspect is a half bridge GaN circuit, including a low side circuit, which includes a low side switch having a low side switch control gate and a first source, and a low side switch driver, including a first low side switch driver input configured to receive a first logic signal, where the first logic signal is referenced to a voltage at the first source. The low side switch driver also includes a second low side switch driver input configured to receive a low side switch driver control signal, a first low side switch driver output connected to the low side switch control gate, a second low side switch driver output configured to transmit a level shift driver control signal, and a third low side switch driver output configured to transmit a second level shift input signal. The low side circuit also includes a level shift driver, which includes a first level shift driver input connected to a second logic signal, where the second logic signal is referenced to the voltage of the first source, a second level shift driver input configured to receive the level shift driver control signal from the second low side switch driver output, a first level shift driver output, configured to transmit the low side switch driver control signal to the second low side switch driver input, and a second level shift driver output, configured to transmit a first level shift input signal. The low side circuit also includes a first level shift circuit configured to receive the first level shift input signal and to generate a first level shift signal, and a second level shift circuit configured to receive the second level shift input signal and to generate a second level shift signal. The half bridge GaN circuit also includes a high side circuit, including a high side switch having a high side switch control gate and a second source, a first high side receiver circuit referenced to a voltage at the second source and configured to receive the first level shift signal and to generate a first high side driver control signal, a second high side receiver circuit referenced to the voltage of the second source and configured to receive the second level shift signal and to generate a second high side driver control signal, and a high side switch driver referenced to the voltage of the second source. The high side switch driver includes one or more logic inputs configured to receive the first and second high side driver control signals, and a high side switch driver output connected to the high side switch control gate. The first and second high side receiver circuits are configured to prevent a change of voltage state of the high side control gate in response to voltage transients of the voltage of the second source.

Another inventive aspect is a half bridge GaN circuit, including a low side circuit, which includes a low side switch having a low side switch control gate and a first source, and a low side switch driver. The low side switch driver includes a first low side switch driver input configured to receive a first logic signal, where the first logic signal is referenced to a voltage at the first source, a second low side switch driver input configured to receive a low side switch driver control signal, a first low side switch driver output connected to the low side switch control gate, a second low side switch driver output configured to transmit a level shift driver control signal, and a third low side switch driver output configured to transmit a second level shift input signal. The low side circuit also includes a level shift driver, which includes a first level shift driver input connected to a second logic signal, where the second logic signal is referenced to the voltage of the first source, a second level shift driver input configured to receive the level shift driver control signal from the second low side switch driver output, a first level shift driver output, configured to transmit the low side switch driver control signal to the second low side switch driver input, and a second level shift driver output, configured to transmit a first level shift input signal. The low side circuit also includes a first level shift circuit configured to receive the first level shift input signal and to generate a first level shift signal, and a second level shift circuit configured to receive the second level shift input signal and to generate a second level shift signal, and a high side circuit. The high side circuit includes a high side switch having a high side switch control gate and a second source, a first high side receiver circuit referenced to a voltage at the second source and configured to receive the first level shift signal and to generate a first high side driver control signal, a second high side receiver circuit referenced to the voltage of the second source and configured to receive the second level shift signal and to generate a second high side driver control signal, and a high side switch driver referenced to the voltage of the second source. The high side switch driver includes one or more logic inputs configured to receive the first and second high side driver control signals, and a high side switch driver output connected to the high side switch control gate. The first and second level shift signals include a plurality of pulses, and the high side switch driver is configured to transmit a high side switch gate control signal based on the pulses to the high side switch control gate, where durations of on and off times of the high side switch are based on durations of the pulses.

Another inventive aspect is a half bridge GaN circuit, which includes a low side circuit, including a low side switch having a low side switch control gate and a first source, and a low side switch driver. The low side switch driver includes a first low side switch driver input configured to receive a first logic signal, where the first logic signal is referenced to a voltage at the first source, a second low side switch driver input configured to receive a low side switch driver control signal, a first low side switch driver output connected to the low side switch control gate, a second low side switch driver output configured to transmit a level shift driver control signal, and a third low side switch driver output configured to transmit a second level shift input signal. The low side circuit also includes a level shift driver, including a first level shift driver input connected to a second logic signal, where the second logic signal is referenced to the voltage of the first source, a second level shift driver input configured to receive the level shift driver control signal from the second low side switch driver output, a first level shift driver output, configured to transmit the low side switch driver control signal to the second low side switch driver input, and a second level shift driver output, configured to transmit a first level shift input signal. The low side circuit also includes a first level shift circuit configured to receive the first level shift input signal and to generate a first level shift signal, and a second level shift circuit configured to receive the second level shift input signal and to generate a second level shift signal. The half bridge GaN circuit also includes a high side circuit, which includes a high side switch having a high side switch control gate and a second source, a first high side receiver circuit referenced to a voltage at the second source and configured to receive the first level shift signal and to generate a first high side driver control signal, a second high side receiver circuit referenced to the voltage of the second source and configured to receive the second level shift signal and to generate a second high side driver control signal, and a high side switch driver referenced to the voltage of the second source. The high side switch driver includes one or more logic inputs configured to receive the first and second high side driver control signals, and a high side switch driver output connected to the high side switch control gate. The high side circuit also includes a trigger circuit configured to, in response to a voltage of a first power supply referenced to the voltage of the second source being less than a threshold greater than the voltage of the second source, cause the high side switch to turn-off.

In some embodiments a half bridge circuit comprising a low side circuit disposed on a first GaN device and a high side circuit disposed on a second GaN device is disclosed. The low side circuit includes a low side switch having a low side switch control gate and a low side switch driver having an output connected to the low side switch control gate. The high side circuit includes a high side switch having a high side control gate and a high side switch driver having an output connected to the high side switch control gate.

BRIEF DESCRIPTION OF THE DRAWINGS

FIG. 52 is a schematic illustration of an off pulse generator 5200;

DETAILED DESCRIPTION

Certain embodiments of the present invention relate to half bridge power conversion circuits that employ one or more gallium nitride (GaN) devices. While the present invention can be useful for a wide variety of half bridge circuits, some embodiments of the invention are particularly useful for half bridge circuits designed to operate at high frequencies and/or high efficiencies with integrated driver circuits, integrated level shift circuits, integrated bootstrap capacitor charging circuits, integrated startup circuits and/or hybrid solutions using GaN and silicon devices, as described in more detail below.
Half Bridge Circuit #1

Figure 1:
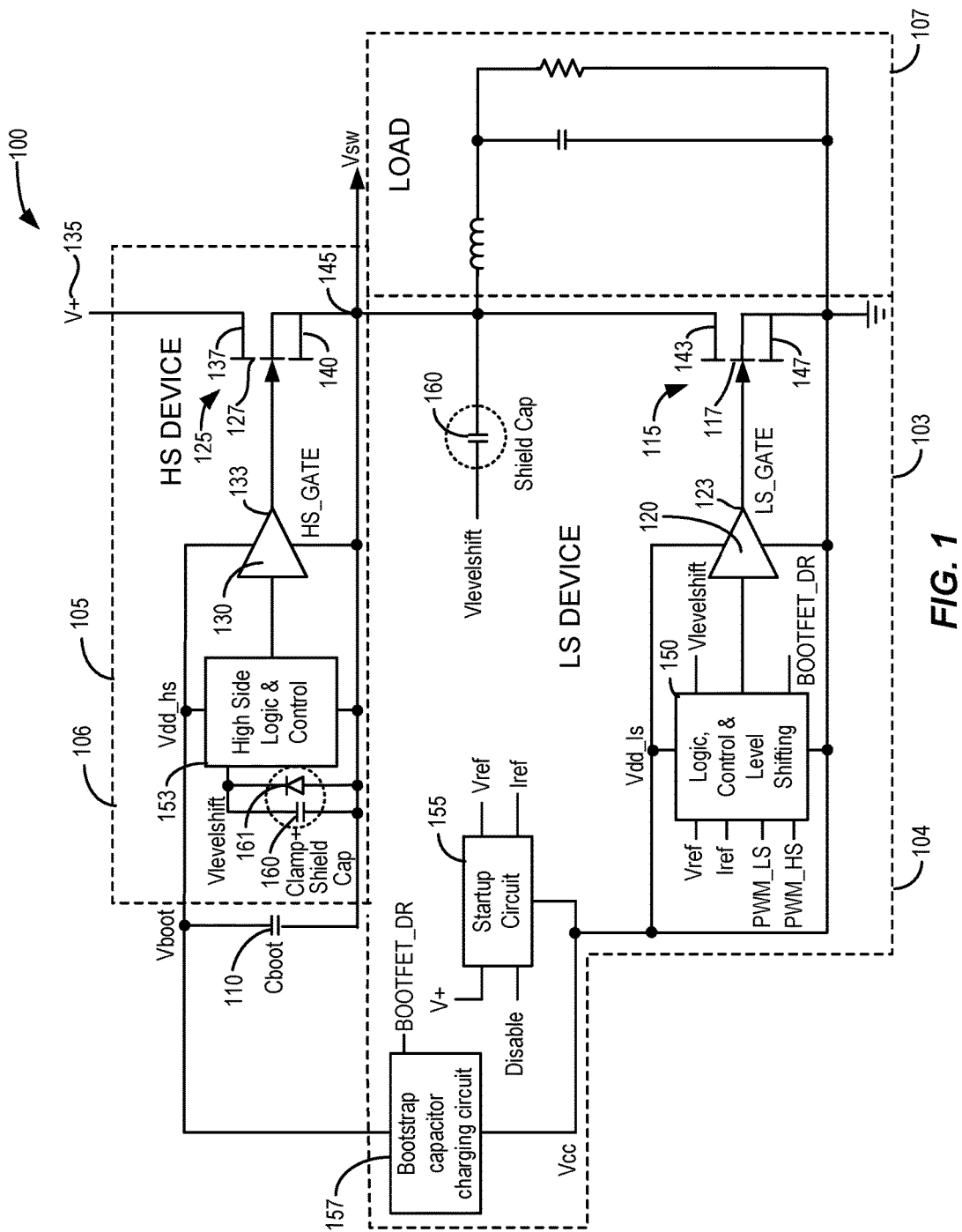
FIG. 1 is a simplified schematic of a half bridge power conversion circuit according to an embodiment of the invention.

Now referring to FIG. 1, in some embodiments, circuit 100 may include a pair of complementary power transistors (also referred to herein as switches) that are controlled by one or more control circuits configured to regulate power delivered to a load. In some embodiments a high side power transistor is disposed on a high side device along with a portion of the control circuit and a low side power transistor is disposed on a low side device along with a portion of the control circuit, as described in more detail below.

The integrated half bridge power conversion circuit 100 illustrated in FIG. 1 includes a low side GaN device 103, a high side GaN device 105 a load 107, a bootstrap capacitor 110 and other circuit elements, as illustrated and discussed in more detail below. Some embodiments may also have an external controller (not shown in FIG. 1) providing one or more inputs to circuit 100 to regulate the operation of the circuit. Circuit 100 is for illustrative purposes only and other variants and configurations are within the scope of this disclosure.

In one embodiment, low side GaN device 103 may have a GaN-based low side circuit 104 that includes a low side power transistor 115 having a low side control gate 117. Low side circuit 104 may further include an integrated low side transistor driver 120 having an output 123 connected to low side transistor control gate 117. In another embodiment high, side GaN device 105 may have a GaN-based high side circuit 106 that includes a high side power transistor 125 having a high side control gate 127. High side circuit 106 may further include an integrated high side transistor driver 130 having an output 133 connected to high side transistor control gate 127.

A voltage source 135 (also known as a rail voltage) may be connected to a drain 137 of high side transistor 125, and the high side transistor may be used to control power input into power conversion circuit 100. High side transistor 125 may further have a source 140 that is coupled to a drain 143 of low side transistor 115, forming a switch node 145. Low side transistor 115 may have a source 147 connected to ground. In one embodiment, low side transistor 115 and high side transistor 125 may be GaN-based enhancement-mode field effect transistors. In other embodiments low side transistor 115 and high side transistor 125 may be any other type of device including, but not limited to, GaN-based depletion-mode transistors, GaN-based depletion-mode transistors connected in series with silicon based enhancement-mode field-effect transistors having the gate of the depletion-mode transistor connected to the source of the silicon-based enhancement-mode transistor, silicon carbide based transistors or silicon-based transistors.

In some embodiments high side device 105 and low side device 103 may be made from a GaN-based material. In one embodiment the GaN-based material may include a layer of GaN on a layer of silicon. In further embodiments the GaN based material may include, but not limited to, a layer of GaN on a layer of silicon carbide, sapphire or aluminum nitride. In one embodiment the GaN based layer may include, but not limited to, a composite stack of other III nitrides such as aluminum nitride and indium nitride and III nitride alloys such as AlGaN and InGaN. In further embodiments, GaN-based low side circuit 104 and GaN-based high side circuit 106 may be disposed on a monolithic GaN-based device. In other embodiments GaN-based low side circuit 104 may be disposed on a first GaN-based device and GaN-based high side circuit 106 may be disposed on a second GaN-based device. In yet further embodiments, GaN-based low side circuit 104 and GaN-based high side circuit 106 may be disposed on more than two GaN-based devices. In one embodiment, GaN-based low side circuit 104 and GaN-based high side circuit 106 may contain any number of active or passive circuit elements arranged in any configuration.
Low Side Device Low side device 103 may include numerous circuits used for the control and operation of the low side device and high side device 105. In some embodiments, low side device 103 may include logic, control and level shift circuits (low side control circuit) 150 that controls the switching of low side transistor 115 and high side transistor 125 along with other functions, as discussed in more detail below. Low side device 103 may also include a startup circuit 155, a bootstrap capacitor charging circuit 157 and a shield capacitor 160, as also discussed in more detail below.

Figure 2:
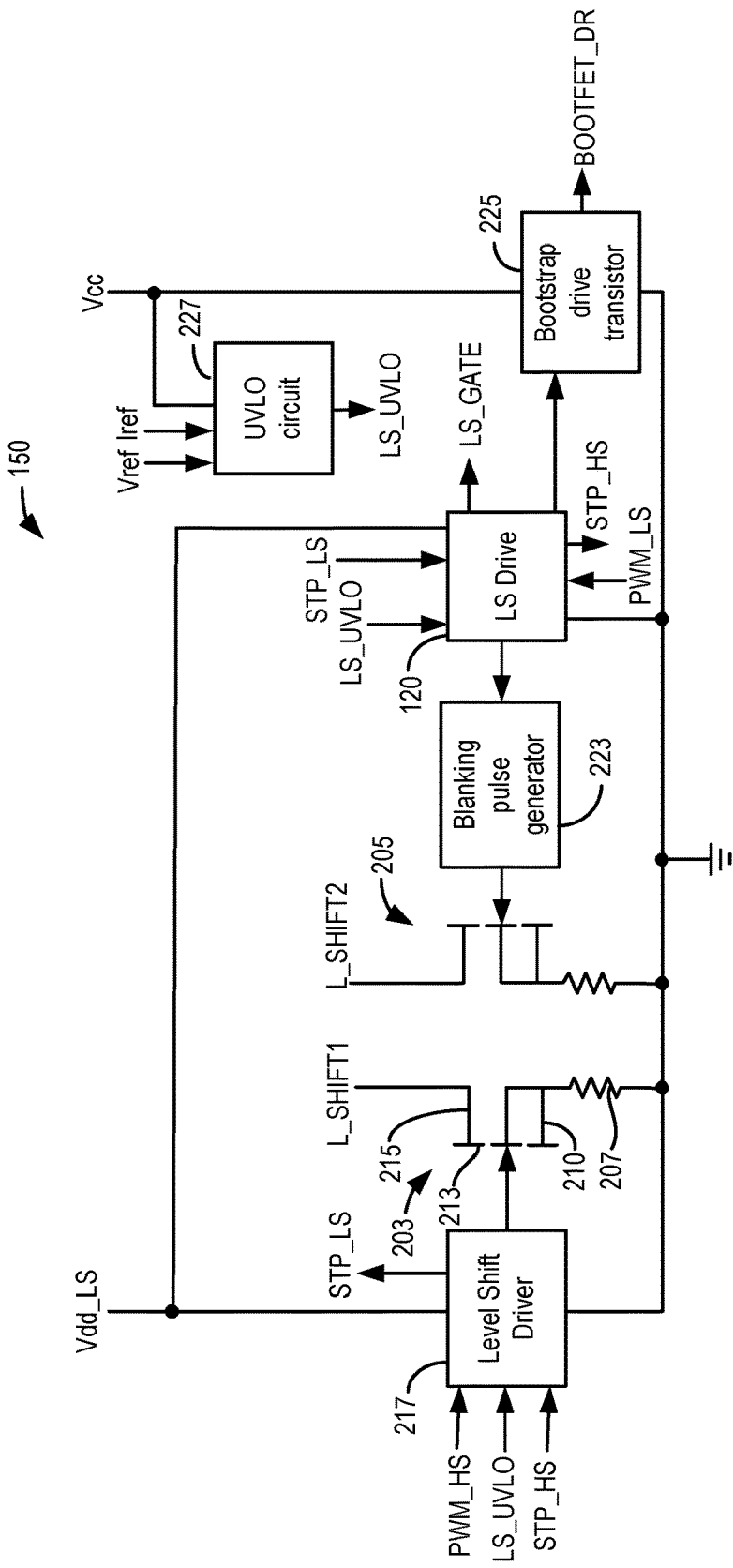
FIG. 2 is a simplified schematic of the circuits within the low side control circuit illustrated in FIG. 1.

Now referring to FIG. 2, the circuits within low side control circuit 150 are functionally illustrated. Each circuit within low side control circuit 150 is discussed below, and in some cases is shown in more detail in FIGS. 3-14. In one embodiment the primary function of low side control circuit 150 may be to receive one or more input signals, such as a PWM signal from a controller, and control the operation of low side transistor 115, and high side transistor 125.

In one embodiment, first and a second level shift transistors 203, 205, respectively, may be employed to communicate with high side logic and control circuit 153 (see FIG. 1). In some embodiments, first level shift transistor 203 may be a high voltage enhancement-mode GaN transistor. In further embodiments, first level shift transistor 203 may be similar to low side transistor 115 (see FIG. 1) and high side transistor 125, except it may be much smaller in size (e.g., first level shift transistor may be tens of microns in gate width with minimum channel length).

In other embodiments first level shift transistor 203 may experience high voltage and high current at the same time (i.e. the device may operate at the high power portion of the device Safe Operating Area) for as long as high side transistor 125 (see FIG. 1) is on. Such conditions may cause relatively high power dissipation, thus some embodiments may involve design and device reliability considerations in the design of first level shift transistor 203, as discussed in more detail below. In further embodiments, a first level shift resistor 207 may be added in series with a source 210 of first level shift transistor 203 to limit gate 213 to source 210 voltage and consequently the maximum current through the first level shift transistor. Other methods may be employed to limit the current through first level shift transistor 203, and are within the scope of this disclosure. Drain 215 of first level shift transistor 203 may be coupled to high side logic and control circuit 153 (see FIG. 1), as discussed in more detail below.

In one embodiment, first level shift transistor 203 may comprise a portion of an inverter circuit having a first input and a first output and configured to receive a first input logic signal at the first input terminal and in response, provide a first inverted output logic signal at the first output terminal, as discussed in more detail below. In further embodiments the first input and the first inverted output logic signals can be referenced to different voltage potentials. In some embodiments, first level shift resistor 207 may be capable of operating with the first inverted output logic signal referenced to a voltage that is more than 13 volts higher than a reference voltage for the first input logic signal. In other embodiments it may be capable of operating with the first inverted output logic signal referenced to a voltage that is more than 20 volts higher than a reference voltage for the first input logic signal, while in other embodiments it may be between 80-400 volts higher.

In other embodiments, first level shift resistor 207 may be replaced by any form of a current sink. For example, in one embodiment, source 210 of first level shift transistor 203 may be connected to a gate to source shorted depletion-mode device. In a further embodiment, the depletion-mode device may be fabricated by replacing the enhancement-mode gate stack with a high voltage field plate metal superimposed on top of the field dielectric layers. The thickness of the field dielectric and the work function of the metal may be used to determine the pinch-off voltage of the stack.

In other embodiments first level shift resistor 207 may be replaced by a current sink. The current sink may use a reference current (Iref) that may be generated by startup circuit 155 (illustrated in FIG. 1 and discussed in more detail below). Both the depletion-mode transistor and current sink embodiments may result in a significant device area reduction compared to the resistor embodiment (i.e., because a relatively small depletion-mode transistor would suffice and Iref is already available from startup circuit 155).

Second level shift transistor 205 may be designed similar to first level shift transistor 203 (e.g., in terms of voltage capability, current handling capability, thermal resistance, etc.). Second level shift transistor 205 may also be built with either an active current sink or a resistor, similar to first level shift transistor 203. In one embodiment the primary difference with second level shift transistor 205 may be in its operation. In some embodiments the primary purpose of second level shift transistor 205 may be to prevent false triggering of high side transistor 125 (see FIG. 1) when low side transistor 115 turns off.

In one embodiment, for example, false triggering can occur in a boost operation when low side transistor 115 turn-off results in the load current flowing through high side transistor 125 while the transistor is operating in the third quadrant with its gate shorted to its source (i.e., in synchronous rectification mode). This condition may introduce a dv/dt condition at switch node (Vsw) 145 since the switch node was at a voltage close to ground when low side transistor 115 was on and then transitions to rail voltage 135 over a relatively short time period. The resultant parasitic C*dv/dt current (i.e., where C=Coss of first level shift transistor 203 plus any other capacitance to ground) can cause first level shift node 305 (see FIG. 3) to get pulled low which will then turn on high side transistor 125. In some embodiments this condition may not be desirable because there may be no dead time control, and shoot through may occur from high side transistor 125 and low side transistor 115 being in a conductive state simultaneously.

Figure 3:
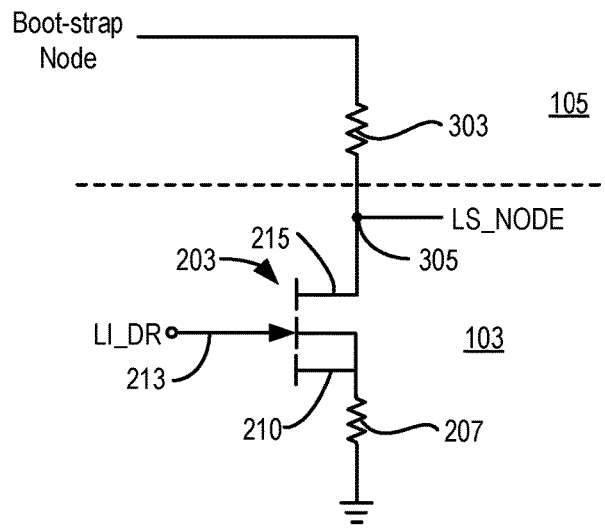
FIG. 3 is a schematic of the first level shift transistor illustrated in FIG. 1.

FIG. 3 illustrates one embodiment showing how first level shift transistor 203 may be electrically coupled to high side device 105. First level shift transistor 203, located on low side device 103, is illustrated along with a pull up resistor 303 that may be located on high side device 105 (see FIG. 1). In some embodiments, first level shift transistor 203 may operate as a pull down transistor in a resistor pull up inverter.

In further embodiments, when level shift driver circuit 217 (see FIG. 2) supplies a high gate signal (L1_DR) to first level shift transistor 203, a first level shift node 305 gets pulled low which is inverted by high side logic and control circuit 153 (see FIG. 1). The inverted signal appears as a high state signal that turns on high side transistor 137 (see FIG. 1) which then pulls the voltage at switch node (Vsw) 145 close to rail voltage 135.

Conversely, when level shift driver circuit 217 (see FIG. 2) supplies a low gate signal to first level shift transistor 203, a first level shift node 305 gets pulled to a high logic state which is inverted by high side logic and control circuit 153 (see FIG. 1). The inverted signal appears as a low logic state signal that turns off high side transistor 125. This scheme may result in a non-inverted gate signal to high side transistor 125. In further embodiments, first level shift transistor 203 may be designed large enough to be able to pull down on first level shift node 305, but not so large that its drain to source and drain to substrate (i.e., the semiconductor substrate) capacitances induce false triggering of high side logic and control circuit 153.

In some embodiments pull up resistor 303 may instead be an enhancement-mode transistor, a depletion-mode transistor or a reference current source element. In further embodiments pull up resistor 303 may be coupled between the drain and the positive terminal of a floating supply (e.g., a bootstrap capacitor, discussed in more detail below) that is referenced to a different voltage rail than ground. In yet further embodiments there may be a first capacitance between the first output terminal (LS NODE) 305 and switch node (Vsw) 145 (see FIG. 1) and a second capacitance between the first output terminal and ground, where the first capacitance is greater than the second capacitance. The first capacitance may be designed such that in response to a high dv/dt signal at switch node (Vsw) 145 (see FIG. 1), a large portion of the C*dv/dt current is allowed to conduct through the first capacitance ensuring that the voltage at first output terminal 305 tracks the voltage at the switch node (Vsw). In some embodiments shield capacitor 160 (see FIG. 1) may be designed to act as the first capacitor as described above. In further embodiments shield capacitor 160 (see FIG. 1) may be used to create capacitance between first output terminal 305 and switch node (Vsw) 145 (see FIG. 1) in half bridge power conversion circuit 100. In yet further embodiments, shield capacitor 160 (see FIG. 1) may also be used to minimize a capacitance between first output terminal 305 and substrate (i.e., the semiconductor substrate). More specifically, in some embodiments shield capacitor 160 may be created by adding a conductive shield layer to the device and coupling the layer to switch node (Vsw) 145. This structure may effectively create two capacitors. One capacitor is coupled between output terminal 305 and switch node (Vsw) 145, and the other is coupled between the switch node and the substrate. The capacitance between output terminal 305 and the substrate is thereby practically eliminated. In further embodiments shield capacitor 160 (see FIG. 1) may be constructed on the low side chip 103.

Logic, control and level shifting circuit 150 (see FIG. 2) may have other functions and circuits such as, but not limited to, a level shift driver circuit 217, a low side transistor drive circuit 120, a blanking pulse generator 223, a bootstrap transistor drive circuit 225 and an under voltage lock out (UVLO) circuit 227, as explained in separate figures with more detail below.

Figure 4:
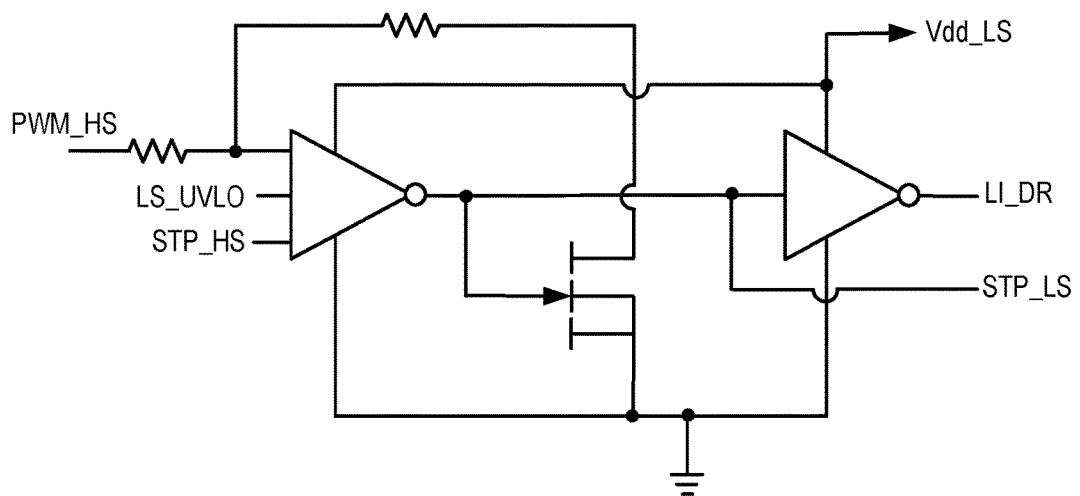
FIG. 4 is a schematic of the level shift driver circuit illustrated in FIG. 1.

Now referring to FIG. 4, level shift driver circuit 217 is shown in greater detail. In one embodiment level shift driver circuit 217 may include a first inverter 405 and a second inverter 410 in a sequential chain. In further embodiments, since level shift driver circuit 217 may be driving a small gate width first level shift transistor 203, there may be no need for a buffer stage.

In one embodiment, level shift driver circuit 217 is driven directly by the pulse-width modulated high side signal (PWM_HS) from the controller (not shown). In some embodiments the (PWM_HS) signal may be supplied by an external control circuit. In one embodiment the external control circuit may be an external controller that is in the same package with high side device 105, low side device 103, both devices, or packaged on its own. In further embodiments, level shift driver circuit 217 may also include logic that controls when the level shift driver circuit communicates with first level shift transistor 203 (see FIG. 3). In one embodiment an optional low side under voltage lock out signal (LS_UVLO) may be generated by an under voltage lock out circuit within level shift driver circuit 217. The low side under voltage lock out circuit can be used to turn off level shift driver circuit 217 if either (Vcc) or (Vdd) for the low side (Vdd_LS) go below a certain reference voltage, or a fraction of the reference voltage.

In further embodiments level shift driver circuit 217 may generate a shoot through protection signal for the low side transistor (STP_LS) that is used to prevent shoot through arising from overlapping gate signals on low side transistor 115 and high side transistor 125. The function of the (STP_LS) signal may be to ensure that low side driver circuit 120 (see FIG. 2) only communicates with the gate terminal of the low side transistor 115 when the gate signal to high side transistor 125 is low. In other embodiments, the output of first inverter 405 may be used to generate the shoot through protection signal (STP_LS) for the low side transistor 115.

In further embodiments, logic for UVLO and shoot-through protection may implemented by adding a multiple input NAND gate to first inverter 405, where the inputs to the NAND gate are the (PWM_HS), (LS_UVLO) and (STP_HS) signals. In yet further embodiments, first inverter 405 may only respond to the (PWM_HS) signal if both (STP_HS) and (LS_UVLO) signals are high. In further embodiments, the STP_HS signal may be generated from the low side gate driver block 120, as explained in separate figures with more detail.

Figure 5:
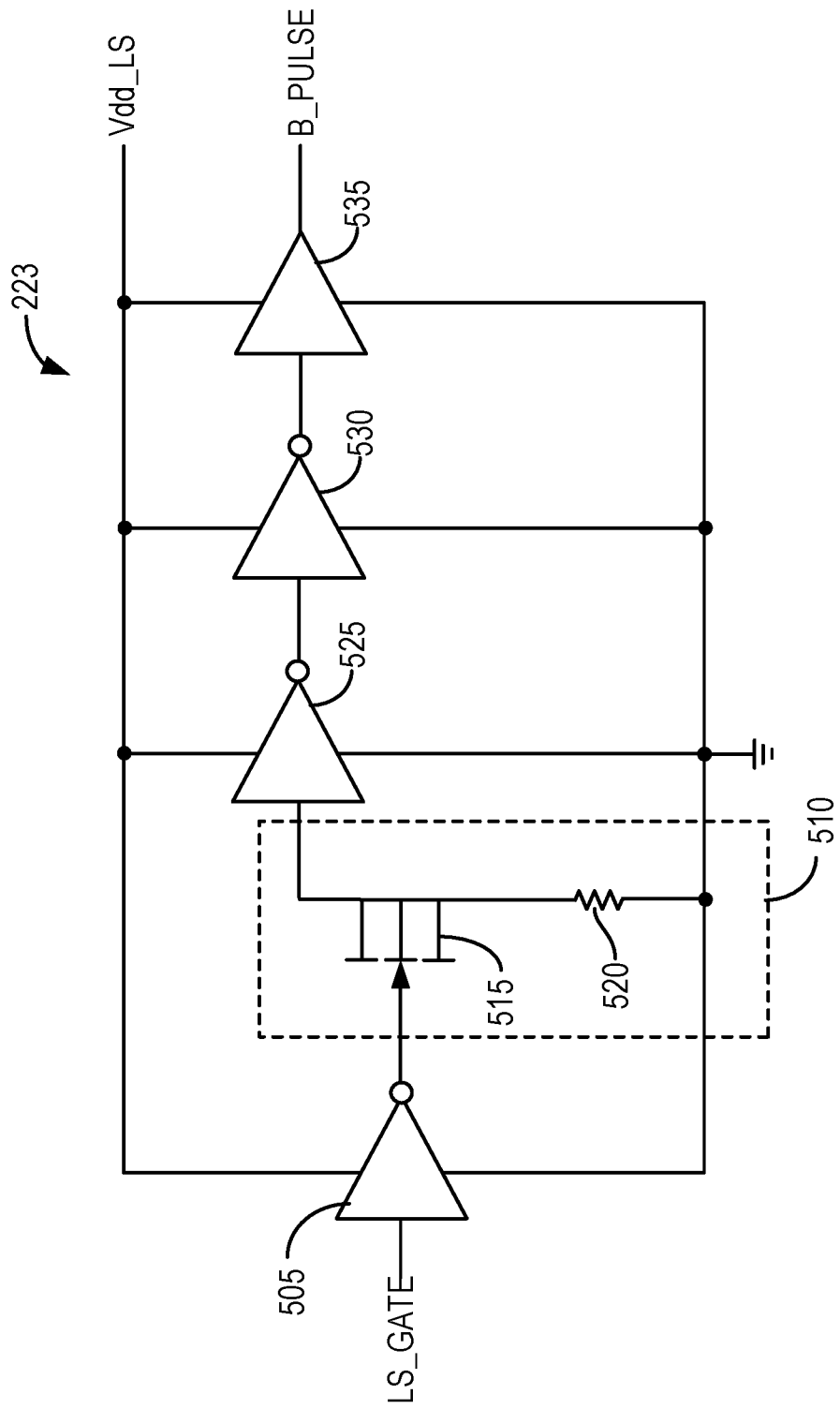
FIG. 5 is a schematic of the blanking pulse generator circuit illustrated in FIG. 1.

Now referring to FIG. 5, blanking pulse generator 223 may be used to generate a pulse signal that corresponds to the turn-off transient of low side transistor 115. This pulse signal may then turn on second level shift transistor 205 for the duration of the pulse, which triggers a control circuit on high side device 105 (see FIG. 1) to prevent false pull down of first level shift node 305 voltage.

FIG. 5 illustrates a schematic of one embodiment of blanking pulse generator 223. In some embodiments a low side transistor 115 gate signal (LS_GATE) is fed as an input to blanking pulse generator 223. The (LS_GATE) signal is inverted by a first stage inverter 505, then sent through an RC pulse generator 510 to generate a positive pulse. In some embodiments an inverted signal may be needed because the pulse corresponds to the falling edge of the (LS_GATE) signal. A capacitor 515 in RC pulse generator 510 circuit may be used as a high pass filter allowing the dv/dt at its input to appear across resistor 520. Once the dv/dt vanishes at the input to the RC pulse generator 510, capacitor 515 may charge slowly through resistor 520, resulting in a slow decaying voltage waveform across the resistor. The pulse may then be sent through a second inverter 525, a third inverter 530 and a buffer 535 to generate a square wave pulse for the blanking pulse (B_PULSE) signal. The duration of the pulse may be determined by the value of capacitor 515 and resistor 520 in RC pulse generator 510. In some embodiments, capacitor 515 may be constructed using a drain to source shorted enhancement-mode GaN transistor.

Figure 6:
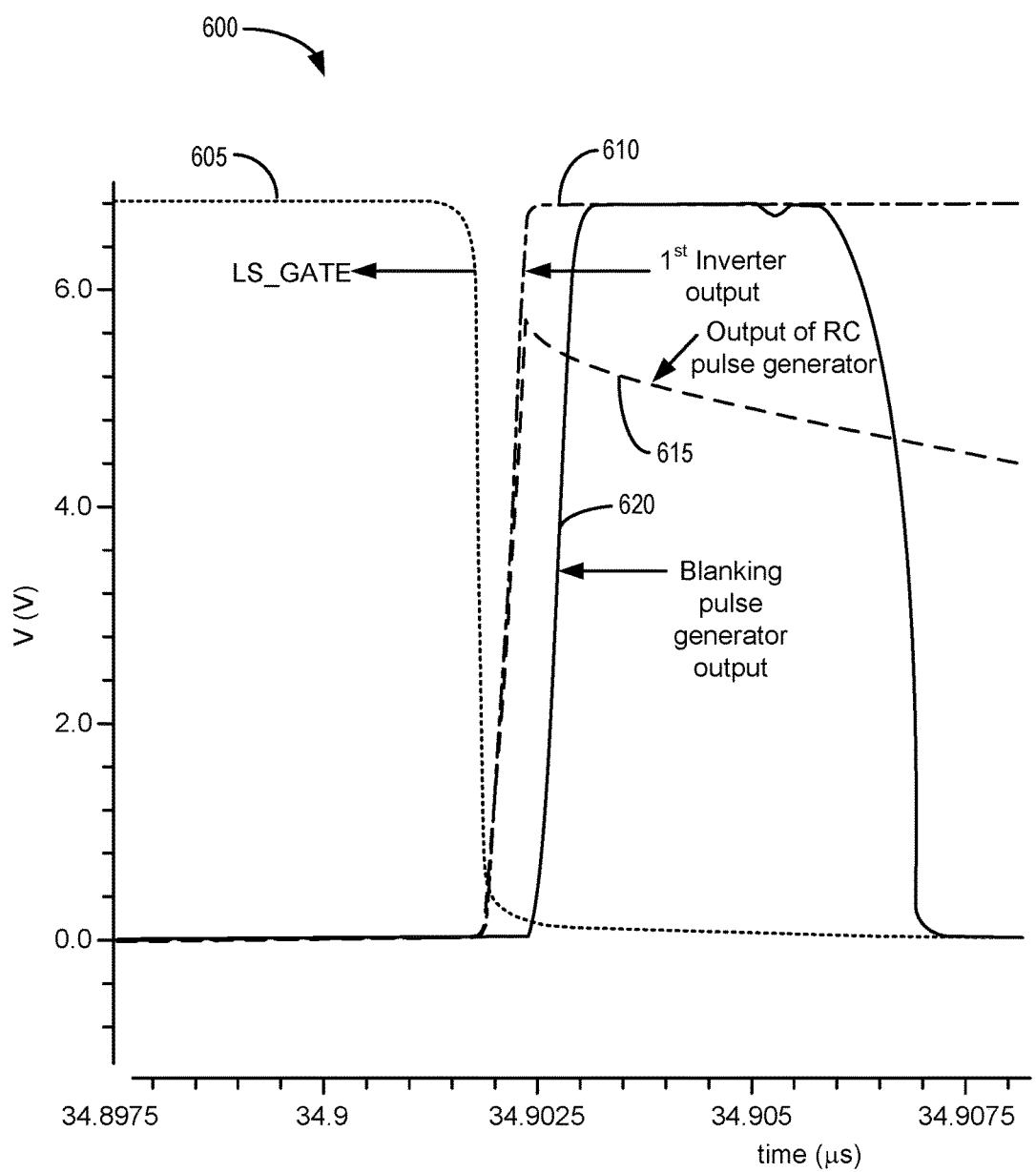
FIG. 6 is an example of waveforms within the blanking pulse generator illustrated in FIG. 5.

Now referring to FIG. 6, example waveforms 600 within blanking pulse generator 223 are illustrated for one embodiment. Trace 605 shows a falling edge of the low side gate pulse (LS_GATE). Trace 610 shows the rising edge of first stage inverter 505 output. Trace 615 shows the output of RC pulse generator 510 and trace 620 shows the resulting blanking pulse (B_PULSE) signal that is an output of blanking pulse generator 223.

Figure 7:
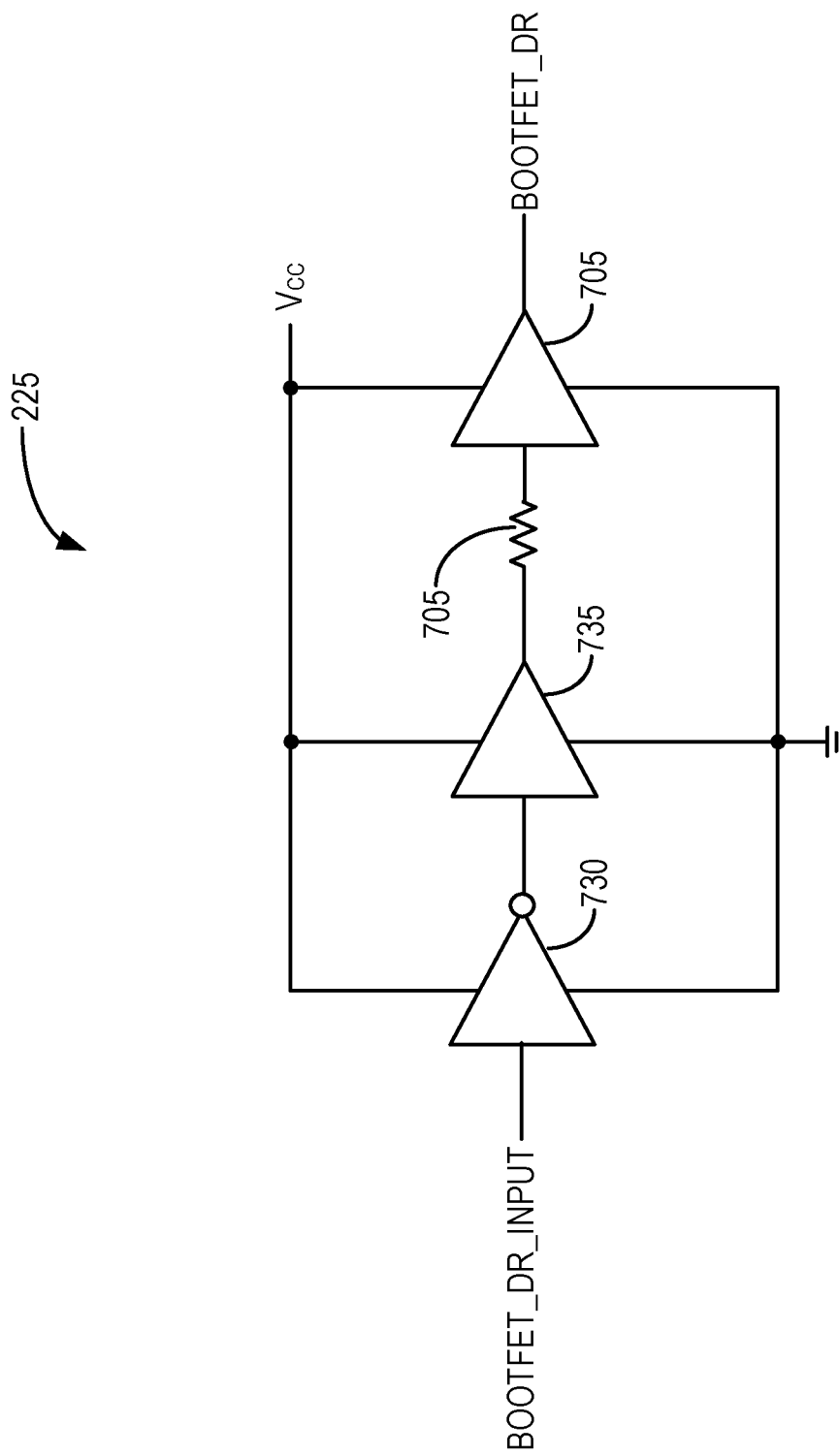
FIG. 7 is a schematic of the bootstrap transistor drive circuit illustrated in FIG. 1.

Now referring to FIG. 7, bootstrap transistor drive circuit 225 is illustrated in greater detail. Bootstrap transistor drive circuit 225 includes inverter 730, first buffer 735 and second buffer 745. Bootstrap transistor drive circuit 225 may receive the (BOOTFET_DR_IN) signal from low side driver circuit 120. The (BOOTFET_DR_IN) signal may be inverted with respect to the LS_GATE signal. Bootstrap transistor drive circuit 225 may be configured to provide a gate drive signal called (BOOTFET_DR) to a bootstrap transistor in bootstrap charging circuit 157 (see FIG. 1), discussed in more detail below. The (BOOTFET_DR) gate drive signal may be timed to turn on the bootstrap transistor when low side transistor 115 is turned on. Also, since bootstrap transistor drive circuit 225 is driven by (Vcc), the output of this circuit may have a voltage that goes from 0 volts in a low state to (Vcc)+6 volts in a high state. In one embodiment the bootstrap transistor is turned on after low side transistor 115 is turned on, and the bootstrap transistor is turned off before the low side transistor is turned off.

In some embodiments, the turn-on transient of the (BOOTFET_DR) signal may be delayed by the introduction of a series delay resistor 705 to the input of second buffer 745, that may be a gate of a transistor in a final buffer stage. In further embodiments, the turn-off transient of low side transistor 115 (see FIG. 1) may be delayed by the addition of a series resistor to a gate of a final pull down transistor in low side drive circuit 120. In one embodiment, one or more capacitors may be used in bootstrap transistor drive circuit 225, and support voltages of the order of (Vcc) which, for example, could be 20 volts, depending on the end user requirements and the design of the circuit. In some embodiments the one or more capacitors may be made with a field dielectric to GaN capacitor instead of a drain to source shorted enhancement-mode transistor.

Figure 8:
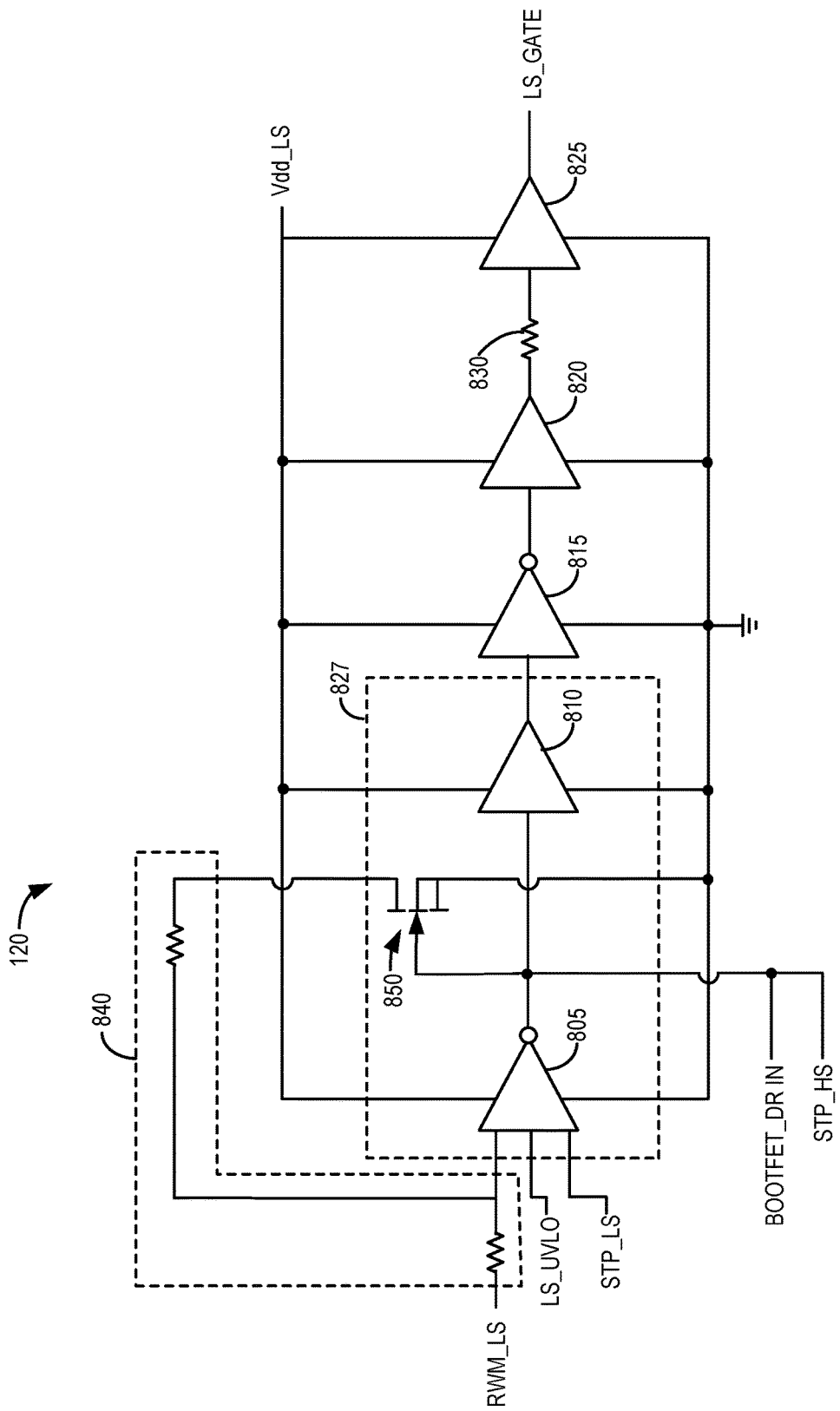
FIG. 8 is a block diagram for the low side transistor drive circuit illustrated in FIG. 1

Now referring to FIG. 8 a block diagram for low side transistor drive circuit 120 is illustrated. Low side transistor drive circuit 120 may have a first inverter 805, a buffer 810, a second inverter 815, a second buffer 820 and a third buffer 825. Third buffer 825 may provide the (LS_GATE) signal to low side transistor 115 (see FIG. 1). In some embodiments two inverter/buffer stages may be used because the input to the gate of low side transistor 115 (see FIG. 1) may be synchronous with (Vin). Thus, (Vin) in a high state may correspond to (Vgate) of low side transistor 115 in a high state and vice versa.

In further embodiments, certain portions of low side drive circuit 120 may have an asymmetric hysteresis. Some embodiments may include asymmetric hysteresis using a resistor divider 840 with a transistor pull down 850.

Further embodiments may have multiple input NAND gates for the (STP_LS) signal (shoot through protection on low side transistor 115). In one embodiment, low side drive circuit 120 may receive the shoot through protection signal (STP_LS) from level shift driver circuit 217. The purpose of the (STP_LS) signal may be similar to the (STP_HS) signal described previously. The (STP_LS) signal may ensure that low side transistor drive circuit 120 does not communicate with gate 117 (see FIG. 1) of low side transistor 115 when level shift driver circuit 217 output is at a high state. In other embodiments, the output of the first inverter stage 805 may be used as the (STP_HS) signal for level shift drive circuit 217 and the (BOOTFET_DR_IN) signal for bootstrap transistor drive circuit 225.

In some embodiments, low side transistor drive circuit 120 may employ multiple input NAND gates for the (LS_UVLO) signal received from UVLO circuit 227 (see FIG. 2). Further embodiments may employ a turn-off delay resistor that may be in series with a gate of a final pull down transistor in final buffer stage 825. The delay resistor may be used in some embodiments to make sure the bootstrap transistor is turned off before low side transistor 115 turns off.

Figure 9:
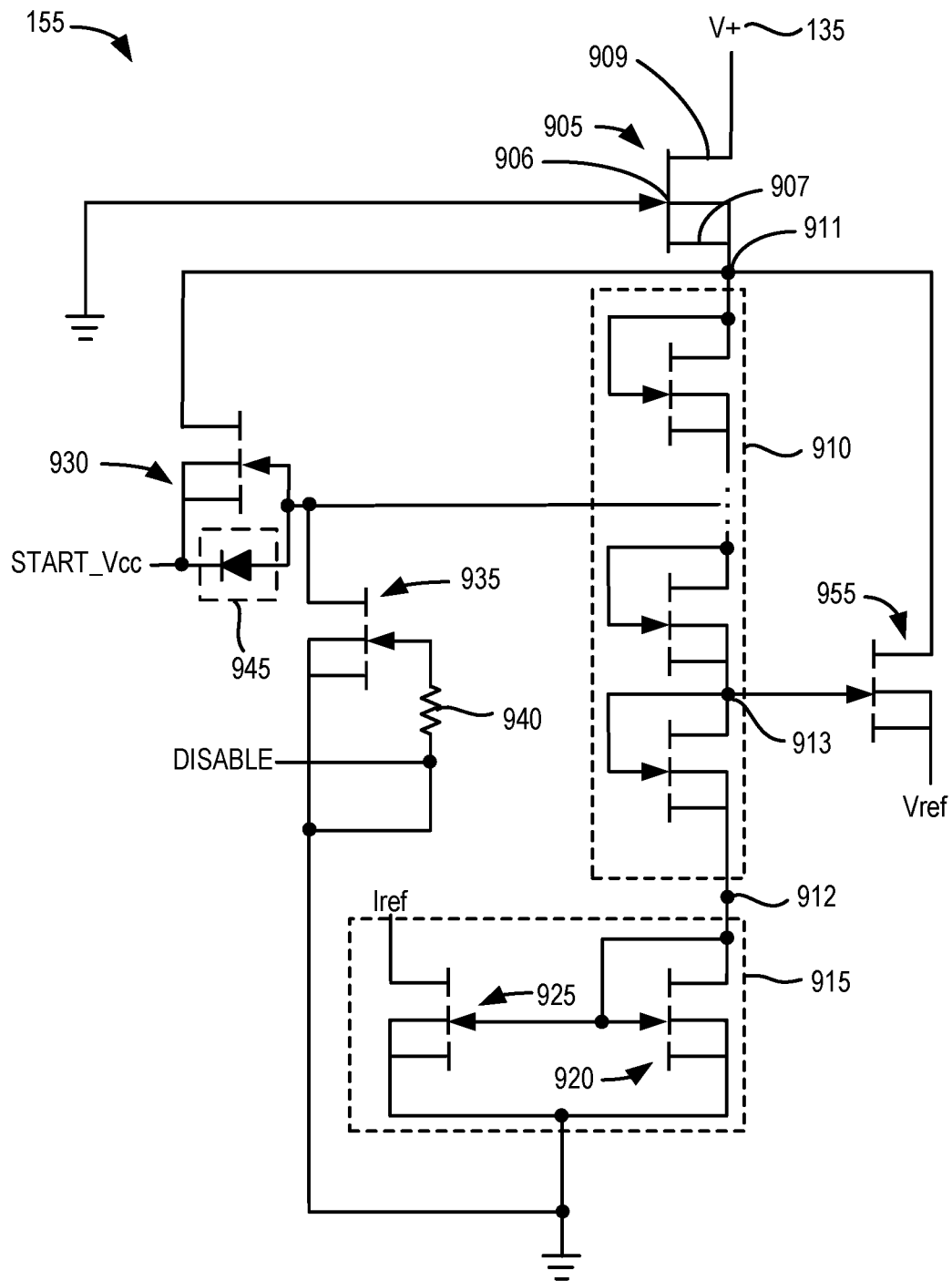
FIG. 9 is a schematic of the startup circuit illustrated in FIG. 1.

Now referring to FIG. 9, startup circuit 155 is illustrated in greater detail. Startup circuit 155 may be designed to have a multitude of functionalities as discussed in more detail below. Primarily, startup circuit 155 may be used to provide an internal voltage (in this case START_Vcc) and provide enough current to support the circuits that are being driven by (Vcc). This voltage may remain on to support the circuits until (Vcc) is charged up to the required voltage externally from rail voltage 135 (V+). Startup circuit 155 may also provide a reference voltage (Vref) that may be independent of the startup voltage, and a reference current sink (Iref).

In one embodiment, a depletion-mode transistor 905 may act as the primary current source in the circuit. In further embodiments depletion-mode transistor 905 may be formed by a metal layer disposed over a passivation layer. In some embodiments, depletion-mode transistor 905 may use a high voltage field plate (typically intrinsic to any high-voltage GaN technology) as the gate metal. In further embodiments a field dielectric may act as the gate insulator. The resultant gated transistor may be a depletion-mode device with a high channel pinch-off voltage (Vpinch) (i.e., pinch-off voltage is proportional to the field dielectric thickness). Depletion-mode transistor 905 may be designed to block relatively high voltages between its drain (connected to V+) and its source. Such a connection may be known as a source follower connection. Depletion-mode transistor 905 may have a gate 906 coupled to ground, a source 907 coupled to a first node 911 and a drain 909 coupled to voltage source 135.

In further embodiments a series of identical diode connected enhancement-mode low-voltage transistors 910 may be in series with depletion-mode transistor 905. Series of identical diode connected enhancement-mode low-voltage transistors 910 may be connected in series between a first node 911 and a second node 912. One or more intermediate nodes 913 may be disposed between each of series of identical diode connected enhancement-mode low-voltage transistors 910. The width to length ratio of the transistors may set the current drawn from (V+) as well as the voltage across each diode. To remove threshold voltage and process variation sensitivity, series of identical diode connected enhancement-mode low-voltage transistors 910 may be designed as large channel length devices. In some embodiments, series of identical diode connected enhancement-mode low-voltage transistors 910 may be replaced with one or more high value resistors.

In further embodiments, at the bottom end of series of identical diode connected enhancement-mode low-voltage transistors 910, a current mirror 915 may be constructed from two enhancement-mode low-voltage transistors and used to generate a reference current sink (Iref). First current mirror transistor 920 may be diode connected and second current mirror transistor 925 may have a gate connected to the gate of the first current mirror transistor. The sources of first and second current mirror transistors 920, 925, respectively may be coupled and tied to ground. A drain terminal of first current mirror transistor 920 may be coupled to second junction 912 and a source terminal of second current mirror transistor 925 may be used as a current sink terminal. This stack of current mirror 915 and series of identical diode connected enhancement-mode low-voltage transistors 910 may form what is known as a "source follower load" to depletion-mode transistor 905.

In other embodiments, when gate 906 of depletion-mode transistor 905 is tied to ground, source 907 of the depletion-mode transistor may assume a voltage close to (Vpinch) when current is supplied to the "source follower load". At the same time the voltage drop across diode connected transistor 920 in current mirror 915 may be close to the threshold voltage of the transistor (Vth). This condition implies that the voltage drop across each of series of identical diode connected enhancement-mode low-voltage transistors 910 may be equal to (Vpinch−Vth)/n where 'n' is the number of diode connected enhancement-mode transistors between current mirror 915 and depletion-mode transistor 905.

For example, if the gate of a startup transistor 930 is connected to the third identical diode connected enhancement-mode low-voltage transistor from the bottom, the gate voltage of the startup transistor may be 3*(Vpinch−Vth)/n+Vth. Therefore, the startup voltage may be 3*(Vpinch−Vth)/n+Vth−Vth=3*(Vpinch−Vth)/n. As a more specific example, in one embodiment where (Vpinch)=40 volts, (Vth)=2 volts where n=6 and (Vstartup)=19 volts.

In other embodiments, startup circuit 155 may generate a reference voltage signal (Vref). In one embodiment, the circuit that generates (Vref) may be similar to the startup voltage generation circuit discussed above. A reference voltage transistor 955 may be connected between two transistors in series of identical diode connected enhancement-mode low-voltage transistors 910. In one embodiment (Vref)=(Vpinch−Vth)/n.

Figure 10:
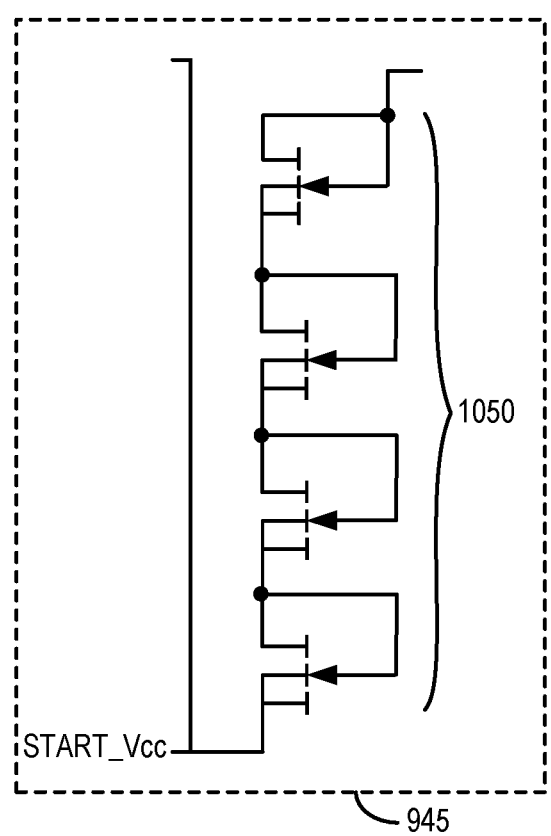
FIG. 10 is series of diode connected GaN-based enhancement-mode transistors that may be used as a diode clamp in the schematic of FIG. 9.

In further embodiments, a disable pull down transistor 935 may be connected across the gate to source of startup transistor 930. When the disable signal is high, startup transistor 930 will be disabled. A pull down resistor 940 may be connected to the gate of disable transistor 935 to prevent false turn-on of the disable transistor. In other embodiments a diode clamp 945 may be connected between the gate and the source terminals of startup transistor 930 to ensure that the gate to source voltage capabilities of the startup transistor are not violated during circuit operation (i.e., configured as gate overvoltage protection devices). In some embodiments, diode clamp 945 may be made with a series of diode connected GaN-based enhancement-mode transistors 1050, as illustrated in FIG. 10.

Figure 11:
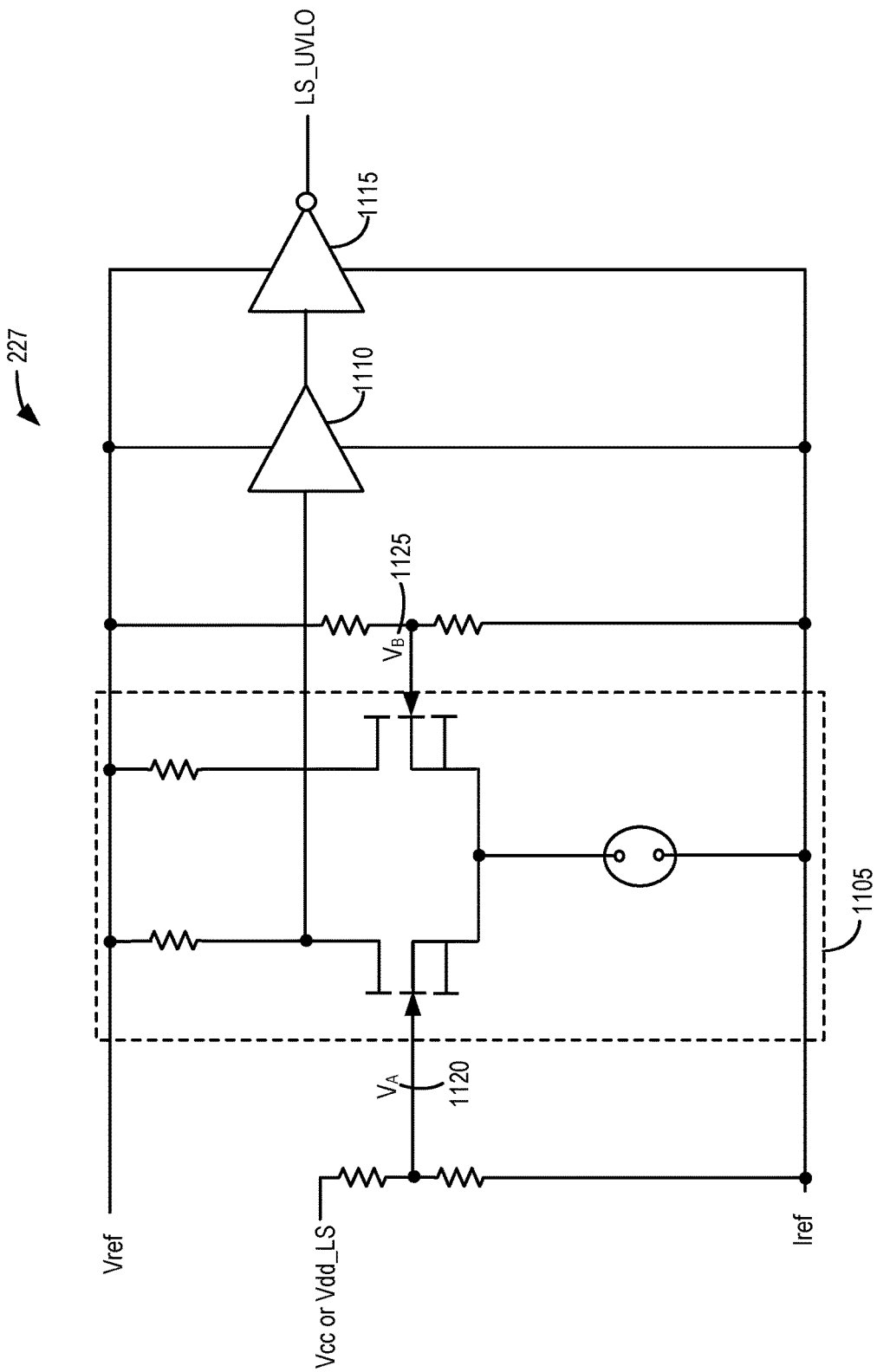
FIG. 11 is a schematic of the UVLO circuit illustrated in FIG. 1.

Now referring to FIG. 11, UVLO circuit 227 is illustrated in greater detail. In some embodiments, UVLO circuit 227 may have a differential comparator 1105, a down level shifter 1110 and an inverter 1115. In further embodiments, UVLO circuit 227 may use (Vref) and (Iref) generated by startup circuit 155 (see FIG. 9) in a differential comparator/down level shifter circuit to generate the (LS_UVLO) signal that feeds into level shift driver circuit 217 (see FIG. 2) and low side transistor driver circuit 120. In some embodiments UVLO circuit 227 can also be designed to have asymmetric hysteresis. In further embodiments the output of UVLO circuit 227 may be independent of threshold voltage. This may be accomplished by choosing a differential comparator with a relatively high gain. In one embodiment the gain can be increased by increasing the value of the current source and the pull up resistors in the differential comparator. In some embodiments the limit on the current and resistor may be set by (Vref).

In other embodiments voltages (VA) and (VB), 1120 and 1125, respectively, may be proportional to (Vcc) or (Vdd_LS) and (Vref) as dictated by the resistor divider ratio on each input. When (VA) 1120>(VB) 1125 the output of the inverting terminal goes to a low state. In one specific embodiment, the low state=(Vth) since the current source creates a source follower configuration. Similarly when (VA) 1120<(VB) 1125 the output goes to a high state (Vref). In some embodiments down level shifter 1110 may be needed because the low voltage needs to be shifted down by one threshold voltage to ensure that the low input to the next stage is below (Vth). The down shifted output may be inverted by a simple resistor pull up inverter 1115. The output of inverter 1115 is the (LS_UVLO) signal.

Figure 12:
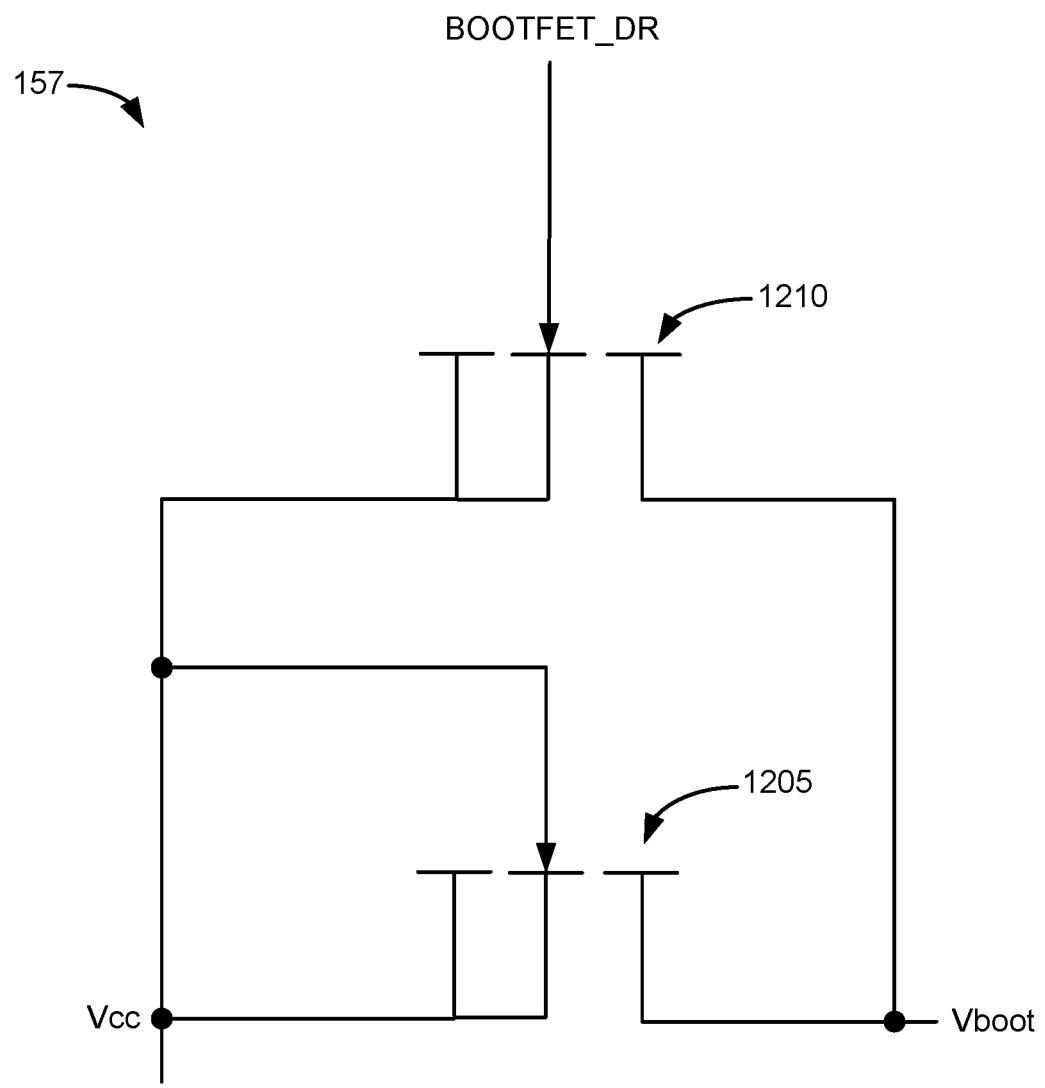
FIG. 12 is a schematic of the bootstrap capacitor charging circuit illustrated in FIG. 1.

Now referring to FIG. 12, bootstrap capacitor charging circuit 157 is illustrated in greater detail. In one embodiment, bootstrap diode and transistor circuit 157 may include a parallel connection of a high voltage diode connected enhancement-mode transistor 1205 and a high voltage bootstrap transistor 1210. In further embodiments, high voltage diode connected enhancement-mode transistor 1205 and high voltage bootstrap transistor 1210 can be designed to share the same drain finger. In some embodiments the (BOOTFET_DR) signal may be derived from bootstrap transistor drive circuit 225 (see FIG. 2). As discussed above, high voltage bootstrap transistor 1210 may be turned on coincident with the turn-on of low side transistor 115 (see FIG. 1).

Figure 13:
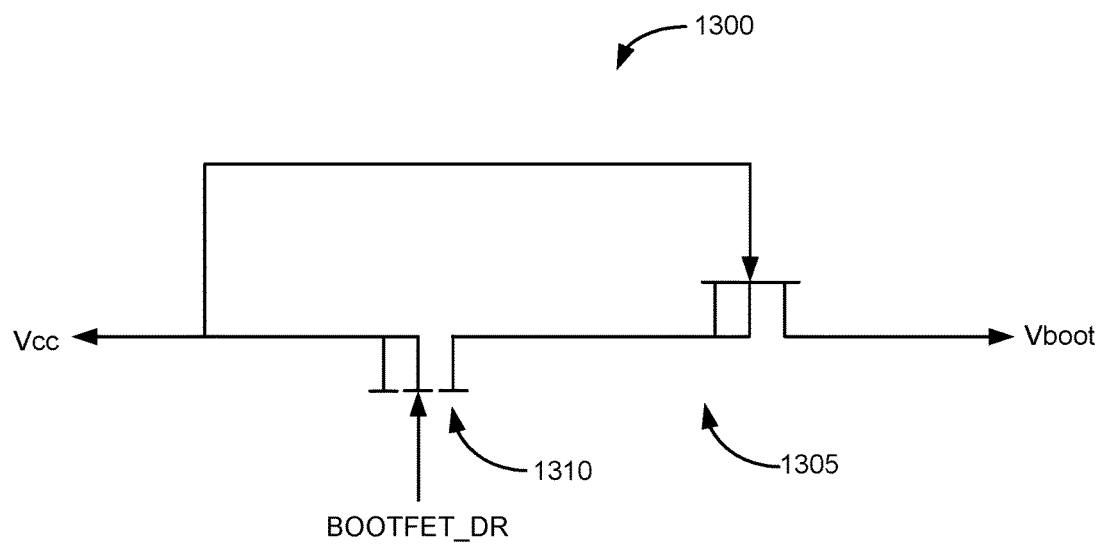
FIG. 13 is a schematic of an alternative bootstrap capacitor charging circuit as compared to the circuit illustrated in FIG. 12.

Now referring to FIG. 13, an alternative bootstrap diode and transistor circuit 1300 may be used in place of bootstrap diode and transistor circuit 157 discussed above in FIG. 12. In the embodiment illustrated in FIG. 13, a depletion-mode device 1305 cascoded by an enhancement-mode low voltage GaN device 1310 may be connected as illustrated in schematic 1300. In another embodiment, a gate of depletion-mode device 1305 can be connected to ground to reduce the voltage stress on cascoded enhancement-mode device 1310, depending upon the pinch-off voltage of the depletion-mode device.

High Side Device

Figure 14:
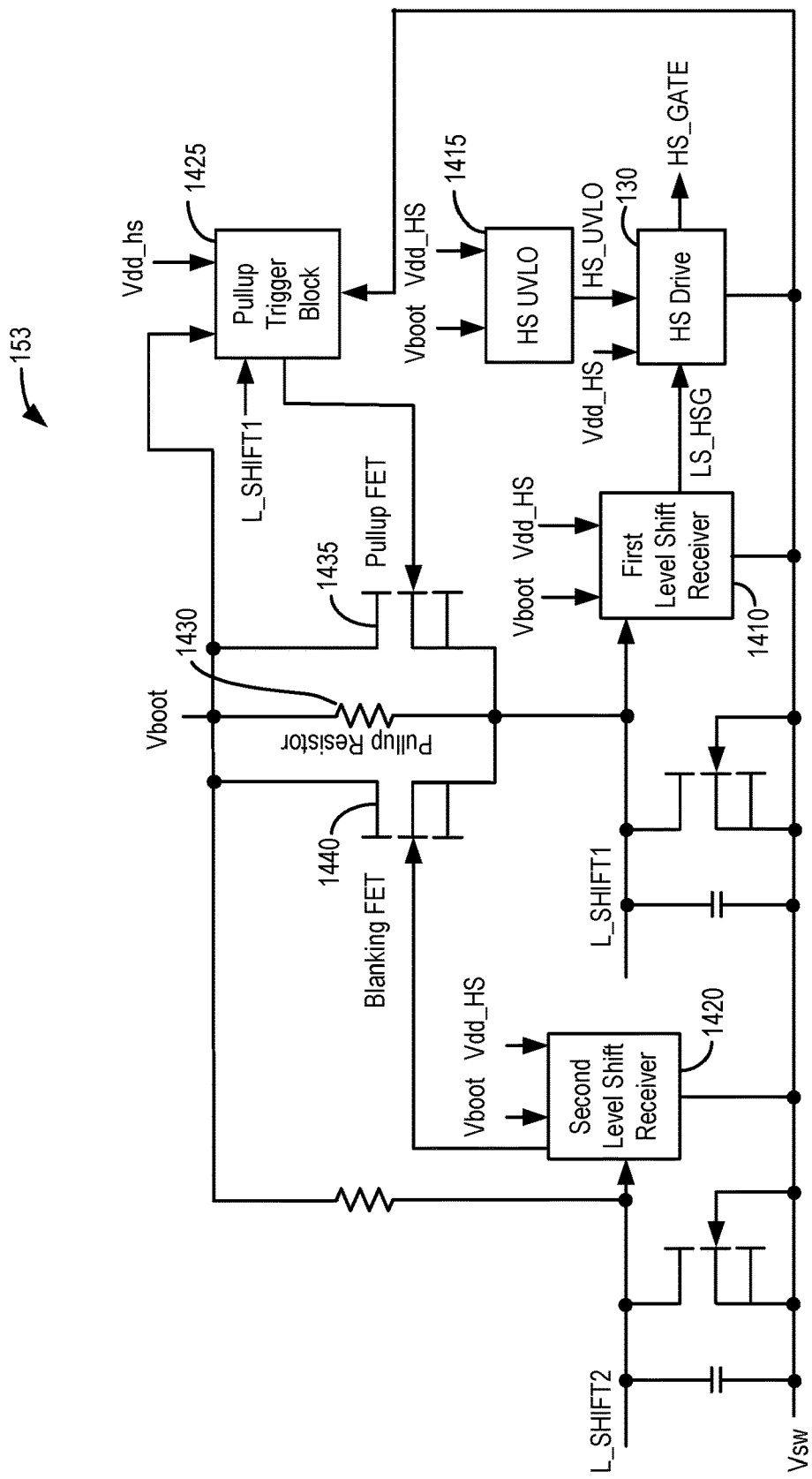
FIG. 14 is a schematic of the high side logic and control circuit illustrated in FIG. 1.

Now referring to FIG. 14, high side logic and control circuit 153 is illustrated in greater detail. In one embodiment, high side driver 130 receives inputs from first level shift receiver 1410 and high side UVLO circuit 1415 and sends a (HS_GATE) signal to high side transistor 125 (see FIG. 1). In yet further embodiments, a pull up trigger circuit 1425 is configured to receive the (LSHIFT_1) signal and control pull up transistor 1435. In some embodiments, second level shift receiver circuit 1420 is configured to control blanking transistor 1440. Both the pull up transistor 1435 and blanking transistor 1440 may be connected in parallel with pull up resistor 1430. Each circuit within high side logic and control circuit 153 is discussed below, and in some cases is shown in more detail in FIGS. 16-20.

Figure 15:
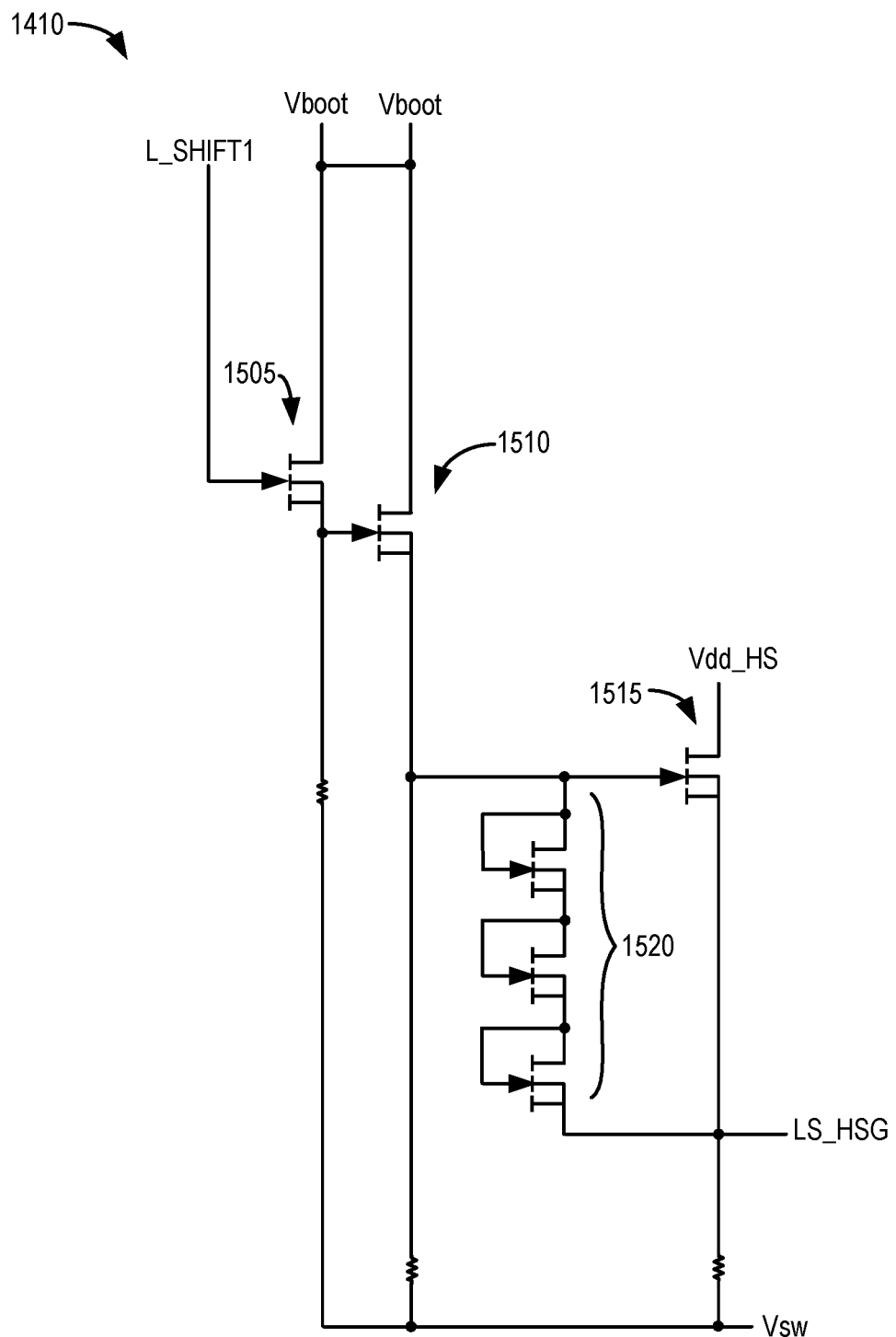
FIG. 15 is a schematic of the first level shift receiver circuit illustrated in FIG. 14.

Now referring to FIG. 15, first level shift receiver 1410 is illustrated in greater detail. In some embodiments, first level shift receiver 1410 may convert the (L_SHIFT1) signal to an (LS_HSG) signal that can be processed by high side transistor driver 130 (see FIG. 14) to drive high side transistor 125 (see FIG. 1). In further embodiments, first level shift receiver 1410 may have three enhancement-mode transistors 1505, 1510, 1515 employed in a multiple level down shifter and a plurality of diode connected transistors 1520 acting as a diode clamp, as discussed in more detail below.

In one embodiment, first level shift receiver 1410 may down shift the (L_SHIFT1) signal by 3*Vth (e.g., each enhancement-mode transistor 1505, 1510, 1515 may have a gate to source voltage close to Vth). In some embodiments the last source follower transistor (e.g., in this case transistor 1515) may have a three diode connected transistor clamp 1520 across its gate to source. In further embodiments this arrangement may be used because its source voltage can only be as high as (Vdd_HS) (i.e., because its drain is connected to Vdd_HS) while its gate voltage can be as high as V (L_SHIFT1)−2*Vth. Thus, in some embodiments the maximum gate to source voltage on last source follower transistor 1515 may be greater than the maximum rated gate to source voltage of the device technology. The output of final source follower transistor 1515 is the input to high side transistor drive 130 (see FIG. 1), (i.e., the output is the LS_HSG signal). In further embodiments fewer or more than three source follower transistors may be used. In yet further embodiments, fewer or more than three diode connected transistors may be used in clamp 1520.

Figure 16:
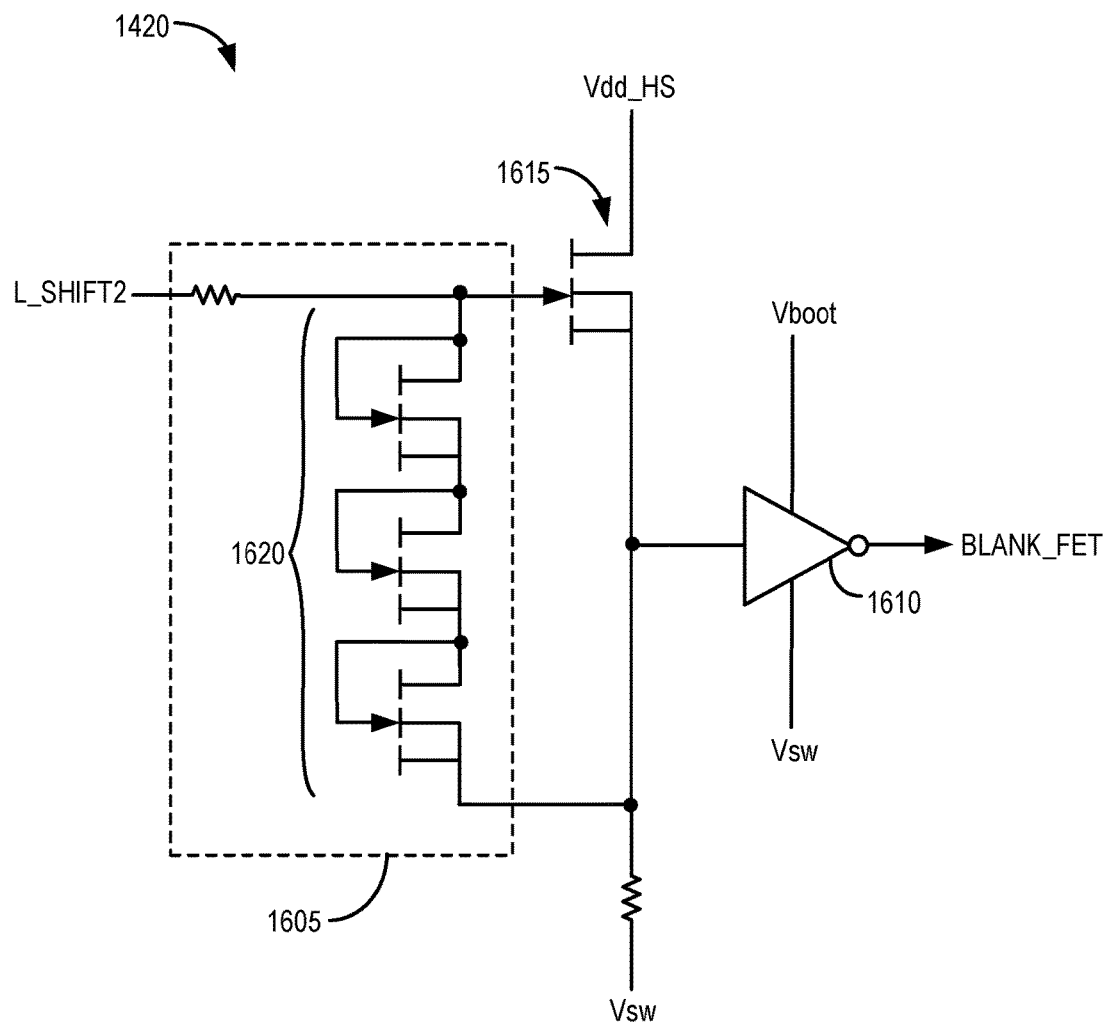
FIG. 16 is a schematic of the second level shift receiver circuit illustrated in FIG. 14.

Now referring to FIG. 16, second level shift receiver 1420 is illustrated in greater detail. In one embodiment, second level shift receiver 1420 may have a down level shift circuit 1605 and an inverter circuit 1610. In some embodiments second level shift receiver 1420 may be constructed in a similar manner as first level shift receiver 1410 (see FIG. 15), except the second level shift receiver may have only one down level shifting circuit (e.g., enhancement-mode transistor 1615) and a follow on inverter circuit 1610. In one embodiment, down level shift circuit 1605 may receive the (L_SHIFT2) signal from second level shift transistor 205 (see FIG. 2). In one embodiment, inverter circuit 1610 may be driven by the (Vboot) signal, and the gate voltage of the pull up transistor of the inverter may be used as the (BLANK FET) signal driving blanking transistor 1440 (see FIG. 14). In some embodiments the voltage may go from 0 volts in a low state to (Vboot+0.5*(Vboot−Vth)) in a high state. Similar to first level shift receiver 1410, second level shift receiver 1420 may have a diode connected transistor clamp 1620 across the gate to source of source follower transistor 1615. In other embodiments, clamp 1620 may include fewer or more than three diode connected transistors.

Figure 17:
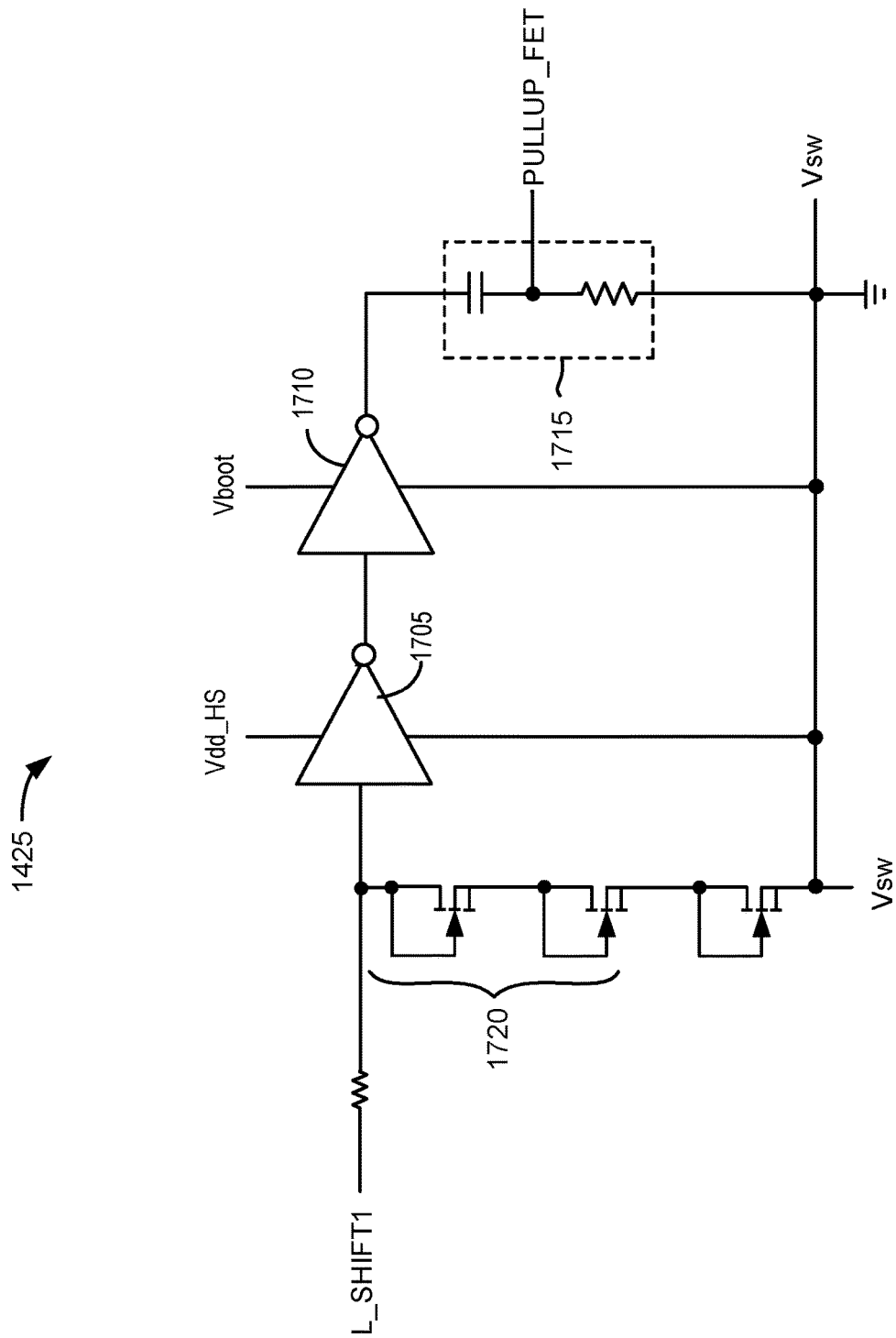
FIG. 17 is a schematic of the pull up trigger circuit illustrated in FIG. 14.

Now referring to FIG. 17, pull up trigger circuit 1425 is illustrated in greater detail. In one embodiment, pull up trigger circuit 1425 may have a first inverter 1705, a second inverter 1710, an RC pulse generator 1715 and a gate to source clamp 1720. In some embodiments pull up trigger circuit 1425 may receive the (L_SHIFT1) signal as an input, and in response, generate a pulse as soon as the (L_SHIFT1) voltage transitions to approximately the input threshold of first inverter 1705. The generated pulse may be used as the (PULLUP_FET) signal that drives pull up transistor 1435 (see FIG. 14). Second inverter 1710 may be driven by (Vboot) instead of (Vdd_HS) because pull up transistor 1435 gate voltage may need to be larger than the (L_SHIFT1) signal voltage.

Figure 18:
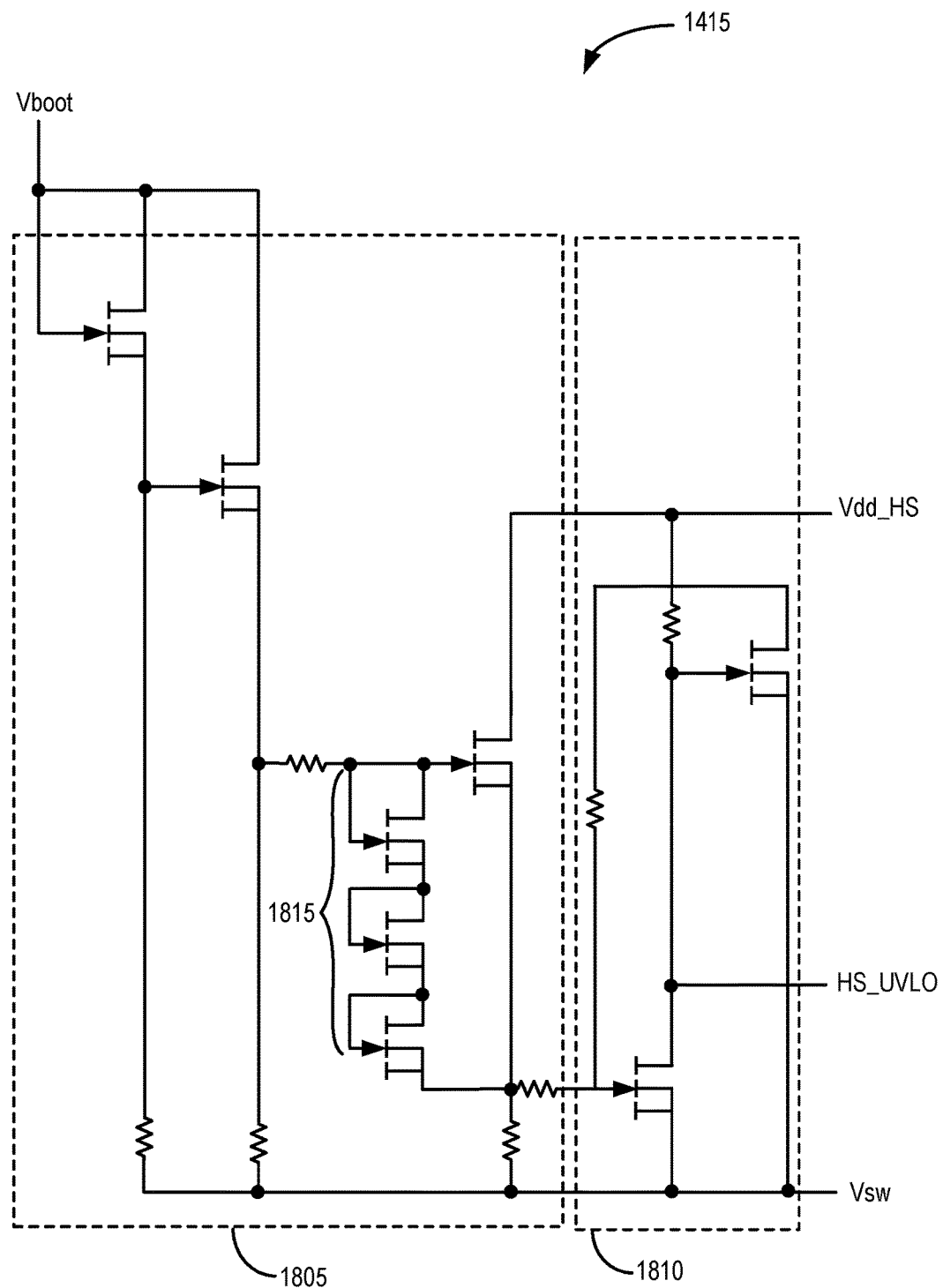
FIG. 18 is a schematic of the high side UVLO circuit illustrated in FIG. 14.

Now referring to FIG. 18, high side UVLO circuit 1415 is illustrated in greater detail. In one embodiment, high side UVLO circuit 1415 may have down level shifter 1805, a resistor pull up inverter with asymmetric hysteresis 1810 and a gate to source clamp 1815. In further embodiments, the (HS UVLO) signal generated by high side UVLO circuit 1415 may aid in preventing circuit failure by turning off the (HS_ GATE) signal generated by high side drive circuit 130 (see FIG. 14) when bootstrap capacitor 110 voltage goes below a certain threshold. In some embodiments, bootstrap capacitor 110 voltage (Vboot) (i.e., a floating power supply voltage) is measured, and in response, a logic signal is generated and combined with the output signal (LS_HSG) from first level shift receiver 1410 which is then used as the input to the high side gate drive circuit 130. More specifically, in this embodiment, for example, the UVLO circuit is designed to engage when (Vboot) reduces to less than 4*Vth above switch node (Vsw) 145 voltage. In other embodiments a different threshold level may be used.

In further embodiments, high side UVLO circuit 1415 may down shift (Vboot) in down level shifter 1805 and transfer the signal to inverter with asymmetric hysteresis 1810. The output of inverter with asymmetric hysteresis 1810 may generate the (HS_UVLO) signal which is logically combined with the output from the first level shift receiver 1410 to turn off high side transistor 125 (see FIG. 1). In some embodiments the hysteresis may be used to reduce the number of self-triggered turn-on and turn-off events of high side transistor 125 (see FIG. 1), that may be detrimental to the overall performance of half bridge circuit 100.

Figure 19:
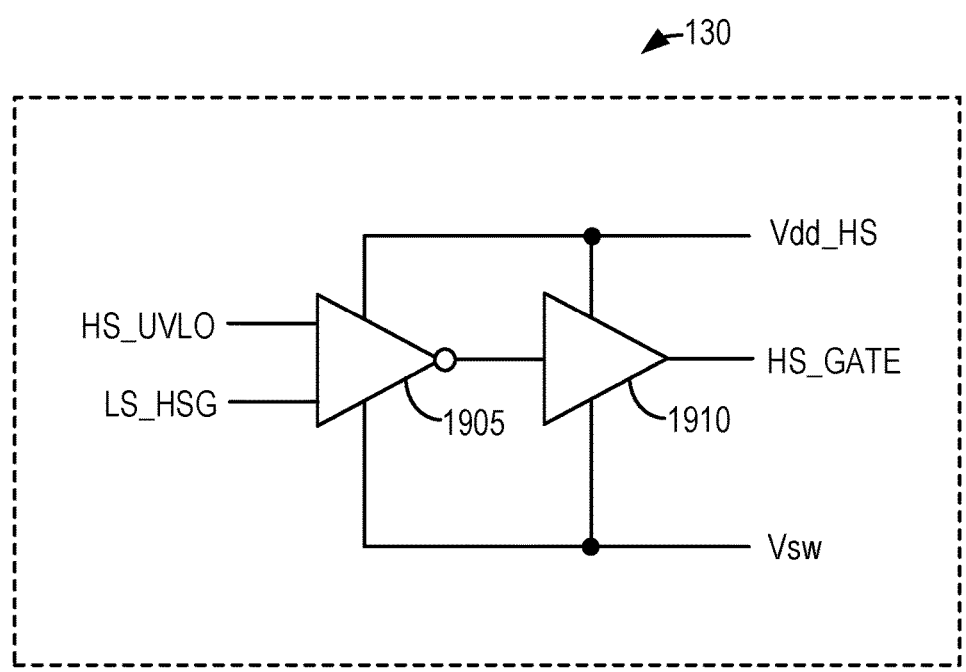
FIG. 19 is a schematic of the high side transistor driver circuit illustrated in FIG. 14.

Now referring to FIG. 19, high side transistor driver 130 is illustrated in greater detail. High side transistor driver 130 may have a first inverter stage 1905 followed by a high side drive stage 1910. First inverter stage 1905 may invert the down shifted (LS_HSG) signal received from level shift 1 receiver 1410 (see FIG. 15). The downshifted signal may then be sent through high side drive stage 1910. High side drive stage 1910 may generate the (HS_GATE) signal to drive high side transistor 125 (see FIG. 1). In further embodiments first inverter stage 1905 may contain a two input NOR gate that may ensure high side transistor 125 (see FIG. 1) is turned off when the (HS_UVLO) signal is in a high state.

Figure 20:
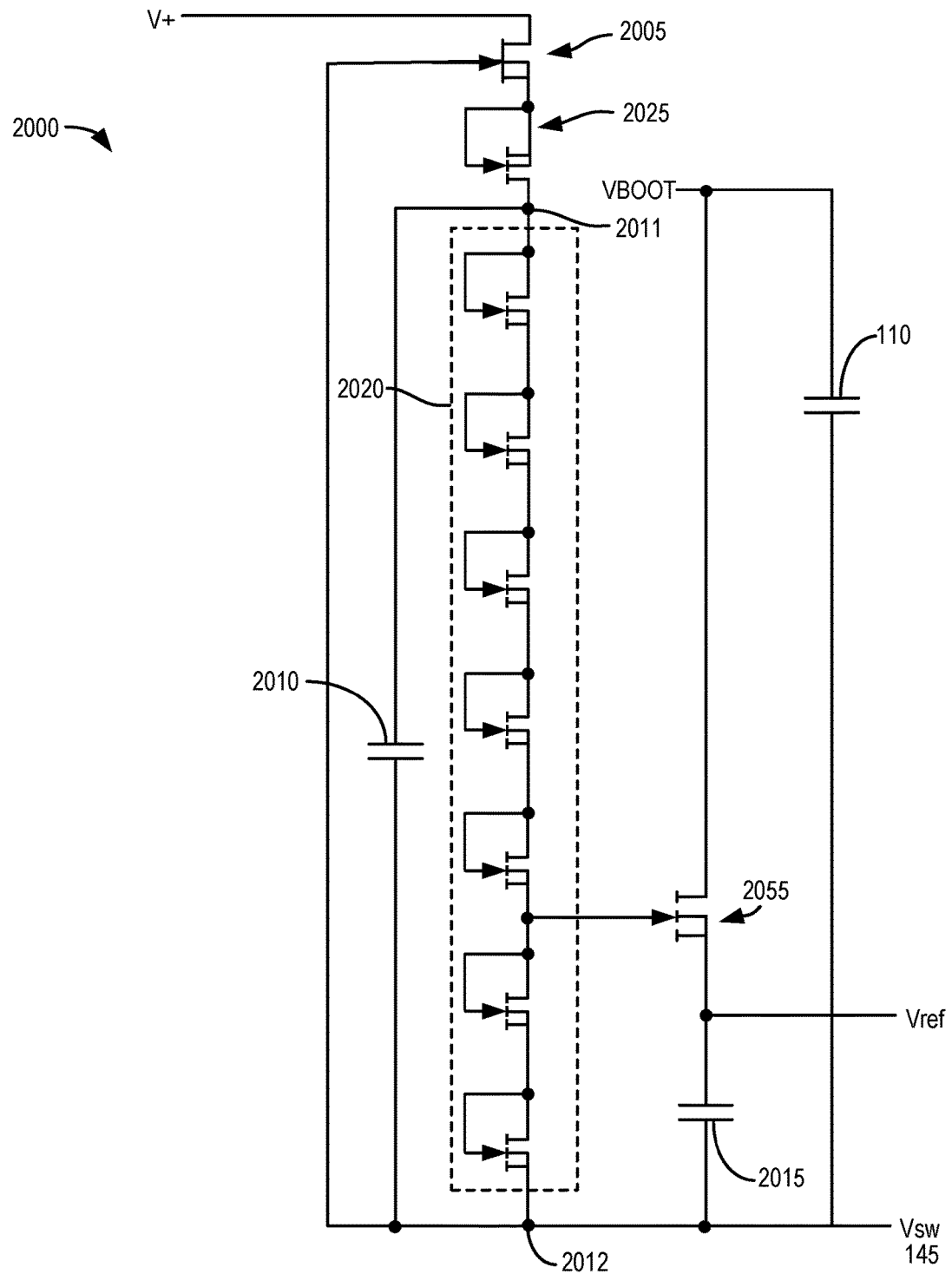
FIG. 20 is a schematic of a high side reference voltage generation circuit illustrated in FIG. 14.

Now referring to FIG. 20, a reference voltage generation circuit 2000 may be used, to generate a high side reference voltage from a supply rail. Such a circuit maybe placed on the high side GaN device 105 for generating internal power supplies which are referenced to the switch node voltage 145. In some embodiments, circuit 2000 may be similar to startup circuit 155 in FIG. 9. One difference in circuit 2000 may be the addition of a source follower capacitor 2010 connected between first node 2011 and second node 2012. In some embodiments, source follower capacitor 2010 may be needed to ensure that a well regulated voltage, which does not fluctuate with dv/dt appearing at the switch node (Vsw) 145, develops between the first node 2011 and the second node 2012. In other embodiments a reference voltage capacitor 2015 may be connected between a source of reference voltage transistor 2055 and second node 2012. In some embodiments the drain of the reference voltage transistor 2055 may be connected to the (Vboot) node. In some embodiments, reference voltage capacitor 2015 may be needed to ensure that (Vref) is well regulated and does not respond to high dv/dt conditions at switch node (Vsw) 145 (see FIG. 1). In yet further embodiments, another difference in circuit 2000 may be that second node 2012 may be coupled to a constantly varying voltage, such as switch node (Vsw) 145 (see FIG. 1), rather than a ground connection through a current sink circuit 915 (see FIG. 9). In yet further embodiments (Vref) can be used as (Vdd_HS) in the half bridge circuit 100.

Another difference in circuit 2000 may be the addition of a high-voltage diode connected transistor 2025 (i.e., the gate of the transistor is coupled to the source of the transistor) coupled between depletion-mode transistor 2005 and series of identical diode connected enhancement-mode low-voltage transistors 2020. More specifically, high-voltage diode connected transistor 2025 may have source coupled to the source of depletion-mode transistor 2005, a drain coupled to first node 2011 and a gate coupled to its source. High-voltage diode connected transistor 2025 may be used to ensure that source follower capacitor 2010 does not discharge when the voltage at the top plate of the source follower capacitor rises above (V+). In further embodiments source follower capacitor 2010 may be relatively small and may be integrated on a semiconductor substrate or within an electronic package. Also shown in FIG. 20 is bootstrap capacitor 110 that may be added externally in a half bridge circuit.

In some embodiments, shield capacitor 160 (see FIG. 1) may be connected from first level shift node 305 (see FIG. 3) and second level shift node (not shown) to switch node 145 to assist in reducing the false triggering discussed above. In some embodiments, the larger the value of shield capacitor 160, the more immune the circuit will be to false triggering effects due to the parasitic capacitance to ground. However, during high side transistor 125 turn-off, shield capacitor 160 may be discharged through pull up resistor 303 (see FIG. 3) connected to first level shift node 305. This may significantly slow down high side transistor 125 turn-off process. In some embodiments this consideration may be used to set an upper limit on the value of shield capacitor 160. In further embodiments, an overvoltage condition on first level shift node 305 (see FIG. 3) may be prevented by the use of a clamp circuit 161 (see FIG. 1) between the first level shift node and switch node 145. In some embodiments, clamp circuit 161 maybe composed of a diode connected transistor where a drain of the transistor is connected to first level shift node 305 (see FIG. 3) and a gate and a source are connected to switch node (Vsw) 145 (see FIG. 1). In further embodiments, a second shield capacitor and a second clamp circuit may be placed between the second level shift node and switch node (Vsw) 145 (see FIG. 1).

Half Bridge Circuit #1 Operation

The following operation sequence for half-bridge circuit 100 is for example only and other sequences may be used without departing from the invention. Reference will now be made simultaneously to FIGS. 1, 2 and 14.

In one embodiment, when the (PWM LS) signal from the controller is high, low side logic, control and level shift circuit 150 sends a high signal to low side transistor driver 120. Low side transistor driver 120 then communicates through the (LS_GATE) signal to low side transistor 115 to turn it on. This will set the switch node voltage (Vsw) 145 close to 0 volts. When low side transistor 115 turns on, it provides a path for bootstrap capacitor 110 to become charged through bootstrap charging circuit 157 which may be connected between (Vcc) and (Vboot). The charging path has a parallel combination of a high voltage bootstrap diode 1205 (see FIG. 12) and transistor 1210. The (BOOT-FET_DR) signal provides a drive signal to bootstrap transistor 1210 (see FIG. 12) that provides a low resistance path for charging bootstrap capacitor 110.

Bootstrap diode 1205 (see FIG. 12) may be used to ensure that there is a path for charging bootstrap capacitor 110 during startup when there is no low side transistor 115 gate drive signal (LS_GATE). During this time the (PWM_HS) signal should be low. If the (PWM_HS) signal is inadvertently turned on (i.e., in a high state) during this time the (STP_HS) signal generated from low side transistor driver 120 will prevent high side transistor 125 from turning on. If the (PWM_LS) signal is turned on while the (PWM_HS) signal is on, the (STP_LS) signal generated from level shift driver circuit 217 will prevent low side transistor 115 from turning on. Also, in some embodiments the (LS_UVLO) signal may prevent low side transistor 115 and high side transistor 125 from turning on when either (Vcc) or (Vdd_LS) goes below a preset threshold voltage level.

In further embodiments, when the (PWM_LS) signal is low, low side gate signal (LS_GATE) to low side transistor 115 is also low. During the dead time between the (PWM_LS) signal low state to the (PWM_HS) high state transition, an inductive load will force either high side transistor 125 or low side transistor 115 to turn on in the synchronous rectifier mode, depending on direction of power flow. If high side transistor 125 turns on during the dead time (e.g., during boost mode operation), switch node (Vsw) 145 voltage may rise close to (V+) 135 (rail voltage).

In some embodiments, a dv/dt condition on switch node 145 (Vsw) may tend to pull first level shift node (LSHIFT_1) 305 (see FIG. 3) to a low state relative to switch node (Vsw) 145, due to capacitive coupling to ground. This may turn on high side gate drive circuit 130 causing unintended triggering of high side transistor 125. In one embodiment, this may result in no dead time which may harm half bridge circuit 100 with a shoot through condition. In further embodiments, to prevent this condition from occurring, blanking pulse generator 223 may sense the turn-off transient of low side transistor 115 and send a pulse to turn on second level shift transistor 205. This may pull the (L_SHIFT2) signal voltage to a low state which then communicates with second level shift receiver 1420 to generate a blanking pulse signal (B_PULSE) to drive blanking transistor 1440. Blanking transistor 1440 may then act as a pull up to prevent first level shift node (LSHIFT_1) 305 (see FIG. 3) from going to a low state relative to switch node (Vsw) 145.

In further embodiments, after the dead time, when the (PWM_HS) signal goes to a high state, level shift driver circuit 217 may send a high signal to the gate of first level shift transistor 203 (via the L1_DR signal from level shift driver circuit 217). The high signal will pull first level shift node (LSHIFT_1) 305 (see FIG. 3) low relative to switch node (Vsw) 145 which will result in a high signal at the input of high side transistor 125, turning on high side transistor 125. Switch node voltage (Vsw) 145 will remain close to (V+) 135. In one embodiment, during this time, bootstrap capacitor 110 may discharge through first level shift transistor 203 (which is in an on state during this time).

If high side transistor 125 stays on for a relatively long time (i.e., a large duty cycle) bootstrap capacitor 110 voltage will go down to a low enough voltage that it will prevent high side transistor 125 from turning off when the (PWM_HS) signal goes low. In some embodiments this may occur because the maximum voltage the (L_SHIFT1) signal can reach is (Vboot) which may be too low to turn off high side transistor 125. In some embodiments, this situation may be prevented by high side UVLO circuit 1415 that forcibly turns off high side transistor 125 by sending a high input to high side gate drive circuit 130 when (Vboot) goes below a certain level.

In yet further embodiments, when the (PWM_HS) signal goes low, first level shift transistor 203 will also turn off (via the L1_DR signal from the level shift driver circuit 217). This will pull first level shift node (LSHIFT_1) 305 (see FIG. 3) to a high state. However, in some embodiments this process may be relatively slow because the high value pull up resistor 303 (see FIG. 3) (used to reduce power consumption in some embodiments) needs to charge all the capacitances attached to first level shift node (L_SHIFT1) 305 (see FIG. 3) including the output capacitance (Coss) of first level shift transistor 213 and shield capacitor 160. This may increase the turn-off delay of high side transistor 125. In order to reduce high side transistor 125 turn-off delay, pull up trigger circuit 1425 may be used to sense when first level shift node (L_SHIFT1) 305 (see FIG. 3) goes above (Vth). This condition may generate a (PULLUP_FET) signal that is applied to pull up transistor 1435 which, acting in parallel with pull up resistor 1430, may considerably speed up the pull up of first level shift node (L_SHIFT1) 305 (see FIG. 3) voltage, hastening the turn-off process.

Half Bridge Circuit #2

Figure 21:
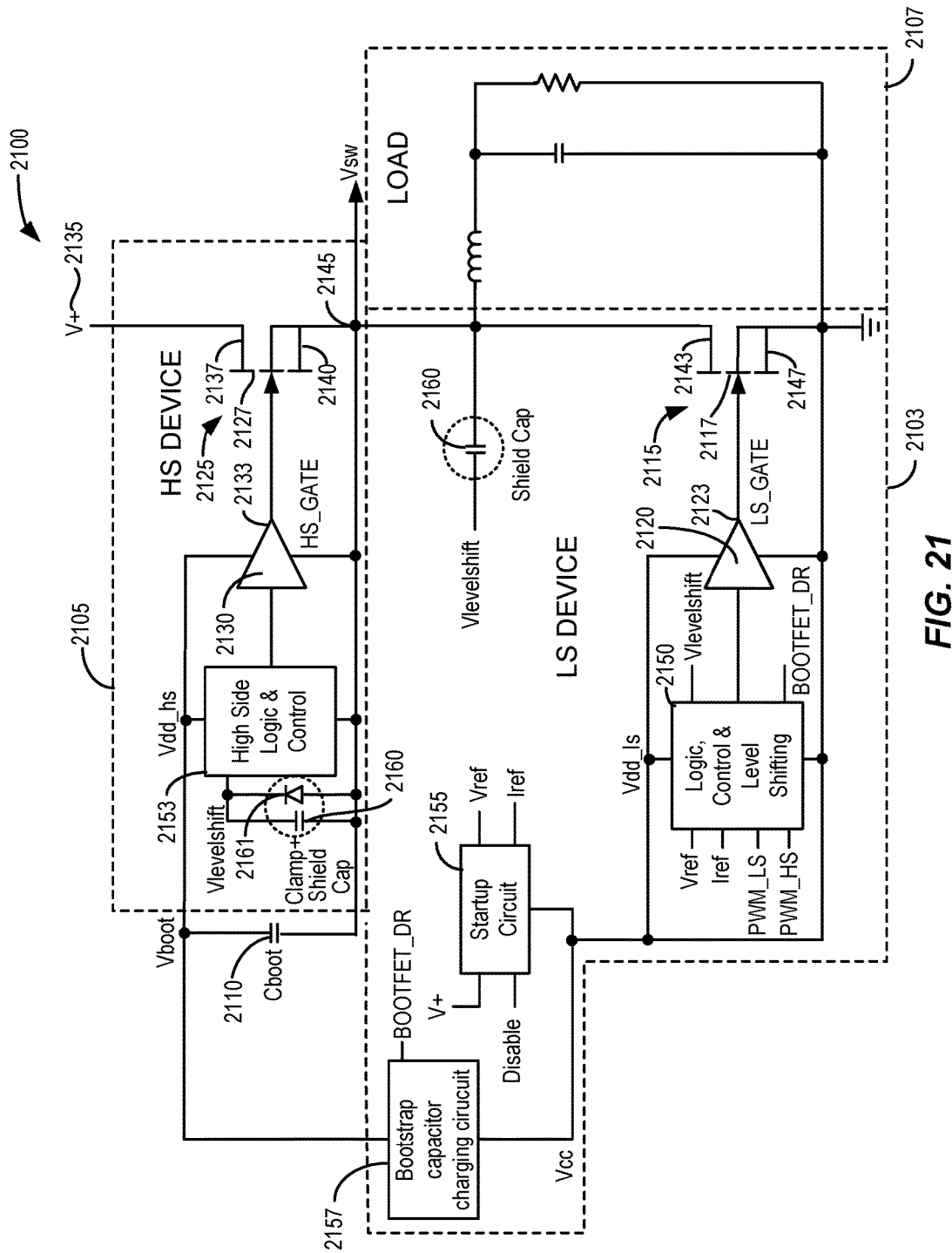
FIG. 21 is a simplified schematic of a half bridge power conversion circuit according to another embodiment of the invention.

Now referring to FIG. 21, a second embodiment of a half bridge circuit is disclosed. Half bridge circuit 2100 may have the same block diagram as circuit 100 illustrated in FIG. 1, however the level shift transistors in circuit 2100 may operate with pulsed inputs, rather than a continuous signal, as described in more detail below. In some embodiments, pulsed inputs may result in lower power dissipation, reduced stress on the level shift transistors and reduced switching time, as discussed in more detail below.

Continuing to refer to FIG. 21, one embodiment includes an integrated half bridge power conversion circuit 2100 employing a low side GaN device 2103, a high side GaN device 2105, a load 2107, a bootstrap capacitor 2110 and other circuit elements, as discussed in more detail below. Some embodiments may also have an external controller (not shown in FIG. 21) providing one or more inputs to circuit 2100 to regulate the operation of the circuit. Circuit 2100 is for illustrative purposes only and other variants and configurations are within the scope of this disclosure.

As further illustrated in FIG. 21, in one embodiment, integrated half bridge power conversion circuit 2100 may include a low side circuit disposed on low side GaN device 2103 that includes a low side transistor 2115 having a low side control gate 2117. The low side circuit may further include an integrated low side transistor driver 2120 having an output 2123 connected to a low side transistor control gate 2117. In another embodiment there may be a high side circuit disposed on high side GaN device 2105 that includes a high side transistor 2125 having a high side control gate 2127. The high side circuit may further include an integrated high side transistor driver 2130 having an output 2133 connected to high side transistor control gate 2127.

High side transistor 2125 may be used to control the power input into power conversion circuit 2100 and have a voltage source (V+) 2135 (sometimes called a rail voltage) connected to a drain 2137 of the high side transistor. High side transistor 2125 may further have a source 2140 that is coupled to a drain 2143 of low side transistor 2115, forming a switch node (Vsw) 2145. Low side transistor 2115 may have a source 2147 connected to ground. In one embodiment, low side transistor 2115 and high side transistor 2125 may be enhancement-mode field-effect transistors. In other embodiments low side transistor 2115 and high side transistor 2125 may be any other type of device including, but not limited to, GaN-based depletion-mode transistors, GaN-based depletion-mode transistors connected in series with silicon based enhancement-mode field-effect transistors having the gate of the depletion-mode transistor connected to the source of the silicon-based enhancement-mode transistor, silicon carbide based transistors or silicon-based transistors.

In some embodiments high side device 2105 and low side device 2103 may be made from a GaN-based material. In one embodiment the GaN-based material may include a layer of GaN on a layer of silicon. In further embodiments the GaN based material may include, but not limited to, a layer of GaN on a layer of silicon carbide, sapphire or aluminum nitride. In one embodiment the GaN based layer may include, but not limited to, a composite stack of other III nitrides such as aluminum nitride and indium nitride and III nitride alloys such as AlGaN and InGaN

Low Side Device

Low side device 2103 may have numerous circuits used for the control and operation of the low side device and high side device 2105. In some embodiments, low side device 2103 may include a low side logic, control and level shift circuit (low side control circuit) 2150 that controls the switching of low side transistor 2115 and high side transistor 2125 along with other functions, as discussed in more detail below. Low side device 2103 may also include a startup circuit 2155, a bootstrap capacitor charging circuit 2157 and a shield capacitor 2160, as also discussed in more detail below.

Figure 22:
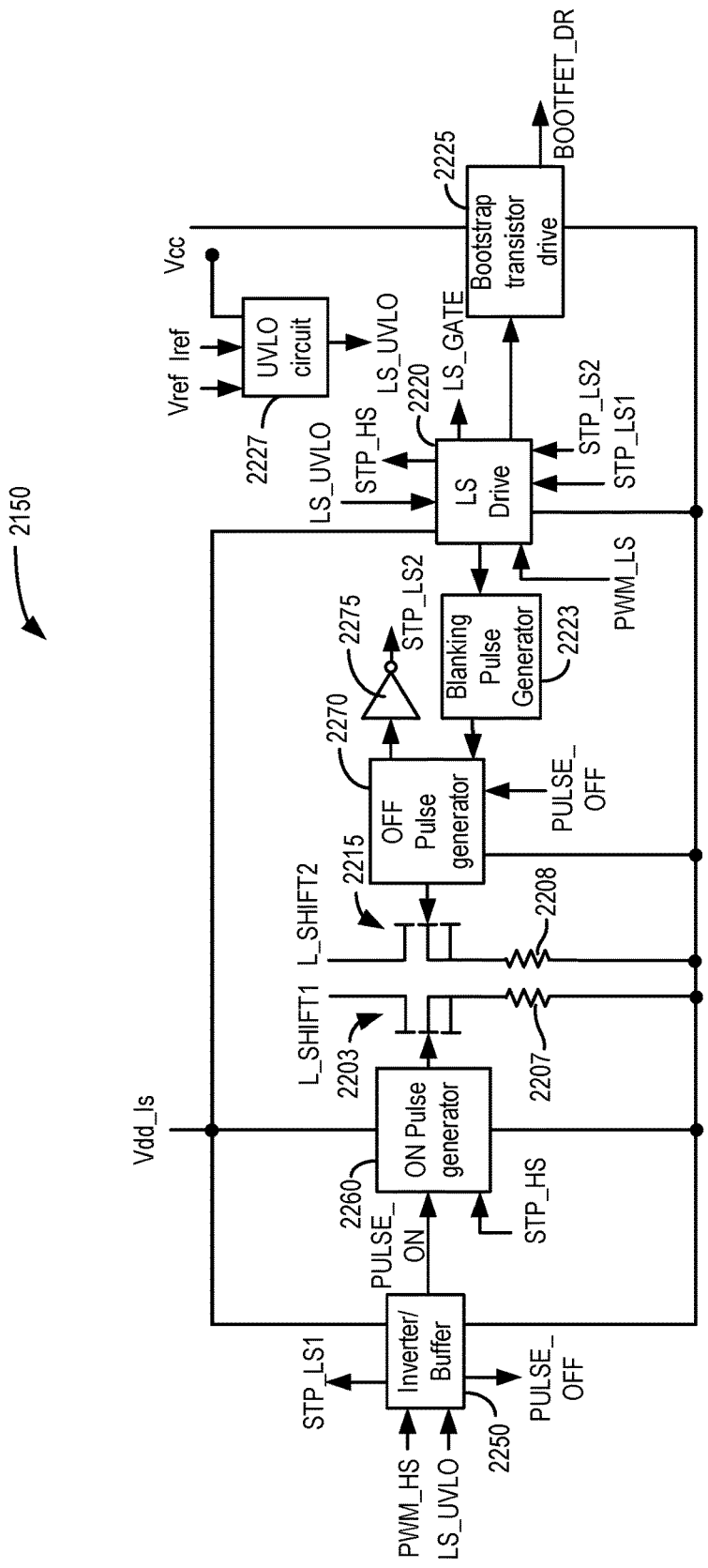
FIG. 22 is a simplified schematic of the circuits within the low side control circuit illustrated in FIG. 21.

Now referring to FIG. 22, the circuits within low side control circuit 2150 are functionally illustrated. Each circuit within low side control circuit 2150 is discussed below, and in some cases is shown in more detail in FIGS. 23-28. In one embodiment the primary function of low side control circuit 2150 may be to receive one or more input signals, such as a PWM signal from a controller, and control the operation of low side transistor 2115, and high side transistor 2125.

First level shift transistor 2203, may be an "on" pulse level shift transistor, while second level shift transistor 2215 may be an "off" pulse level shift transistor. In one embodiment, a pulse width modulated high side (PWM_HS) signal from a controller (not shown) may be processed by inverter/buffer 2250 and sent on to an on pulse generator 2260 and an off pulse generator 2270. On pulse generator 2260 may generate a pulse that corresponds to a low state to high state transient of the (PWM_HS) signal, thus turning on first level shift transistor 2203 during the duration of the pulse. Off pulse generator 2270 may similarly generate a pulse that corresponds to the high state to low state transition of the (PWM_HS) signal, thus turning on second level shift transistor 2205 for the duration of the off pulse.

First and second level shift transistors 2203, 2205, respectively, may operate as pull down transistors in resistor pull up inverter circuits. More specifically, turning on may mean the respective level shift node voltages get pulled low relative to switch node (Vsw) 2145 voltage, and turning off may result in the respective level shift nodes assuming the (Vboot) voltage. Since first and second level shift transistors 2203, 2215, respectively, are "on" only for the duration of the pulse, the power dissipation and stress level on these two devices may be less than half bridge circuit 100 illustrated in FIG. 1.

First and second resistors 2207, 2208, respectively, may be added in series with the sources of first and second level shift transistors 2203, 2215, respectively to limit the gate to source voltage and consequently the maximum current through the transistors. First and second resistors 2207, 2208, respectively, could be smaller than the source follower resistors in half bridge circuit 100 illustrated in FIG. 1, which may help make the pull down action of first and second level shift transistors 2203, 2215 faster, reducing the propagation delays to high side transistor 2125.

In further embodiments, first and second resistors 2207, 2208, respectively, could be replaced by any form of a current sink. One embodiment may connect the source of first and second level shift transistors 2203, 2205, respectively to a gate to source shorted depletion-mode device. One embodiment of a depletion-mode transistor formed in a high-voltage GaN technology may be to replace the enhancement-mode gate stack with one of the high-voltage field plate metals superimposed on top of the field dielectric layers. The thickness of the field dielectric and the work function of the metal may control the pinch-off voltage of the stack.

In further embodiments, first and second resistors 2207, 2208, respectively may be replaced by a current sink. In one embodiment a reference current (Iref) that is generated by startup circuit 2155 (see FIG. 21) may be used. Both the depletion-mode transistor and current sink embodiments may result in a significant die area reduction compared to the resistor option (i.e., because a small depletion transistor would suffice and Iref is already available).

Bootstrap transistor drive circuit 2225 may be similar to bootstrap transistor drive circuit 225 illustrated in FIG. 2 above. Bootstrap transistor drive circuit 2225 may receive input from low side drive circuit 2220 (see FIG. 22) and provide a gate drive signal called (BOOTFET_DR) to the bootstrap transistor in bootstrap capacitor charging circuit 2157 (see FIG. 21), as discussed in more detail above.

Figure 23:
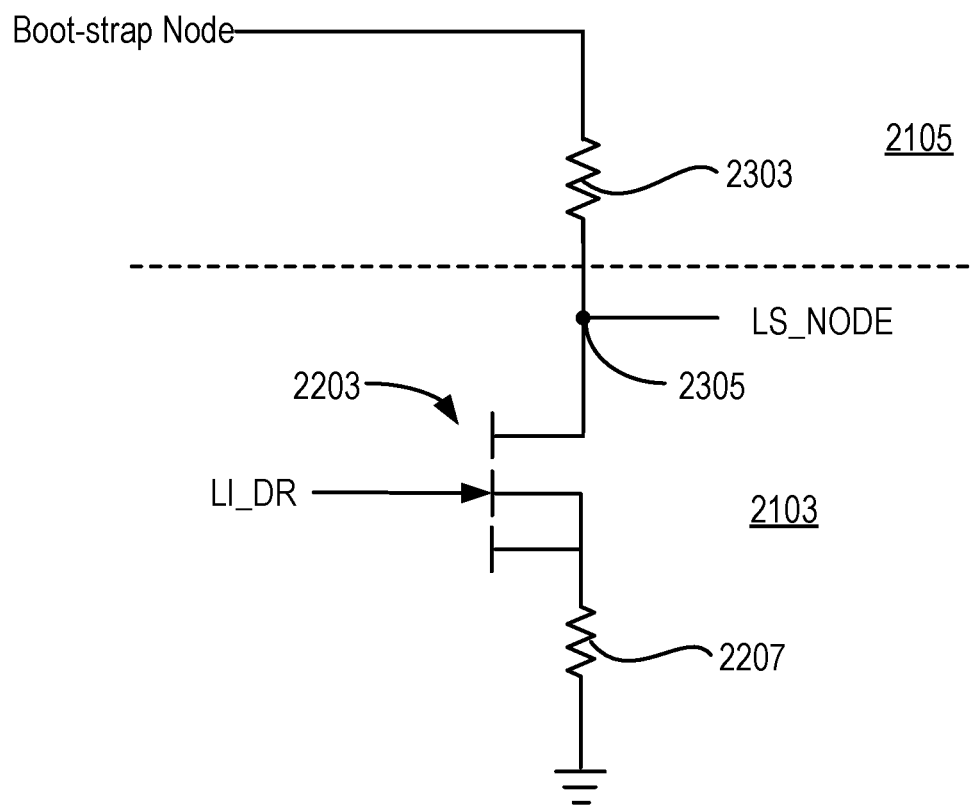
FIG. 23 is a schematic of the first level shift transistor illustrated in FIG. 22.

Now referring to FIG. 23, first level shift transistor 2203 is illustrated along with a pull up resistor 2303 that may be located in high side device 2105. In some embodiments, first level shift transistor 2203 may operate as a pull down transistor in a resistor pull up inverter similar to first level shift transistor 203 illustrated in FIG. 3. As discussed above, pull up resistor 2303 may be disposed in high side device 2105 (see FIG. 21). Second level shift transistor 2215 may have a similar configuration. In some embodiments there may be a first capacitance between the first output terminal (LS NODE) 2305 and switch node (Vsw) 2145 (see FIG. 21), and a second capacitance between a first output terminal 2305 and ground, where the first capacitance is greater than the second capacitance. The first capacitance may be designed such that in response to a high dv/dt signal at the switch node (Vsw) 2145 (see FIG. 21), a large portion of the C*dv/dt current is allowed to conduct through the first capacitance ensuring that the voltage at first output terminal 2305 tracks the voltage at the switch node (Vsw). A shield capacitor 2160 (see FIG. 21) may be configured to act as the first capacitor as described above. In further embodiments shield capacitor 2160 (see FIG. 21) may be used to create capacitance between first output terminal 2305 and switch node (Vsw) 2145 (see FIG. 21) in the half bridge power conversion circuit 2100. Shield capacitor 2160 may also be used to minimize the capacitance between first output terminal 2305 and a substrate of the semiconductor device. In further embodiments shield capacitor 2160 may be constructed on low side GaN device 2103.

Figure 24:
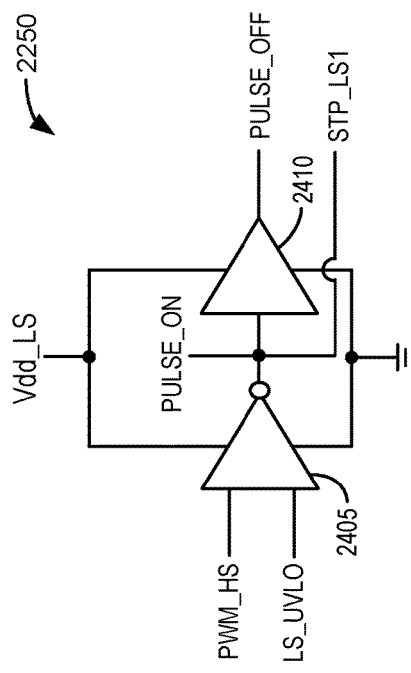
FIG. 24 is a schematic of the inverter/buffer circuit illustrated in FIG. 22.

Now referring to FIG. 24, inverter/buffer circuit 2250 is illustrated in greater detail. In one embodiment inverter/buffer circuit 2250 may have a first inverter stage 2405 and a first buffer stage 2410. In further embodiments, inverter/buffer circuit 2250 may be driven directly by the (PWM_HS) signal from the controller (not shown). The output of first inverter stage 2405 may be the input signal (PULSE ON) to on pulse generator 2260 (see FIG. 22) while the output of first buffer stage 2410 may be an input signal (PULSE OFF) to off pulse generator 2270.

In some embodiments, an optional (LS_UVLO) signal may be generated by sending a signal generated by UVLO circuit 2227 (see FIG. 22) in to a NAND gate disposed in first inverter stage 2405. This circuit may be used to turn off the level shift operation if either (Vcc) or (Vdd_LS) go below a certain reference voltage (or a fraction of the reference voltage). In further embodiments, inverter/buffer circuit 2250 may also generate a shoot through protection signal (STP_LS1) for low side transistor 2115 (see FIG. 21) that may be applied to low side transistor gate drive circuit 2120. This may turn off low side transistor gate drive circuit 2120 (see FIG. 21) when the (PWM_HS) signal is high, preventing shoot through.

Figure 25:
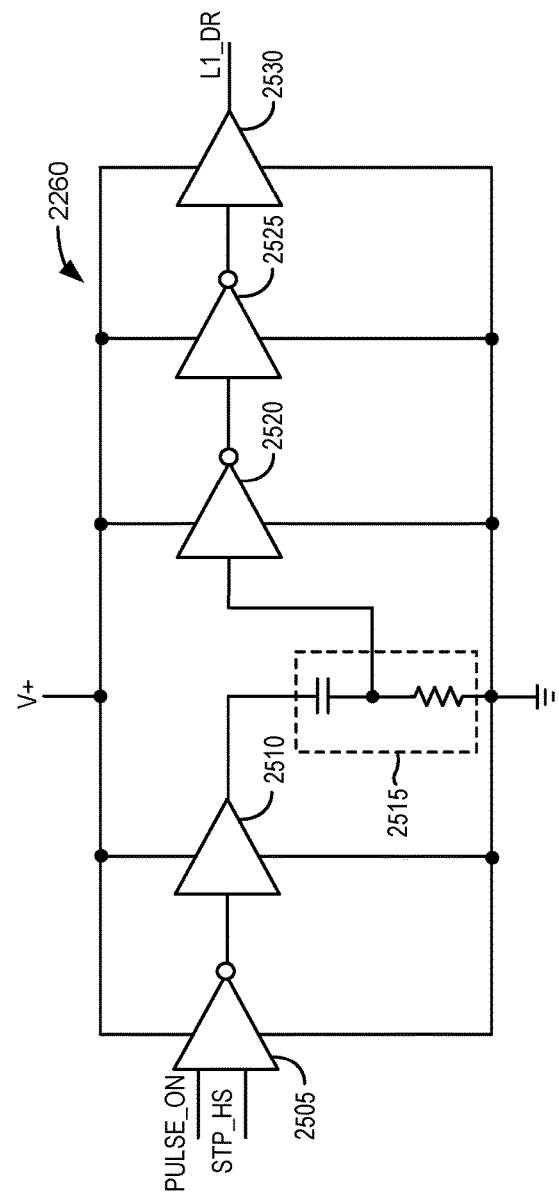
FIG. 25 is a schematic of the on pulse generator circuit illustrated in FIG. 22.

Now referring to FIG. 25, on pulse generator 2260 is illustrated in greater detail. In one embodiment on pulse generator 2260 may have a first inverter stage 2505, a first buffer stage 2510, an RC pulse generator 2515, a second inverter stage 2520 a third inverter stage 2525 and a third buffer stage 2530. In further embodiments the (PULSE_ON) signal input from inverter/buffer circuit 2250 (see FIG. 22) may be first inverted and then transformed into an on pulse by RC pulse generator 2515 and a square wave generator. The result of this operation is the gate drive signal (LI_DR) that is transmitted to first level shift transistor 2203 (see FIG. 22).

In further embodiments, on pulse generator 2260 may comprise one or more logic functions, such as for example, a binary or combinatorial function. In one embodiment, on pulse generator 2260 may have a multiple input NOR gate for the (STP_HS) signal. The (STP_HS) signal may have the same polarity as the (LS_GATE) signal. Therefore, if the (STP_HS) signal is high (corresponding to LS_GATE signal being high) the on pulse may not be generated because first inverter circuit 2505 in FIG. 25 will be pulled low which will deactivate pulse generator 2515.

In further embodiments, RC pulse generator 2515 may include a clamp diode (not shown). The clamp diode may be added to ensure that RC pulse generator 2515 works for very small duty cycles for the (PWM_LS) signal. In some embodiments, on pulse generator 2260 may be configured to receive input pulses in a range of 2 nanoseconds to 20 microseconds and to transmit pulses of substantially constant duration within the range. In one embodiment the clamp diode may turn on and short out a resistor in RC pulse generator 2515 (providing a very small capacitor discharge time) if the voltage across the clamp diode becomes larger than (Vth). This may significantly improve the maximum duty cycle of operation (with respect to the PWM_HS signal) of pulse generator circuit 2260.

Figure 26:
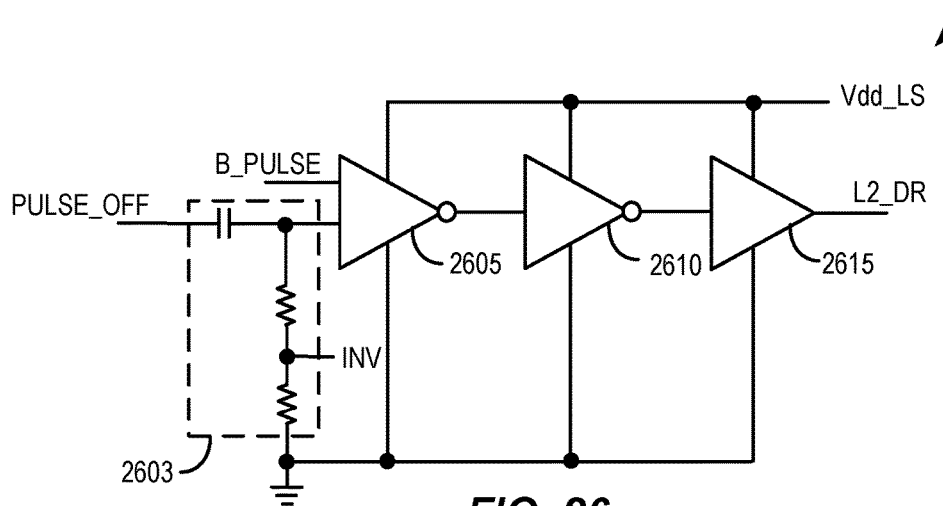
FIG. 26 is a schematic of the off pulse generator circuit illustrated in FIG. 22.

Now referring to FIG. 26, off pulse generator 2270 is illustrated in greater detail. In one embodiment off pulse generator 2270 may have an RC pulse generator 2603, a first inverter stage 2605, a second inverter stage 2610 and a first buffer stage 2615. In further embodiments, off pulse generator 2270 may receive an input signal (PULSE_OFF) from inverter/buffer circuit 2250 (see FIG. 22) that may be subsequently communicated to RC pulse generator 2603.

In further embodiments the pulse from RC pulse generator 2603 is sent through first inverter stage 2605, second inverter stage 2610 and buffer stage 2615. The pulse may then be sent as the (L2_DR) signal to second level shift transistor 2215 (see FIG. 22). A clamp diode may also be included in off pulse generator 2270. In some embodiments, the operating principle may be similar to the operating principle discussed above with regard to on pulse generator 2260 (see FIG. 25). Such operating principles may ensure that off pulse generator 2270 operates for very low on times of high side transistor 2125 (see FIG. 21) (i.e. the circuit will operate for relatively small duty cycles). In some embodiments, off pulse generator 2270 may be configured to receive input pulses in a range of 2 nanoseconds to 20 microseconds and to transmit pulses of substantially constant duration within the range. In further embodiments an off level shift pulse can be shortened by an on input pulse to enable an off time of less than 50 nanoseconds on high side transistor 2125.

In some embodiments, RC pulse generator 2603 may include a capacitor connected with a resistor divider network. The output from the resistor may be a signal (INV) that is sent to an inverter 2275 (see FIG. 22) that generates a shoot through protection signal (STP_LS2) transmitted to low side driver circuit 2220. In further embodiments, off pulse generator 2270 may comprise one or more logic functions, such as for example, a binary or combinatorial function. In one embodiment the (STP_LS2) signal is sent to a NAND logic circuit within low side driver circuit 2220, similar to the (STP_LS1) signal. In some embodiments, these signals may be used to ensure that during the duration of the off pulse signal (PULSE_OFF), low side transistor 2115 (see FIG. 21) does not turn on (i.e., because high side transistor 2125 turns off during the off pulse). In some embodiments this methodology may be useful to compensate for a turn-off propagation delay (i.e., the PULSE_OFF signal may enable shoot through protection), ensuring that low side transistor 2115 will only turn on after high side transistor 2125 gate completely turns off.

In further embodiments, a blanking pulse can be level shifted to high side device 2105 using second level shift transistor 2215. To accomplish this, a blanking pulse may be sent into a NOR input into first inverter stage 2605. The blanking pulse may be used to inhibit false triggering due to high dv/dt conditions at switch node Vsw 2145 (see FIG. 20). In some embodiments no blanking pulse may be used to filter dv/dt induced or other unwanted level shift output pulses.

Figure 27:
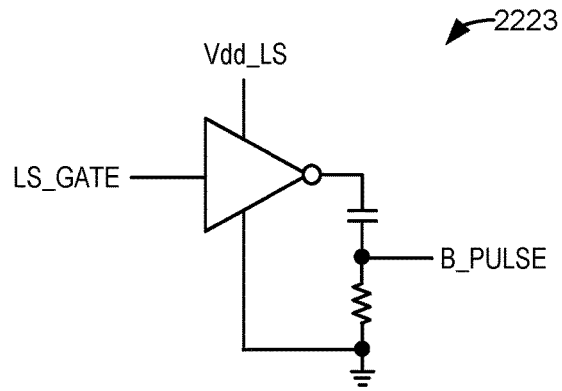
FIG. 27 is a schematic of the blanking pulse generator circuit illustrated in FIG. 22.

Now referring to FIG. 27, blanking pulse generator 2223 is illustrated in greater detail. In one embodiment, blanking pulse generator 2223 may be a more simple design than used in half bridge circuit 100 illustrated in FIG. 1 because the square wave pulse generator is already part of off pulse generator 2270. In one embodiment the (LS_GATE) signal is fed as the input to blanking pulse generator 2223 from low side gate drive circuit 2220 (see FIG. 22). This signal may be inverted and then sent through an RC pulse generator to generate a positive going pulse. In some embodiments, an inverted signal may be used because the pulse needs to correspond to the falling edge of the (LS_GATE) signal. The output of this may be used as the blanking pulse input (B_PULSE) to off pulse generator 2270.

Figure 28:
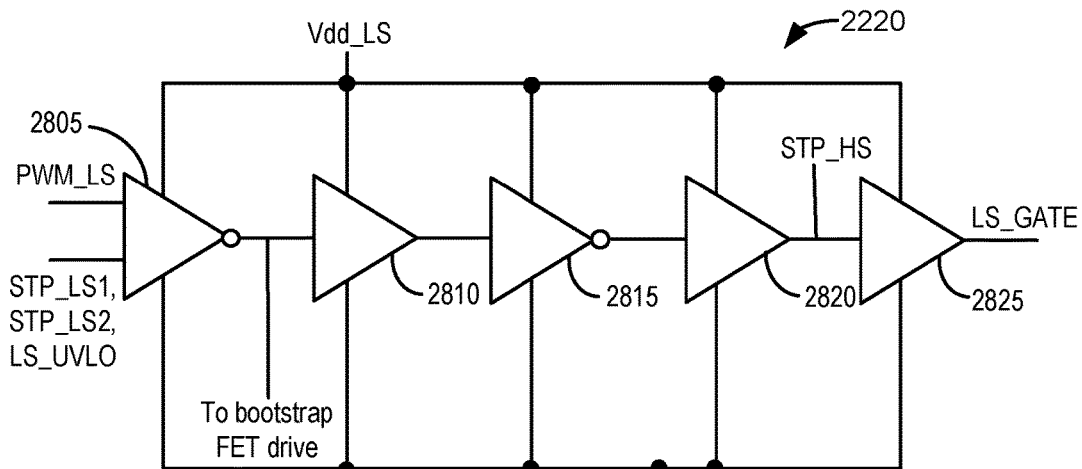
FIG. 28 is a schematic of the low side transistor drive circuit illustrated in FIG. 22.

Now referring to FIG. 28, low side transistor drive circuit 2220 is illustrated in greater detail. In one embodiment low side transistor drive circuit 2220 may have a first inverter stage 2805, a first buffer stage 2810, a second inverter stage 2815, a second buffer stage 2820 and a third buffer stage 2825. In some embodiments two inverter/buffer stages may be used because the input to the gate of low side transistor 2115 is synchronous with the (PWM_LS) signal. Thus, in some embodiments a (PWM_LS) high state may correspond to a (LS_GATE) high state and vice versa.

In further embodiments, low side transistor drive circuit 2220 may also include an asymmetric hysteresis using a resistor divider with a transistor pull down similar to the scheme described in 120 (see FIG. 8). In one embodiment low side transistor drive circuit 2220 includes multiple input NAND gates for the (STP_LS1) and (STP_LS2) (shoot through prevention on low side transistor 2115) signals. The (STP_LS1) and (STP_LS2) signals may ensure that low side transistor drive circuit 2220 (see FIG. 22) does not communicate with low side transistor 2115 (see FIG. 21) when high side transistor 2125 is on. This technique may be used to avoid the possibility of shoot-through. Other embodiments may include NAND gates (similar to the ones employed above in FIG. 28) for the (LS_UVLO) signal. One embodiment may include a turn-off delay resistor in series with the gate of the final pull down transistor. This may be used to ensure the bootstrap transistor is turned off before low side transistor 2115 turns off.

In further embodiments, low side device 2103 (see FIG. 21) may also include a startup circuit 2155, bootstrap capacitor charging circuit 2157, a shield capacitor 2160, and a UVLO circuit 2227 that may be similar to startup circuit 155, bootstrap capacitor charging circuit 157, shield capacitor 160 and UVLO circuit 227, respectively, as discussed above.

High Side Device

Figure 29:
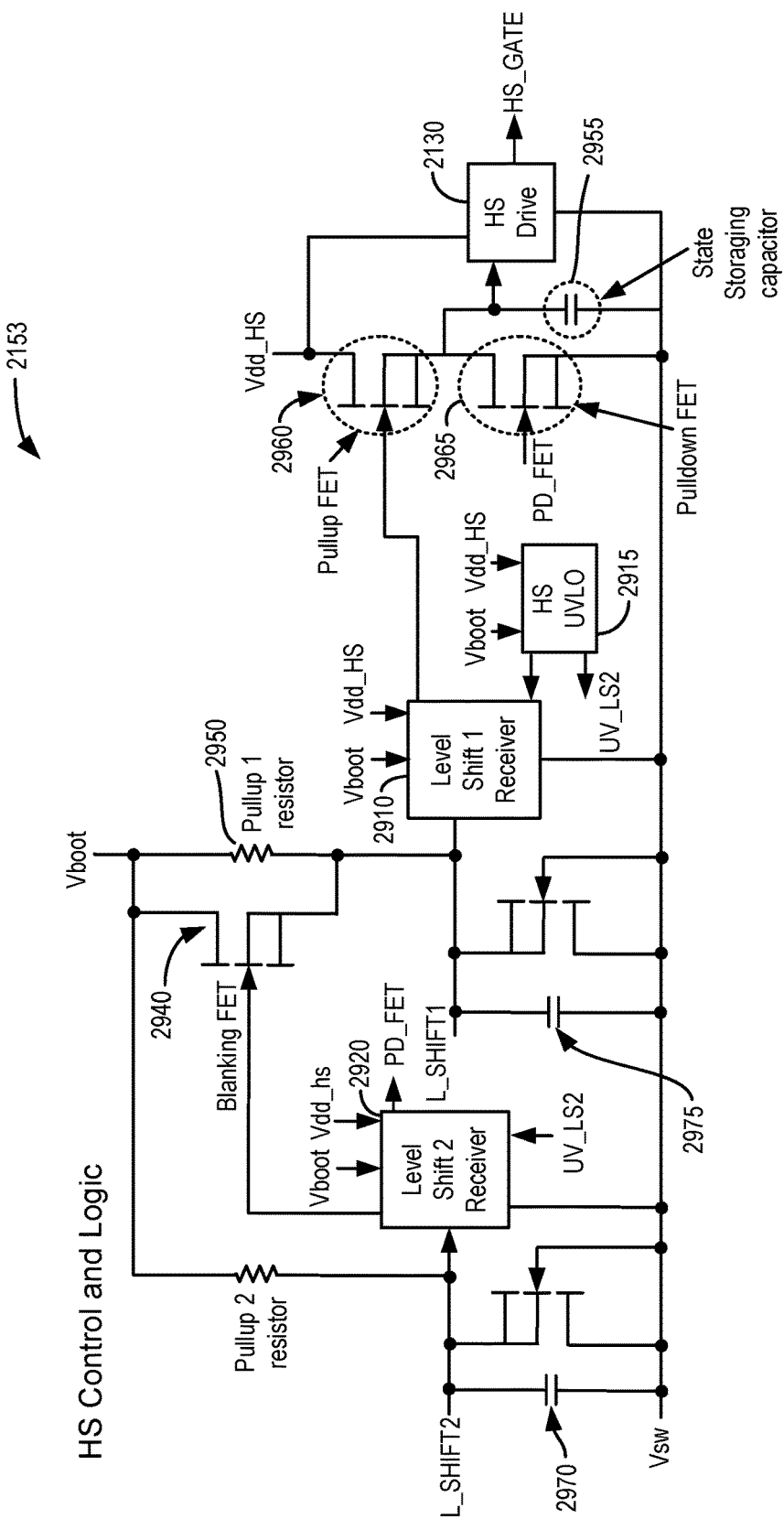
FIG. 29 is a simplified schematic of the circuits within the high side control circuit illustrated in FIG. 21.

Now referring to FIG. 29, high side logic and control circuit 2153 and how it interacts with high side transistor driver 2130 is illustrated in greater detail. In some embodiments, high side logic and control circuit 2153 may operate in similar ways as high side logic and control circuit 153, discussed above in FIG. 15. In further embodiments, high side logic and control circuit 2153 may operate in different ways, as discussed in more detail below.

In one embodiment, level shift 1 receiver circuit 2910 receives an (L_SHIFT1) signal from first level shift transistor 2203 (see FIG. 22) that receives an on pulse at the low state to high state transition of the (PWM_HS) signal, as discussed above. In response, level shift 1 receiver circuit 2910 drives a gate of pull up transistor 2960 (e.g., in some embodiments a low-voltage enhancement-mode GaN transistor). In further embodiments, pull up transistor 2960 may then pull up a state storing capacitor 2955 voltage to a value close to (Vdd_HS) with respect to switch node (Vsw) 2145 voltage. The voltage on a state storing capacitor 2955 may then be transferred to high side transistor driver 2130 and on to the gate of high side transistor gate 2127 (see FIG. 21) to turn on high side transistor 2125. In some embodiments state storing capacitor 2955 may be a latching storage logic circuit configured to change state in response to a first pulsed input signal and to change state in response to a second pulsed input signal. In further embodiments, state storing capacitor 2955 may be replaced by any type of a latching circuit such as, but not limited to an RS flip-flop.

In further embodiments, during this time, level shift 2 receiver circuit 2920 may maintain pull down transistor 2965 (e.g., in some embodiments a low-voltage enhancement-mode GaN transistor) in an off state. This may cut off any discharge path for state storing capacitor 2955. Thus, in some embodiments, state storing capacitor 2955 may have a relatively small charging time constant and a relatively large discharge time constant.

Similarly, level shift 2 receiver 2920 may receive an (L_SHIFT2) signal from second level shift transistor 2215 (see FIG. 22) that receives an off pulse at the high state to low state transition of the (PWM_HS) signal, as discussed above. In response, level shift 2 receiver circuit 2920 drives a gate of pull down transistor 2965 (e.g., in some embodiments a low-voltage enhancement-mode GaN transistor). In further embodiments, pull down transistor 2965 may then pull down (i.e., discharge) state storing capacitor 2955 voltage to a value close to switch node (Vsw) 2145, that may consequently turn off high side transistor 2125 through high side transistor driver 2130.

Continuing to refer to FIG. 29, first and second shield capacitors 2970, 2975, respectively, may be connected from (L_SHIFT1) and (L_SHIFT2) nodes to help prevent false triggering during high dv/dt conditions at switch node (Vsw) 2145 (see FIG. 21). In further embodiments there may also be a clamp diode between the (L_SHIFT1) and (L_SHIFT2) nodes and the switch node (Vsw) 2145 (see FIG. 21). This may ensure that the potential difference between switch node (Vsw) 2145 (see FIG. 21) and the (L_SHIFT1) and (L_SHIFT2) nodes never goes above (Vth). This may be used to create a relatively fast turn-on and turn-off for high side transistor 2125 (see FIG. 21).

Figure 30:
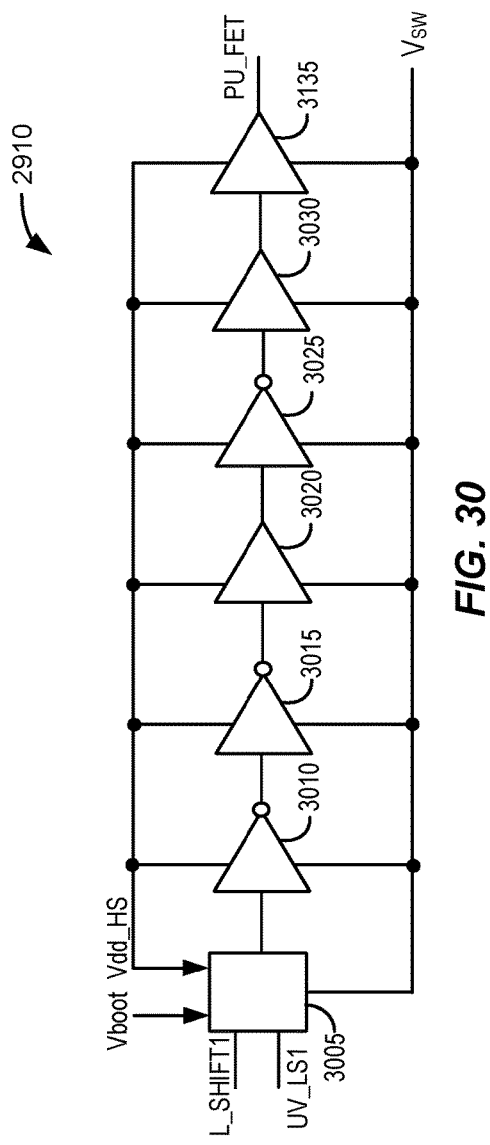
FIG. 30 is a schematic of the level shift 1 receiver circuit illustrated in FIG. 29.

Now referring to FIG. 30, level shift 1 receiver 2910 is illustrated in greater detail. In one embodiment level shift 1 receiver 2910 may include a down level shifter 3005, a first inverter 3010, a second inverter 3015, a first buffer 3020, a third inverter 3025, a second buffer 3030 and a third buffer 3135. In some embodiments, level shift 1 receiver 2910 down shifts (i.e., modulates) the (L_SHIFT1) signal by a voltage of 3*Vth (e.g., using three enhancement-mode transistors where each may have a gate to source voltage close to Vth). In other embodiments a fewer or more downshift transistors may be used.

In further embodiments, the last source follower transistor may have a three diode connected transistor clamp across its gate to its source. In some embodiments this configuration may be used because its source voltage can only be as high as (Vdd_HS) (i.e., because its drain is connected to Vdd_HS) while its gate voltage can be as high as V (L_SHIFT1)−2*Vth. Thus, in some embodiments the maximum gate to source voltage on the final source follower transistor can be greater than the maximum rated gate to source voltage in the technology.

In further embodiments, first inverter 3010 may also have a NOR Gate for the high side under voltage lock out using the (UV_LS1) signal generated by high side UVLO circuit 2915. In one embodiment, an output of level shift 1 receiver 2910 (see FIG. 29) may be a (PU_FET) signal that is communicated to a gate of pull up transistor 2960 (see FIG. 29). This signal may have a voltage that goes from 0 volts in a low state to (Vdd_HS)+(Vdd_HS−Vth) in a high state. This voltage may remain on for the duration of the on pulse.

Figure 31:
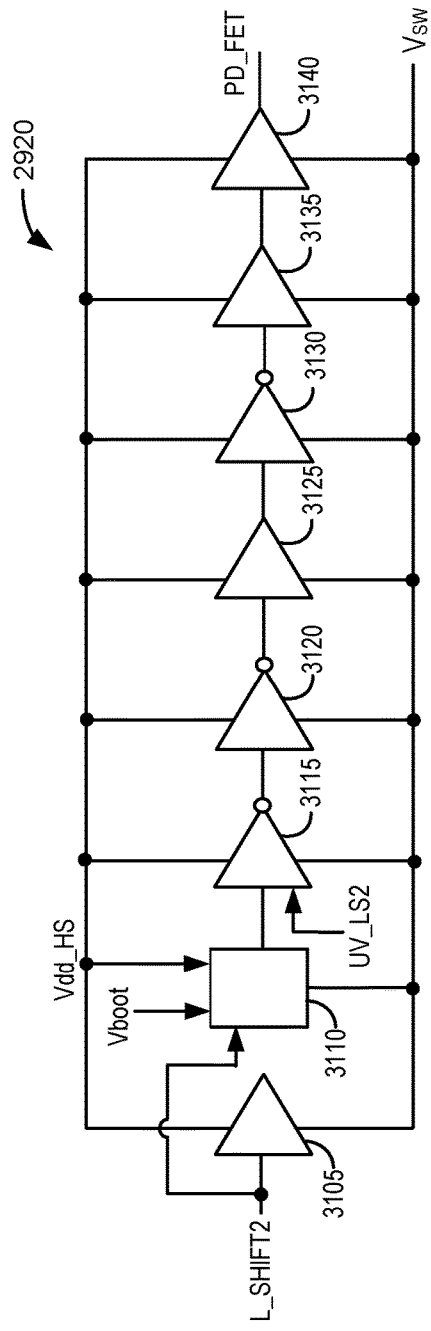
FIG. 31 is a schematic of level shift 2 receiver circuit illustrated in FIG. 29.

Now referring to FIG. 31, level shift 2 receiver 2920 is illustrated in greater detail. In one embodiment level shift 2 receiver 2920 may be similar to level shift 1 receiver 2910 discussed above. In further embodiments level shift 2 receiver 2920 may include a blanking pulse generator 3105, a down level shifter 3110, a first inverter 3115, a second inverter 3120, a first buffer 3125, an third inverter 3130, a second buffer 3135 and a third buffer 3140. In one embodiment, blanking pulse generator 3105 may be used in addition to a 3*Vth down level shifter 3110 and multiple inverter/buffer stages.

In other embodiments different configurations may be used. In some embodiments, this particular configuration may be useful when level shift 2 receiver 2920 doubles as a high side transistor 2125 (see FIG. 21) turn-off as well as a blanking transistor 2940 (see FIG. 29) drive for better dv/dt immunity. In some embodiments, blanking pulse generator 3105 may be identical to level shift 2 receiver 1520 illustrated in FIG. 17. In one embodiment level shift 2 receiver 2920 (see FIG. 29) may receive (L_SHIFT2) and (UV_LS2) signals and in response, transmit a (PD_FET) signal to pull down transistor 2965. In further embodiments, first inverter 3115 may have a two input NAND gate for the (UV_LS2) signal from high side UVLO circuit 2915 (see FIG. 29).

Figure 32:
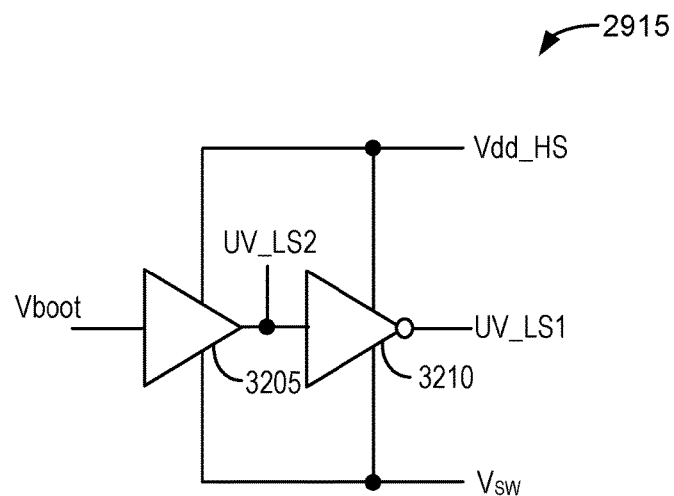
FIG. 32 is a schematic of the high side UVLO circuit illustrated in FIG. 29.

Now referring to FIG. 32, high side UVLO circuit 2915 is illustrated in greater detail. In one embodiment high side UVLO circuit 2915 may include a down level shifter 3205 and a resistor pull up inverter stage 3210. In some embodiments, high side UVLO circuit 2915 may be configured to prevent circuit failure by turning off the (HS_GATE) signal to high side transistor 2125 (see FIG. 21) when bootstrap capacitor 2110 voltage goes below a certain threshold. In one example embodiment high side UVLO circuit 2915 is designed to engage when (Vboot) reduces to a value less than 4*Vth below switch node (Vsw) 2145 voltage. In another embodiment the output of down level shifter 3205 may be a (UV_LS2) signal transmitted to second level shift receiver 2920 and the output of resistor pull up inverter stage 3210 may be an (UV_LS1) signal that is transmitted to first level shift receiver 2910.

As discussed below, in some embodiments high side UVLO circuit 2915 may be different from high side UVLO circuit 1415 for half bridge circuit 100 discussed above in FIGS. 14 and 18, respectively. In one embodiment, the (Vboot) signal may be down shifted by 3*Vth and transferred to resistor pull up inverter stage 3210. In further embodiments, since level shift 2 receiver circuit 2920 (see FIG. 29) controls the turn-off process based on high side transistor 2125 (see FIG. 21), directly applying a 3*Vth down shifted output to the NAND gate at the input of level shift 2 receiver circuit 2920 will engage the under voltage lock out.

However, in some embodiments, because the bootstrap voltage may be too low, this may also keep pull up transistor 2960 (see FIG. 29) on. In some embodiments, this may result in a conflict. While level shift 2 receiver circuit 2920 (see FIG. 29) tries to keep high side transistor 2125 (see FIG. 21) off, level shift 1 receiver circuit 2910 may try to turn the high side transistor on. In order to avoid this situation, some embodiments may invert the output of the 3*Vth down shifted signal from high side UVLO circuit 2915 (see FIG. 29) and send it to a NOR input on level shift 1 receiver circuit 2910. This may ensure that level shift 1 receiver circuit 2910 does not interfere with the UVLO induced turn-off process.

Figure 33:
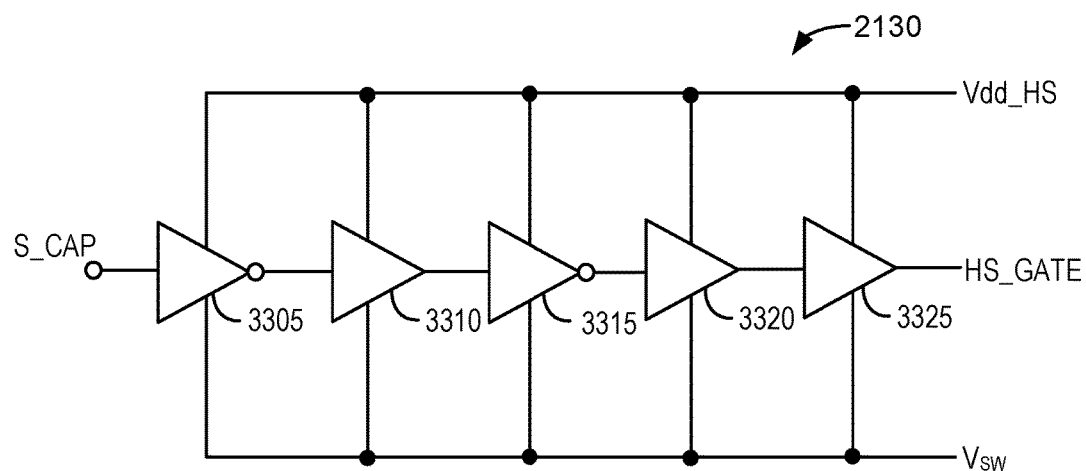
FIG. 33 is a schematic of the high side transistor driver circuit illustrated in FIG. 29.

Now referring to FIG. 33, high side transistor driver 2130 is illustrated in greater detail. In one embodiment high side transistor driver 2130 may include a first inverter 3305, a first buffer 3310, a second inverter 3315, a second buffer 3320 and a third buffer 3325. In some embodiments high side transistor driver 2130 may be a more basic design than high side transistor driver 130 employed in half bridge circuit 100 illustrated in FIG. 1. In one embodiment, high side transistor driver 2130 receives an (S_CAP) signal from state storage capacitor 2955 (see FIG. 29) and delivers a corresponding drive (HS_GATE) signal to high side transistor 2125 (see FIG. 21). More specifically, when the (S_CAP) signal is in a high state, the (HS_GATE) signal is in a high state and vice versa.

Half Bridge Circuit #2 Operation

The following operation sequence for half-bridge circuit 2100 (see FIG. 21) is for example only and other sequences may be used without departing from the invention. Reference will now be made simultaneously to FIGS. 21, 22 and 29.

In one embodiment, when the (PWM_LS) signal is in a high state, low side logic, control and level shift circuit 2150 may send a high signal to low side transistor driver 2120 which then communicates that signal to low side transistor 2115 to turn it on. This may set switch node (Vsw) 2145 voltage close to 0 volts. In further embodiments, when low side transistor 2115 turns on it may provide a path for bootstrap capacitor 2110 to charge. The charging path may have a parallel combination of a high-voltage bootstrap diode and transistor.

In some embodiments, bootstrap transistor drive circuit 2225 may provide a drive signal (BOOTFET_DR) to the bootstrap transistor that provides a low resistance path for charging bootstrap capacitor 2110. In one embodiment, the bootstrap diode may ensure that there is a path for charging bootstrap capacitor 2110 during startup when there is no low side gate drive signal (LS_GATE). During this time the (PWM_HS) signal should be in a low state. If the (PWM_HS) signal is inadvertently turned on during this time, the (STP_HS) signal generated from low side driver circuit 2220 may prevent high side transistor 2125 from turning on. If the (PWM_LS) signal is turned on while the (PWM_HS) signal is on, then the (STP_LS1) and (STP_LS2) signals generated from inverter/buffer 2250 and inverter 2275, respectively will prevent low side transistor 2115 from turning on. In addition, in some embodiments the (LS_UVLO) signal may prevent low side gate 2117 and high side gate 2127 from turning on when either (Vcc) or (Vdd_LS) go below a predetermined voltage level.

Conversely, in some embodiments when the (PWM_LS) signal is in a low state, the (LS_GATE) signal to low side transistor 2115 may also be in a low state. In some embodiments, during the dead time between the (PWM_LS) low signal and the (PWM_HS) high signal transition, the inductive load may force either high side transistor 2125 or low side transistor 2115 to turn-on in the synchronous rectifier mode, depending on the direction of power flow. If high side transistor 2125 turns on during the dead time (e.g., in a boost mode), switch node (Vsw) 2145 voltage may rise close to (V+) 2135 (i.e., the rail voltage). This dv/dt condition on switch node (Vsw) 2145 may tend to pull the (L_SHIFT1) node to a low state relative to the switch node (i.e., because of capacitive coupling to ground) which may turn on high side transistor driver 2130 causing unintended conduction of high side transistor 2125. This condition may negate the dead time, causing shoot through.

In some embodiments this condition may be prevented by using blanking pulse generator 2223 to sense the turn-off transient of low side transistor 2115 and send a pulse to turn on second level shift transistor 2205. This may pull the (L_SHIFT2) signal to a low state which may then communicate with level shift 2 receiver circuit 2920 to generate a blanking pulse to drive blanking transistor 2940. In one embodiment, blanking transistor 2940 may act as a pull up to prevent the (L_SHIFT1) signal from going to a low state relative to switch node (Vsw) 2145.

In further embodiments, after the dead time when the (PWM_HS) signal transitions from a low state to a high state, an on pulse may be generated by on pulse generator 2260. This may pull the (L_SHIFT1) node voltage low for a brief period of time. In further embodiments this signal may be inverted by level shift 1 receiver circuit 2910 and a brief high signal will be sent to pull up transistor 2960 that will charge state storage capacitor 2955 to a high state. This may result in a corresponding high signal at the input of high side transistor driver 2130 which will turn on high side transistor 2125. Switch node (Vsw) 2145 voltage may remain close to (V+) 2135 (i.e., the rail voltage). State storing capacitor 2955 voltage may remain at a high state during this time because there is no discharge path.

In yet further embodiments, during the on pulse, bootstrap capacitor 2110 may discharge through first level shift transistor 2203. However, since the time period is relatively short, bootstrap capacitor 2110 may not discharge as much as it would if first level shift transistor 2203 was on during the entire duration of the (PWM_HS) signal (as was the case in half bridge circuit 100 in FIG. 1). More specifically, in some embodiments this may result in the switching frequency at which the UVLO engages to be a relatively lower value than in half bridge circuit 100 in FIG. 1.

In some embodiments, when the (PWM_HS) signal transitions from a high state to a low state, an off pulse may be generated by off pulse generator 2270. This may pull the (L_SHIFT2) node voltage low for a brief period of time. This signal may be inverted by level shift 2 receiver circuit 2920 and a brief high state signal may be sent to pull down transistor 2965 that will discharge state storing capacitor 2955 to a low state. This will result in a low signal at the input of high side transistor driver 2130 that will turn off high side transistor 2125. In further embodiments, state storing capacitor 2955 voltage may remain at a low state during this time because it has no discharge path.

In one embodiment, since the turn-off process in circuit 2100 does not involve charging level shift node capacitors through a high value pull up resistor, the turn-off times may be relatively shorter than in half bridge circuit 100 in FIG. 1. In further embodiments, high side transistor 2125 turn-on and turn-off processes may be controlled by the turn-on of substantially similar level shift transistors 2203, 2205, therefore the turn-on and turn-off propagation delays may be substantially similar. This may result in embodiments that have no need for a pull up trigger circuit and/or a pull up transistor as were both used in half bridge circuit 100 in FIG. 1.

ESD Circuits

Figure 34:
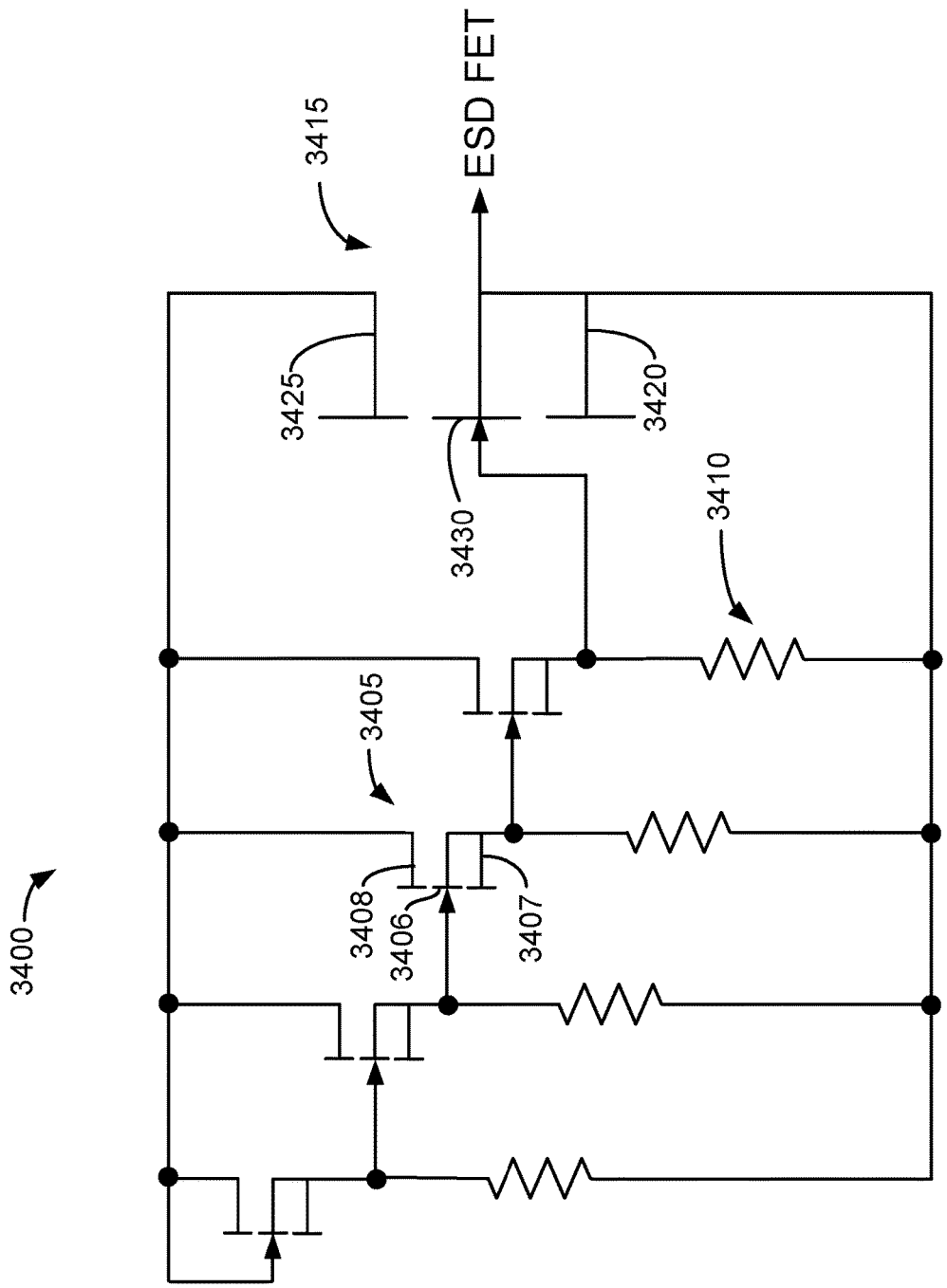
FIG. 34 is a schematic of an electro-static discharge (ESD) clamp circuit according to an embodiment of the invention.

Now referring to FIG. 34, in some embodiments, one or more pins (i.e., connections from a semiconductor device within an electronic package to an external terminal on the electronic package) may employ an electro-static discharge (ESD) clamp circuit to protect the circuit. The following embodiments illustrate ESD clamp circuits that may be used on one or more pins in one or more embodiments disclosed herein, as well as other embodiments that may require ESD protection. In further embodiments, the ESD clamp circuits disclosed herein may be employed on GaN-based devices.

One embodiment of an electro-static discharge (ESD) clamp circuit 3400 is illustrated. ESD clamp circuit 3400 may have a configuration employing one or more source follower stages 3405 made from enhancement-mode transistors. Each source follower stage 3405 may have a gate 3406 connected to a source 3407 of an adjacent source follower stage. In the embodiment illustrated in FIG. 34, four source follower stages 3405 are employed, however in other embodiments fewer or more may be used. Resistors 3410 are coupled to sources 3407 of source follower stages 3405.

An ESD transistor 3415 is coupled to one or more source follower stages 3405 and may be configured to conduct a current greater than 500 mA when exposed to an overvoltage pulse, as discussed below. Resistors 3410 are disposed between source 3420 of ESD transistor 3415 and each source 3407 of source follower stages 3405. Drains 3408 of source follower stages 3405 are connected to drain 3425 of ESD transistor 3415. Source 3407 of the last source follower stage is coupled to gate 3430 of ESD transistor 3415.

In one embodiment, a turn-on voltage of ESD clamp circuit 3400 can be set by the total number of source follower stages 3405. However, since the last source follower stage is a transistor with a certain drain 3408 to source 3407 voltage and gate 3406 to source voltage the current through the final resistor 3410 may be relatively large and may result in a larger gate 3430 to source 3420 voltage across ESD transistor 3415. This condition may result in a relatively large ESD current capability and in some embodiments an improved leakage performance compared to other ESD circuit configurations.

In further embodiments, ESD clamp circuit 3400 may have a plurality of degrees of freedom with regard to transistor sizes and resistor values. In some embodiments ESD clamp circuit 3400 may be able to be made smaller than other ESD circuit configurations. In other embodiments, the performance of ESD clamp circuit 3400 may be improved by incrementally increasing the size of source follower stages 3405 as they get closer to ESD transistor 3415. In further embodiments, resistors 3410 can be replaced by depletion-mode transistors, reference current sinks or reference current sources, for example.

Figure 35:
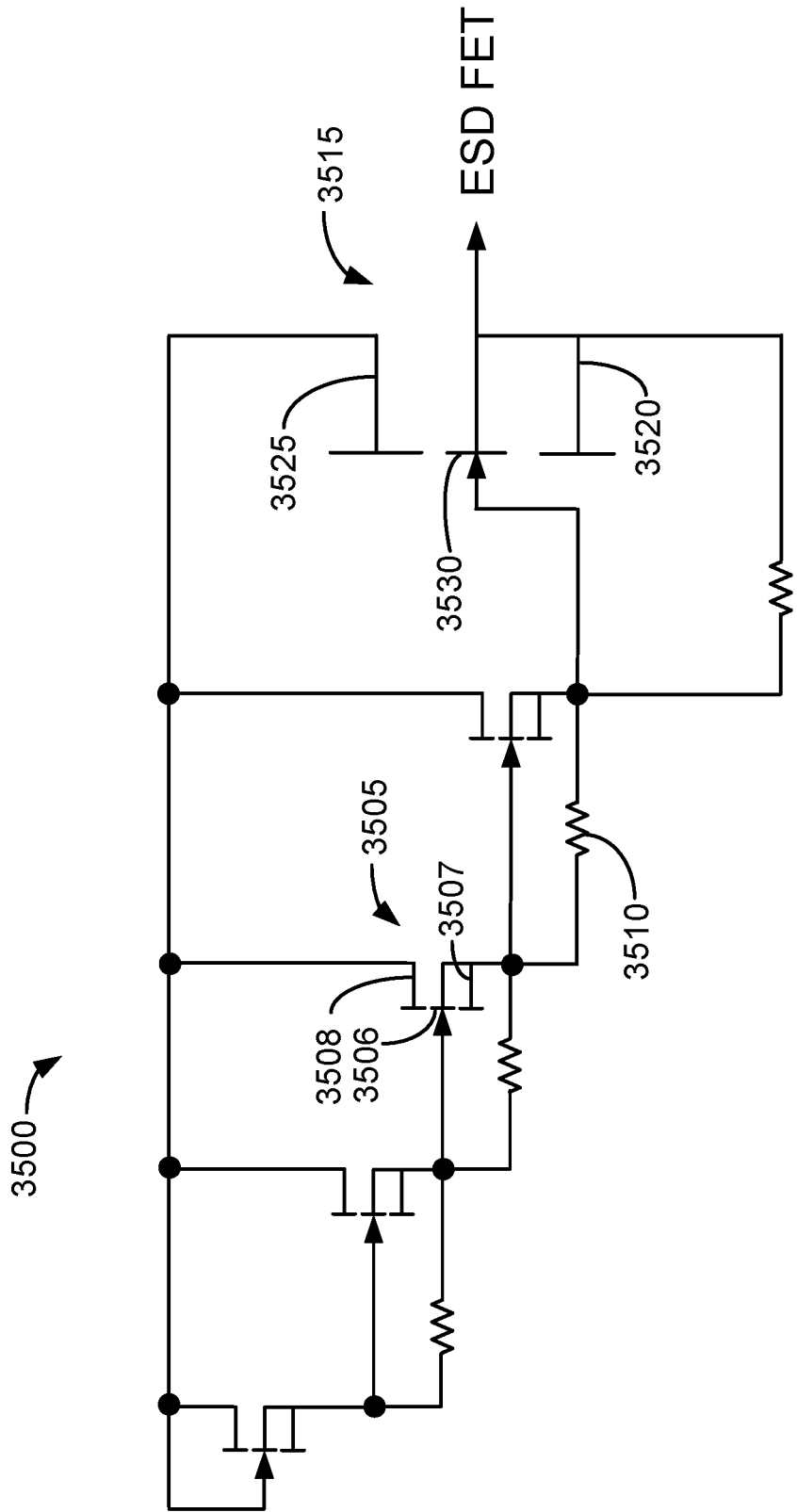
FIG. 35 is a schematic of an electro-static discharge (ESD) clamp circuit according to an embodiment of the invention.

Now referring to FIG. 35 an embodiment similar to ESD clamp circuit 3400 in FIG. 34 is illustrated, however ESD clamp circuit 3500 may have resistors in a different configuration, as discussed in more detail below. ESD clamp circuit 3500 may have a configuration employing one or more source follower stages 3505 made from one or more enhancement-mode transistors. Each source follower stage 3505 may have a gate 3506 connected to a source 3507 of an adjacent source follower stage. In the embodiment illustrated in FIG. 35, four source follower stages 3505 are employed, however in other embodiments fewer or more may be used. Resistors 3510 are coupled between sources 3507 of adjacent source follower stages 3505. An ESD transistor 3515 is coupled to source follower stages 3505 with resistor 3510 disposed between source 3520 of ESD transistor 3515 and source 3507 of a source follower stage 3505. Drains 3508 of source follower stages 3505 may be coupled together and to drain 3525 of ESD transistor 3515.

Electronic Packaging

Figure 36:
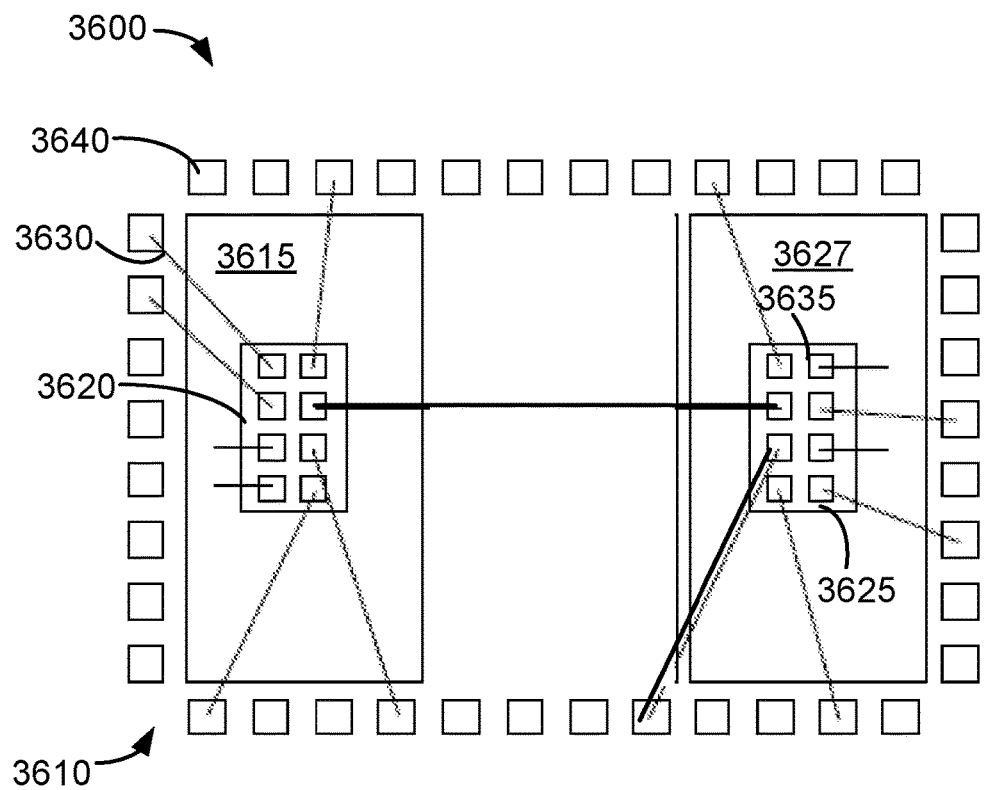
FIG. 36 is an illustration of a portion of an electronic package according to an embodiment of the invention.
Figure 37:
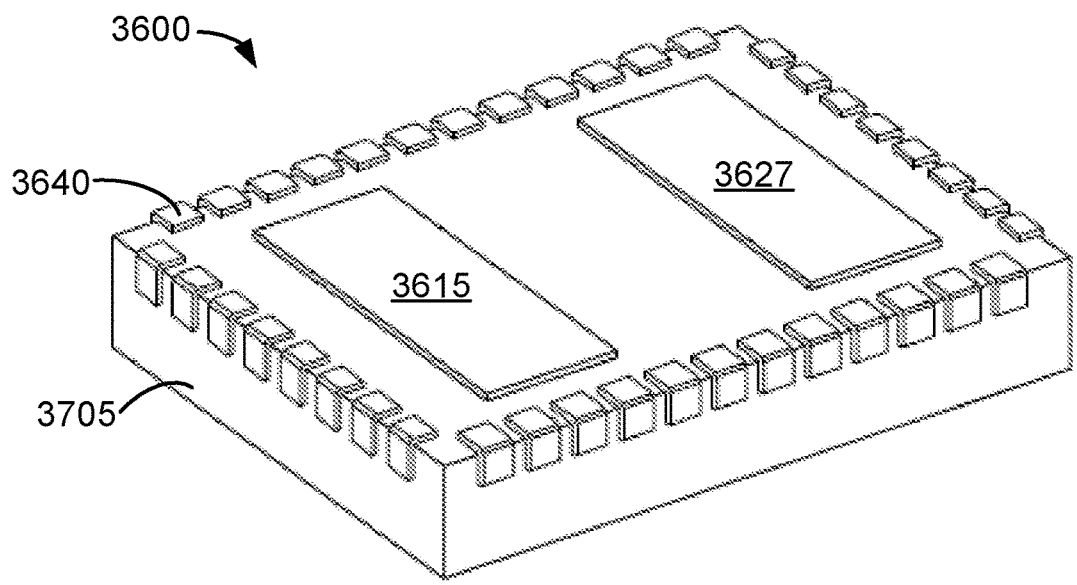
FIG. 37 is an illustration of the electronic package of FIG. 36.

Now referring to FIGS. 36 and 37, in some embodiments, one or more semiconductor devices may be disposed in one or more electronic packages. Myriad packaging configurations and types of electronic packages are available and are within the scope of this disclosure. FIG. 36 illustrates one example of what is known as a quad-flat no-lead electronic package with two semiconductor devices within it.

Electronic package 3600 may have a package base 3610 that has one or more die pads 3615 surrounded by one or more terminals 3620. In some embodiments package base 3610 may comprise a leadframe while in other embodiments it may comprise an organic printed circuit board, a ceramic circuit or another material.

In the embodiment depicted in FIG. 36, a first device 3620 is mounted to a first die pad 3615 and a second device 3625 is mounted to a second die pad 3627. In another embodiment one or more of first and second devices 3620, 3625, respectively may be mounted on an insulator (not shown) that is mounted to package base 3610. In one embodiment the insulator may be a ceramic or other non-electrically conductive material. First and second devices 3620, 3625, respectively are electrically coupled to terminals 3640 with wire bonds 3630 or any other type of electrical interconnect such as, for example, flip-chip bumps or columns that may be used in a flip-chip application. Wirebonds 3630 may extend between device bond pads 3635 to terminals 3640, and in some cases to die pads 3615, 3627 and in other cases to device bond pads 3635 on an adjacent device.

Now referring to FIG. 37, an isometric view of electronic package 3600 is shown. Terminals 3640 and die attach pads 3615 and 3627 may be disposed on an external surface and configured to attach to a printed circuit board or other device. In further embodiments, terminals 3640 and die attach pads 3615 and 3627 may only be accessible within the inside of electronic package 3600 and other connections may be disposed on the outside of the electronic package. More specifically, some embodiments may have internal electrical routing and there may not be a one to one correlation between internal and external connections.

In further embodiments first and second devices 3620, 3625, respectively (see FIG. 36) and a top surface of package base 3610 may be encapsulated by a non-electrically conductive material, such as for example, a molding compound. Myriad other electronic packages may be used such as, but not limited to, SOIC's, DIPS, MCM's and others. Further, in some embodiments each device may be in a separate electronic package while other embodiments may have two or more electronic devices within a single package. Other embodiments may have one or more passive devices within one or more electronic packages.

Half Bridge Circuit #3

Figure 38:
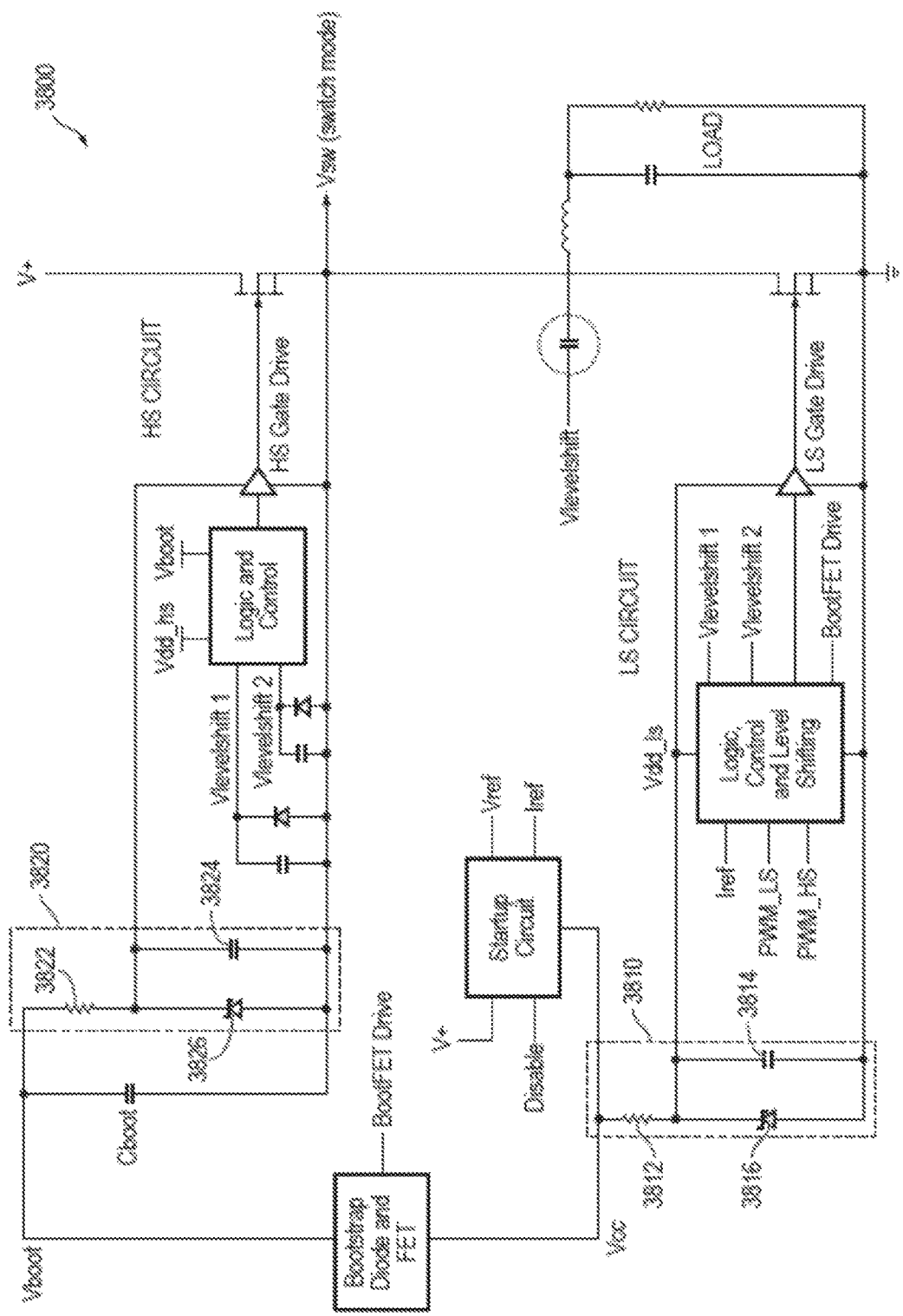
FIG. 38 is a simplified schematic of a half bridge power conversion circuit according to an embodiment.

Now referring to FIG. 38, a third embodiment of a half bridge circuit 3800 is disclosed. Half bridge circuit 3800 may have the same or similar characteristics, features, components, and/or functionality as circuit 100 illustrated in FIG. 1.

As shown, half bridge circuit 3800, in addition to components included in circuit 100 of FIG. 1, additionally includes first and second clamp and filter circuits 3810 and 3820.

Clamp and filter circuit 3810 is connected to Vcc, Vdd_ls, and ground, and includes resistor 3812, capacitor 3814, and clamp element 3816. Resistor 3812 and capacitor 3814 collectively form a filter which attenuates transient voltages of power supply node Vdd_ls. Clamp element 3816 may comprise one or more Zener diodes or other clamping elements, and is configured to conduct current from Vdd_ls to ground if the voltage of power supply node Vdd_ls is greater than a threshold greater than the ground voltage, thereby clamping the voltage at Vdd_ls to the voltage at ground plus the threshold.

Clamp and filter circuit 3820 is connected to Vboot, Vdd_hs, and Vsw, and includes resistor 3822, capacitor 3824, and clamp element 3826. Resistor 3822 and capacitor 3824 collectively form a filter which attenuates transient voltages of power supply node Vdd_hs. Clamp element 3826 may comprise one or more Zener diodes or other clamping elements, and is configured to conduct current from Vdd_hs to Vsw if the voltage of power supply node Vdd_hs greater than a threshold greater than the Vsw voltage, thereby clamping the voltage at Vdd_hs to the voltage at Vsw plus the threshold.

Figure 39:
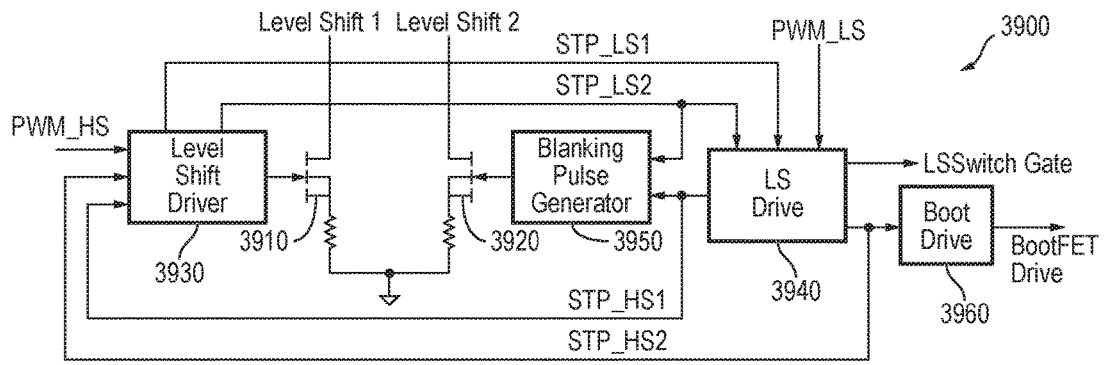
FIG. 39 is a schematic illustration of an embodiment of a low side control circuit.

FIG. 39 is a schematic illustration of an embodiment of a low side control circuit 3900, which is an embodiment of the Logic, Control, and Level Shifting circuit of circuit 3800 of FIG. 38. Control circuit 3900 may have the same or similar characteristics, features, components, and/or functionality as circuit 150 illustrated in FIG. 2.

In the illustrated embodiment, first and second level shift transistors 3910 and 3920 are configured to control turn-on and turn-off of a high side transistor of a half bridge circuit, such as any discussed herein. In some embodiments, first and second level shift transistors 3910 and 3920 may be employed to communicate with high side logic and control circuit, such as that illustrated in the half bridge circuits discussed herein by generating signals Level Shift 1 and Level Shift 2. In some embodiments, first and second level shift transistors 3910 and 3920 may be high voltage enhancement-mode GaN transistors.

In the illustrated embodiment, the level shift driver 3930 receives the PWM_HS logic signal, and first and second level shift driver control signals. As discussed further below, based on these signals, the level shift driver 3930 generates a first level shift input signal for the gate of the first level shift transistor 3910, and first and second LS switch drive control signals.

In the illustrated embodiment, the LS switch drive 3940 receives the PWM_LS logic signal, and the first and second LS switch drive control signals. As discussed further below, based on these signals, the LS switch drive 3940 generates a low side switch driver control signal, and the first and second level shift driver control signals. In the illustrated embodiment, LS switch drive 3940 also generates a signal for a Bootstrap driver 3960, which drives a bootstrap circuit, such as any of the bootstrap circuits discussed herein. In some embodiments, LS switch drive 3940 does not generate such a signal for a Bootstrap driver.

In the illustrated embodiment, the Blanking Pulse Generator 3950 receives the second LS switch drive control signal and the first level shift driver control signal. As discussed further below, based on these signals, the Blanking Pulse Generator 3950 generates a second level shift input signal for the gate of the second level shift transistor 3920.

Figure 40:
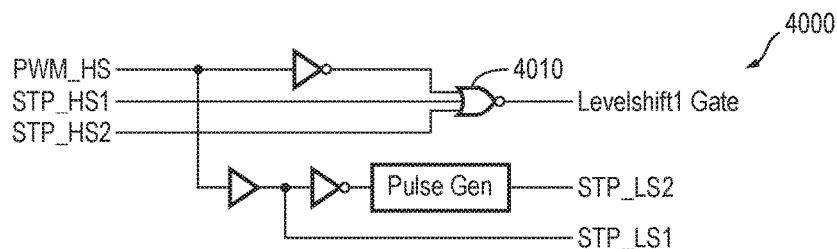
FIG. 40 is a schematic illustration of a level shift driver.

FIG. 40 is a schematic illustration of a level shift driver 4000, which is an embodiment of level shift driver 3930 of FIG. 39.

As shown, level shift driver 4000 receives the PWM_HS logic signal and conditionally generates a LevelShift1Gate signal, which is the first level shift input signal, and is transmitted to the gate of the first level shift transistor 3910. The LevelShift1Gate signal is conditioned with NOR gate 4010 by first and second shoot through protection signals STP_HS1 and STP_HS2, which are the first and second level shift driver control signals.

As a result of the conditioning of the LevelShift1Gate signal by the first and second shoot through protection signals STP_HS1 and STP_HS2, the level shift driver 4000 responds to the PWM_HS signal only after a delay, where the delay is the sum of the on time of the low side (LS) gate and the pulse width of STP_HS1. This ensures that High to Low transition of the LS gate driving the Vsw (switch node) of the half bridge circuit (see, e.g. FIG. 38) is completed with some margin before the level shift driver 3930 can respond to the PWM_HS signal, which causes the HS gate to drive the Vsw (switch node) of the half bridge circuit high. As a result, the LS gate and the HS gate are not simultaneously on during low to high voltage transitions of the Vsw (switch node).

As shown in FIG. 40, level shift driver 4000 also generates shoot through protection signals STP_LS1 and STP_LS2, which are, respectively, the first and second LS switch drive control signals. As indicated, shoot through protection signal STP_LS1 is a delayed version of the PWM_HS signal. In addition, shoot through protection signal STP_LS2 is a pulse generated in response to a high to low transition of the delayed version of the PWM_HS signal.

Figure 41:
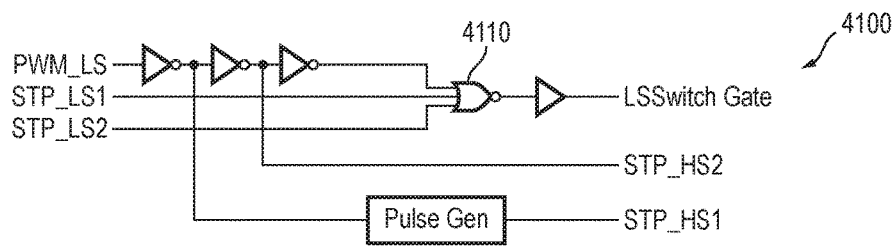
FIG. 41 is a schematic illustration of an LS switch drive.

FIG. 41 is a schematic illustration of an LS switch drive 4100, which is an embodiment of LS switch drive 3940 of FIG. 39.

As shown, LS switch drive 4100 receives the PWM_LS logic signal and conditionally generates an LSSwitchGate signal, which is the low side switch driver control signal, and is transmitted to the LS Gate Drive of FIG. 38. The LSSwitch Gate signal is conditioned with NOR gate 4110 by first and second shoot through protection signals STP_LS1 and STP_LS2, which are the first and second LS switch drive control signals.

As a result of the conditioning of the LSSwitch Gate signal by the first and second shoot through protection signals STP_LS1 and STP_LS2, the LS switch drive 4100 responds to the PWM_LS signal only after a delay, where the delay is the sum of the on time of the LevelShift1 Gate signal and the pulse width of signal STP_LS2. This ensures that High to Low transition of the HS gate driving the Vsw (switch node) of the half bridge circuit (see, e.g. FIG. 38) is completed with some margin before the LS driver 4100 can respond to the PWM_LS signal, which causes the LS gate driving the Vsw (switch node) of the half bridge circuit to drive the Vsw (switch node) of the half bridge circuit low. As a result, the LS gate and the HS gate are not simultaneously on during high to low voltage transitions of the Vsw (switch node).

As shown in FIG. 41, LS switch drive 4100 also generates shoot through protection signals STP_HS1 and STP_HS2. As indicated, shoot through protection signal STP_HS2 is a delayed version of the PWM_HS signal. In addition, shoot through protection signal STP_HS1 is a pulse generated in response to a high to low transition of the PWM_LS signal.

Figure 42:
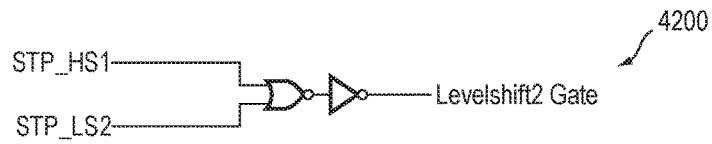
FIG. 42 is a schematic illustration of a Blanking Pulse Generator.

FIG. 42 is a schematic illustration of a Blanking Pulse Generator 4200, which is an embodiment of Blanking Pulse Generator 3950 of FIG. 39.

As shown, Blanking Pulse Generator 4200 generates a LevelShift2Gate signal, which is the logical OR of the shoot through protection signals STP_HS1 and STP_LS2, discussed above. The LevelShift2Gate signal is the second level shift input signal. Consequently, Blanking Pulse Generator 4200 generates a LevelShift2Gate signal in response to a high to low transition of either of the PWM_HS signal and the PWM_LS signal. A beneficial result of the LevelShift2Gate signal is that high to low voltage transitions of Vsw (switch node) which have high slew rate do not induce undesired turn-on of the HS gate.

Figure 43:
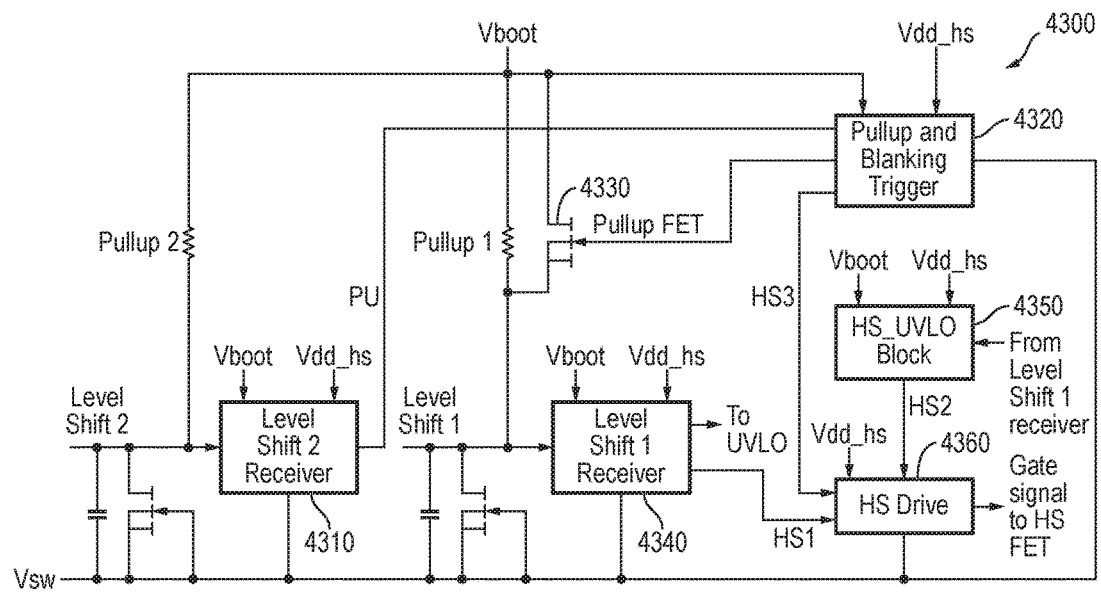
FIG. 43 is a schematic illustration of an embodiment of a high side control circuit.

FIG. 43 is a schematic illustration of an embodiment of a high side control circuit 4300, which is an embodiment of the Logic and Control circuit of circuit 3800 of FIG. 38. Logic and control circuit 4300 may have the same or similar characteristics, features, components, and/or functionality as circuit 153 illustrated in FIG. 14.

In the illustrated embodiment, control circuit 4300 receives power supply voltages Vboot and Vdd_hs. Control circuit 4300 also receives input signals Level Shift 1 and Level Shift 2 from low side control circuit 3900. In response to the input signals, control circuit 4300 generates a gate drive signal, which controls the state of the HS gate.

In the illustrated embodiment, high side control circuit 4300 includes Level Shift 2 Receiver 4310, Pullup and Blanking Trigger circuit 4320, Pullup FET 4330, Level Shift 1 Receiver 4340, HS_UVLO 4350, and HS Drive circuit 4360, each of which are voltage referenced to Vsw (switch node).

In the illustrated embodiment, Level Shift 2 Receiver 4310 receives input signal Level Shift 2, generated by low side control circuit 3900. As discussed further below, based on this signal, Level Shift 2 Receiver 4310 generates a signal PU for Pullup and Blanking trigger circuit 4320.

In the illustrated embodiment, Pullup and Blanking Trigger circuit 4320 receives the PU signal from the Level Shift 2 Receiver 4310. As discussed further below, based on these signals, Pullup and Blanking Trigger circuit 4320 generates a control signal for Pullup FET 4330 and an input signal HS3 for HS Drive circuit 4360.

In the illustrated embodiment, Pullup FET 4330 receives the control signal from the Pullup and Blanking Trigger circuit 4320. Based on the received control signal, Pullup FET 4330 selectively causes the voltage of the Level Shift 1 signal to go to Vboot.

In the illustrated embodiment, Level Shift 1 Receiver 4340 receives the Level Shift 1 signal from the low side control circuit 3900 and the Pullup FET 4330. As discussed further below, based on these signals, Level Shift 1 Receiver 4340 generates a control signal for HS UVLO 4350 and an input signal HS1 for HS Drive circuit 4360.

In the illustrated embodiment, HS_UVLO 4350 receives the control signal from the Level Shift 1 Receiver 4340. As discussed further below, based on this signal, HS_UVLO 4350 generates an input signal HS2 for HS Drive circuit 4360.

In the illustrated embodiment, HS Drive circuit 4360 receives the input signals HS1, HS2, and HS3, respectively from Level Shift 1 Receiver 4340, HS_UVLO 4350, and Pullup and Blanking Trigger 4320. As discussed further below, based on these signals, HS Drive circuit 4360 generates the gate drive signal, which controls the state of the HS gate.

Figure 44:
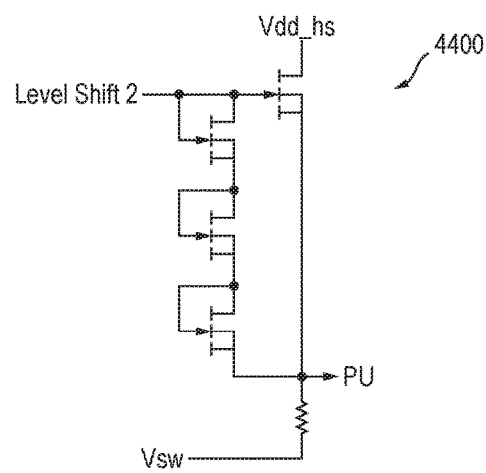
FIG. 44 is a schematic illustration of a Level Shift 2 Receiver.

FIG. 44 is a schematic illustration of a Level Shift 2 Receiver 4400, which is an embodiment of Level Shift 2 Receiver 4310 of FIG. 43.

Level Shift 2 Receiver 4400 is configured to level shift the received input signal a diode drop to generate output signal PU. In alternative embodiments, other level shifting structures may be used.

Figure 45:
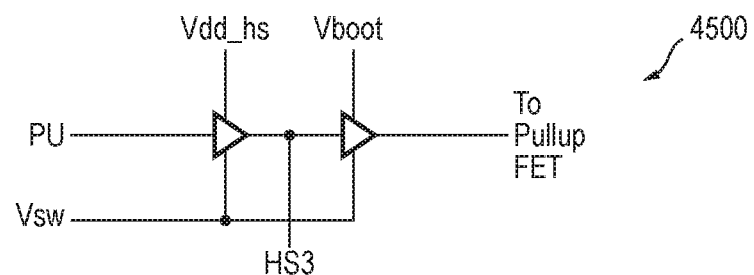
FIG. 45 is a schematic illustration of a Pullup and Blanking Trigger circuit.

FIG. 45 is a schematic illustration of a Pullup and Blanking Trigger circuit 4500, which is an embodiment of Pullup and Blanking Trigger circuit 4320 of FIG. 43.

Pullup and Blanking Trigger circuit 4500 is configured to buffer and delay the received PU signal by one buffer delay to generate output signal HS3. In addition, Pullup and Blanking Trigger circuit 4500 is configured to level shift, buffer and delay the received PU signal by two buffer delays to generate the control signal for Pullup FET 4330. In alternative embodiments, other buffering, level shifting, and delaying structures may be used.

Figure 46:
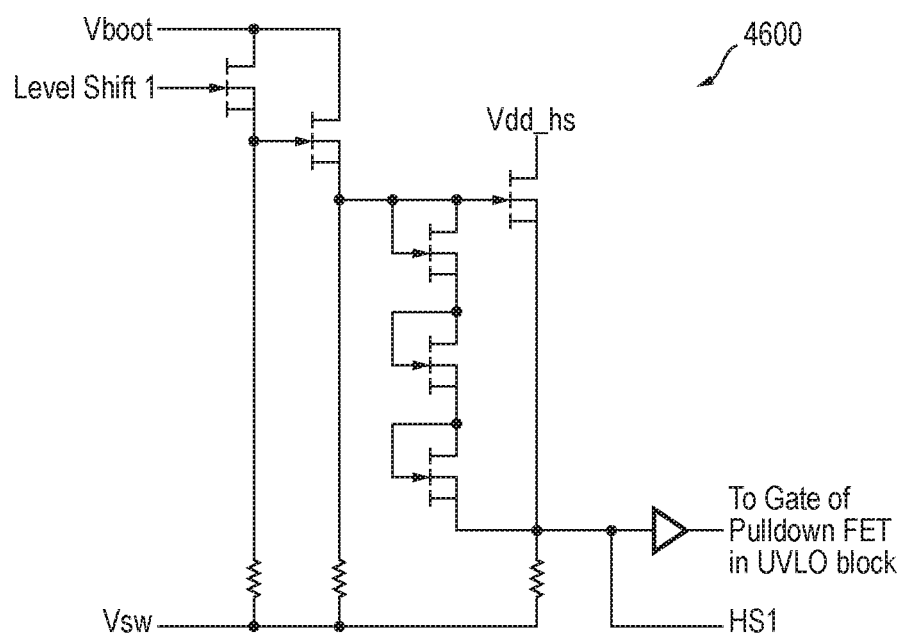
FIG. 46 is a schematic illustration of a Level Shift 1 Receiver.

FIG. 46 is a schematic illustration of a Level Shift 1 Receiver 4600, which is an embodiment of Level Shift 1 Receiver 4340 of FIG. 43.

Level Shift 1 Receiver 4600 is configured to level shift and buffer the received Level Shift 1 input signal by three diode drops to generate the control signal for the HS_UVLO 4350. In alternative embodiments, other level shifting and buffering structures may be used.

Figure 47:
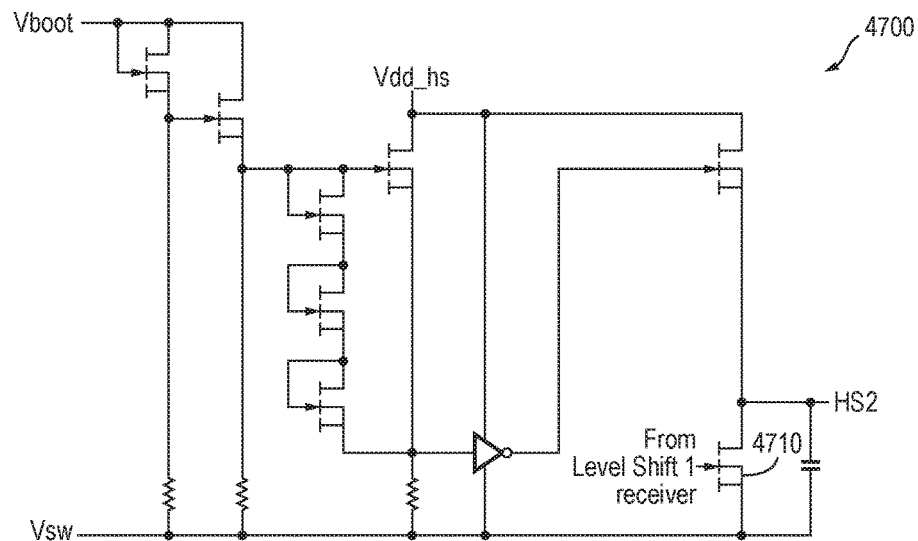
FIG. 47 is a schematic illustration of an HS UVLO.

FIG. 47 is a schematic illustration of an HS_UVLO 4700, which is an embodiment of HS_UVLO 4350 of FIG. 43.

HS_UVLO 4700 is configured to receive the control signal from Level Shift 1 Receiver 4340 and to conditionally invert the received control signal to generate the control signal HS2 for the HS drive 4360. As shown, if the voltage of the power supply Vb (connected to Vboot in FIG. 43) is above a threshold, the control signal HS2 is the inverted signal from the Level Shift 1 Receiver 4340. For example, if Vboot is greater than 4*Vth above Vsw, in response to the control signal from the Level Shift 1 Receiver 4340 being high, the transistor 4710 turns on and pulls HS2 signal close to voltage of Vsw. However, if the voltage of the power supply Vb (connected to Vboot in FIG. 43) is at or below the threshold, the control signal HS2 is driven to the voltage of the power supply Vdhs (connected to Vdd_hs in FIG. 43). In some embodiments, a resistor (not shown) is connected between the HS2 output and Vsw. Once the control signal HS2 is driven to the Vsw voltage, it can be pulled up to the Vdhs voltage only after the Vb voltage is below the threshold, which occurs, for example, in response to the operation of the discharging of the capacitor Cboot of FIG. 38. In alternative embodiments, other structures may be used.

As a result of the conditioned control signal HS2, the HS_UVLO 4700 prevents the HS gate from turning on if the voltage of the power supply Vboot goes below the threshold.

Figure 48:
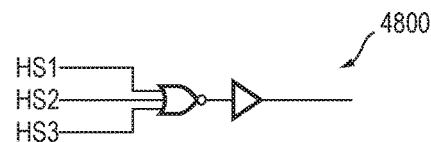
FIG. 48 is a schematic illustration of an HS Drive circuit.

FIG. 48 is a schematic illustration of an HS Drive circuit 4800, which is an embodiment of HS Drive circuit 4360 of FIG. 43.

HS Drive circuit 4800 is configured to receive the input signals HS1, HS2, and HS3, respectively from Level Shift 1 Receiver 4340, HS_UVLO 4350, and Pullup and Blanking Trigger 4320. Based on these signals, HS Drive circuit 4800 generates the gate drive signal, which controls the state of the HS gate. In this embodiment, the gate drive signal is the logical NOR of the input signals HS1, HS2, and HS3. In some embodiments, input signal HS1 causes the state of the HS gate to change according to the PWM_HS signal, the input signal HS2 prevents the HS gate from turning on under the condition that the Vboot voltage drops below a threshold, and the input signal HS3 prevents the HS gate from turning on in response to a fast voltage transition at the Vsw (switch node). In alternative embodiments, other structures may be used.

Figure 49:
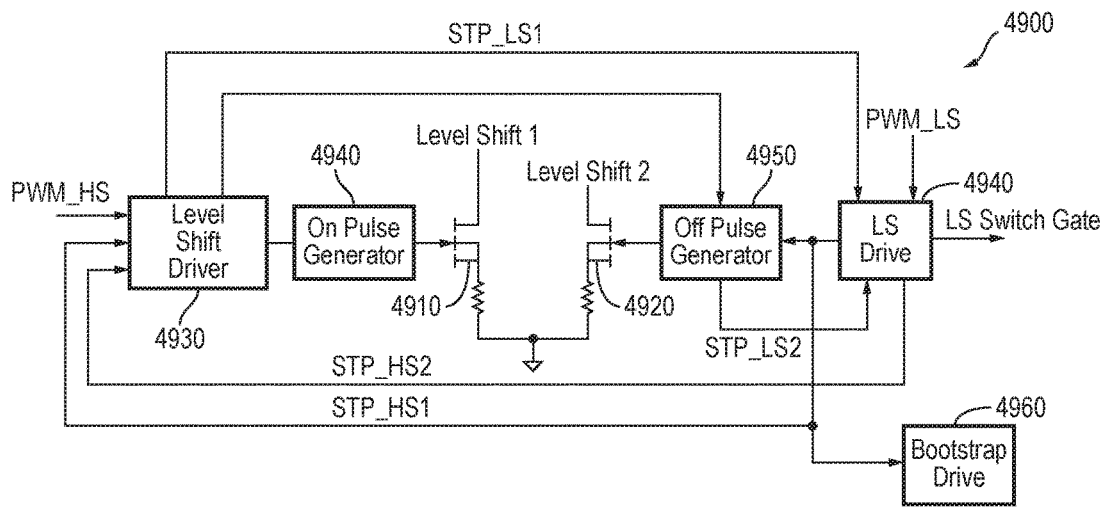
FIG. 49 is a schematic illustration of an embodiment of a low side control circuit.

FIG. 49 is a schematic illustration of an embodiment of a low side control circuit 4900, which is an embodiment of the Logic, Control, and Level Shifting circuit of circuit 3800 of FIG. 38. Control circuit 4900 may have the same or similar characteristics, features, components, and/or functionality as circuit 150 illustrated in FIG. 2.

In the illustrated embodiment, first and second level shift transistors 4910 and 4920 are configured to control turn-on and turn-off of a high side transistor of a half bridge circuit, such as any discussed herein. In some embodiments, first and second level shift transistors 4910 and 4920 may be employed to communicate with a high side logic and control circuit, such as that illustrated in the half bridge circuits discussed herein by generating signals Level Shift 1 and Level Shift 2. In some embodiments, first and second level shift transistors 4910 and 4920 may be high voltage enhancement-mode GaN transistors.

In the illustrated embodiment, the level shift driver 4930 receives the PWM_HS logic signal, and first and second level shift driver control signals. As discussed further below, based on these signals, the level shift driver 4930 generates a level shift signal for the on pulse generator 4970, a first LS switch drive control signal, and an off pulse generator control signal.

In the illustrated embodiment, the on pulse generator 4970 receives the level shift signal from the level shift driver 4930. As discussed further below, based on this signal, the pulse generator 4970 generates a first level shift input signal for the gate of the first level shift transistor 4910.

In the illustrated embodiment, the LS switch drive 4940 receives the PWM_LS logic signal, the first LS switch drive control signal, and a second LS switch drive control signal. As discussed further below, based on these signals, the LS switch drive 4940 generates a low side switch driver control signal, and first and second level shift driver control signals. In the illustrated embodiment, the LS switch drive control signal is transmitted to a Bootstrap driver 4960, which drives a bootstrap circuit, such as any of the bootstrap circuits discussed herein. In some embodiments, LS switch drive 4940 does not generate such a signal for a Bootstrap driver. In some embodiments, LS switch drive 4940 has the same or similar characteristics, features, components, and/or functionality as LS switch drive 3940 illustrated in FIG. 39.

In the illustrated embodiment, the off pulse generator 4950 receives the off pulse generator control signal from the level shift driver 4930, and the first level shift driver control signal from the LS drive circuit 4940. As discussed further below, based on these signals, the off pulse generator 4950 generates a second level shift input signal for the gate of the second level shift transistor 4920 and the second LS switch drive control signal.

Figure 50:
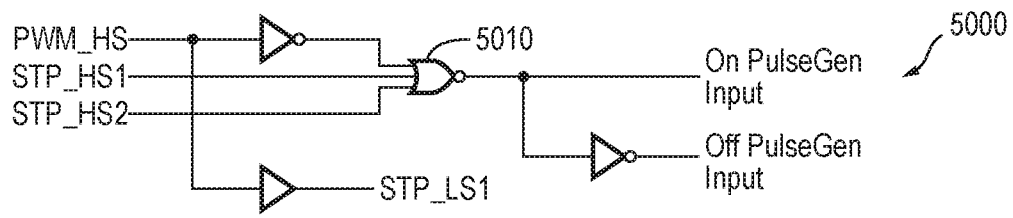
FIG. 50 is a schematic illustration of a level shift driver.

FIG. 50 is a schematic illustration of a level shift driver 5000, which is an embodiment of level shift driver 4930 of FIG. 49.

As shown, level shift driver 5000 receives the PWM_HS logic signal and conditionally generates on pulse generator input and off pulse generator input signals, which are, respectively, the level shift signal for the on pulse generator 4970, and the off pulse generator control signal. The on pulse generator input and off pulse generator input signals are conditioned with NOR gate 5010 by first and second shoot through protection signals STP_HS1 and STP_HS2, which are the first and second level shift driver control signals.

As a result of the conditioning of the on pulse generator input and off pulse generator input signals by the first and second shoot through protection signals STP_HS1 and STP_HS2, the level shift driver 5000 responds to the PWM_HS signal only after a delay, where the delay is the sum of the on time of the low side (LS) gate signal and the pulse width of STP_HS1. This ensures that High to Low transition of the LS gate driving the Vsw (switch node) of the half bridge circuit (see, e.g. FIG. 38) is completed with some margin before the level shift driver 4930 can respond to the PWM_HS signal, which causes the HS gate driving the Vsw (switch node) of the half bridge circuit to drive the Vsw (switch node) of the half bridge circuit high. As a result, the LS gate and the HS gate are not simultaneously on during low to high voltage transitions of the Vsw (switch node).

As shown in FIG. 50, level shift driver 5000 also generates shoot through protection signal STP_LS1, which is the first LS switch drive control signal. As indicated, shoot through protection signal STP_LS1 is a delayed version of the PWM_HS signal, which is the first LS switch drive control signal.

Figure 51:
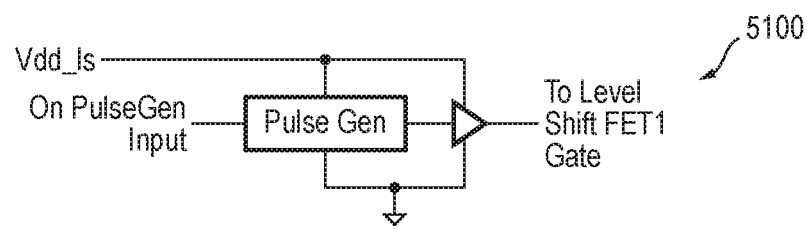
FIG. 51 is a schematic illustration of an on pulse generator.

FIG. 51 is a schematic illustration of an on pulse generator 5100, which is an embodiment of on pulse generator 4970 of FIG. 49.

As shown, on pulse generator 5100 receives the on pulse generator input signal from the level shift driver 4930 and generates the first level shift input signal for the gate of the first level shift transistor 4910. The first level shift input signal comprises pulses which are each generated in response to a transition of the on pulse generator input signal.

Figure 52:
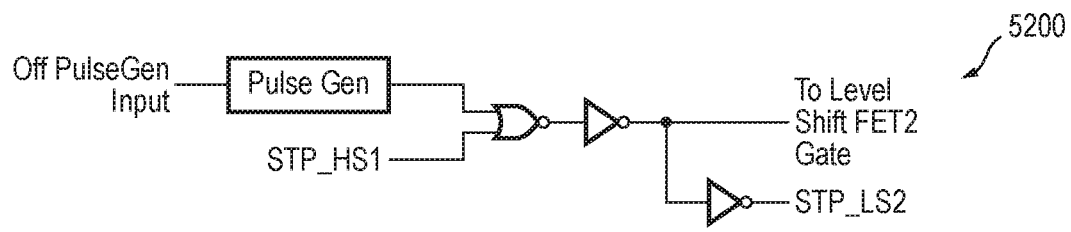
FIG. 52 is a schematic illustration of an off pulse generator.

FIG. 52 is a schematic illustration of an off pulse generator 5200, which is an embodiment of off pulse generator 4950 of FIG. 49.

As shown, off pulse generator 5200 receives the off pulse generator input signal from the level shift driver 4930 and the first level shift driver control signal from the LS drive circuit 4940. Based on these signals, off pulse generator 5200 conditionally generates the second level shift input signal for the gate of the second level shift transistor 4920 and the second LS switch drive control signal for the LS switch drive 4940. The second level shift input signal and the second LS switch drive control signal each comprise pulses which are each generated in response to a transition of the off pulse generator input signal. As shown, the second level shift input signal and the second LS switch drive control signal are conditioned on the first and second level shift driver control signals.

Figure 53:
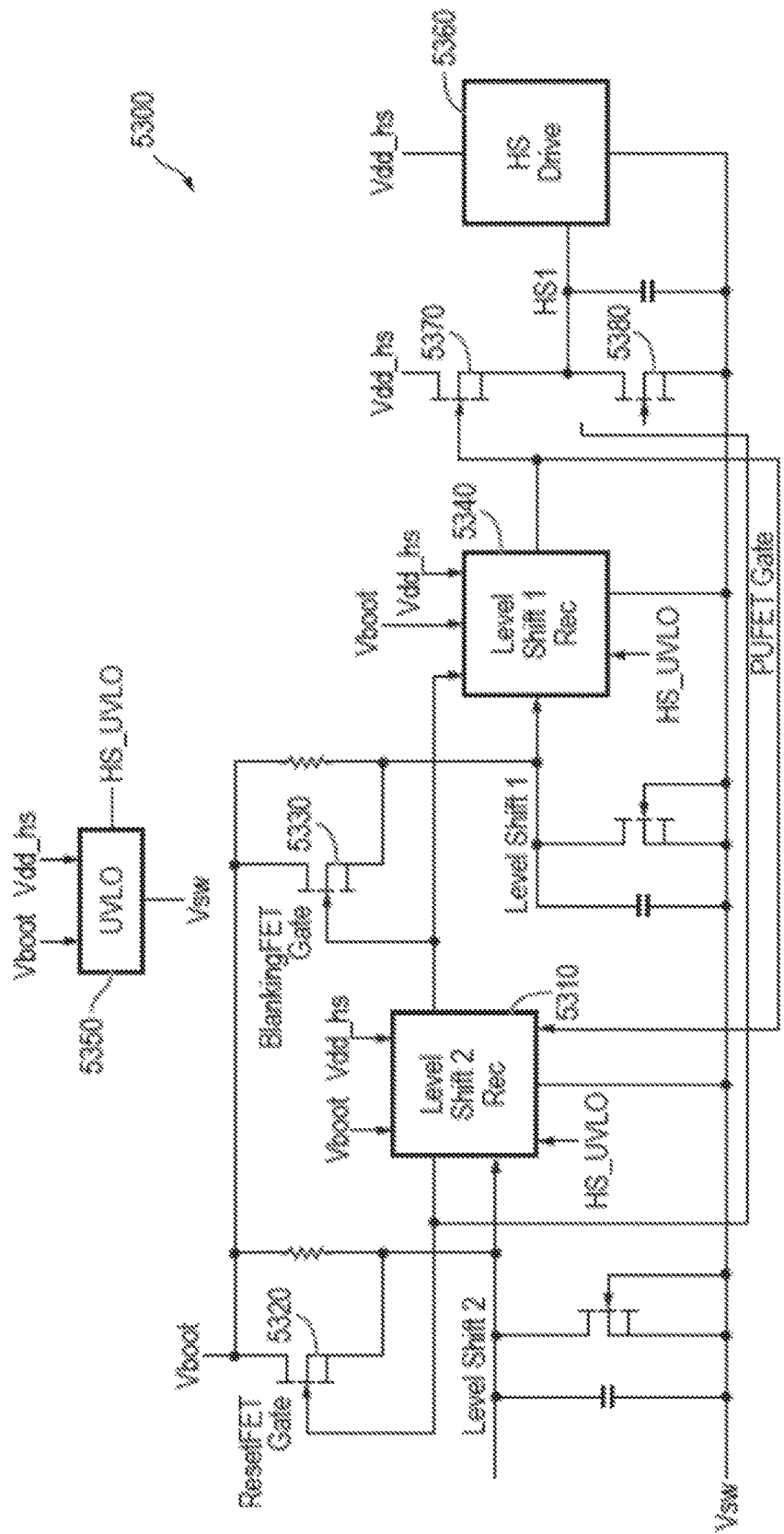
FIG. 53 is a schematic illustration of an embodiment of a high side control circuit.

FIG. 53 is a schematic illustration of an embodiment of a high side control circuit 5300, which is an embodiment of the Logic and Control circuit of circuit 3800 of FIG. 38. Logic and control circuit 5300 may have the same or similar characteristics, features, components, and/or functionality as circuit 153 illustrated in FIG. 14.

In the illustrated embodiment, control circuit 5300 receives power supply voltages Vboot and Vdd_hs. Control circuit 5300 also receives input signals Level Shift 1 and Level Shift 2 from low side control circuit 3900. In response to the input signals, control circuit 5300 generates a gate drive signal, which controls the state of the HS gate.

In the illustrated embodiment, in addition to other components, high side control circuit 5300 includes Level Shift 2 Receiver 5310, Level Shift 1 Receiver 5340, HS_UVLO 5350, and HS Drive circuit 5360, each of which are voltage-referenced to Vsw (switch node).

In the illustrated embodiment, Level Shift 2 Receiver 5310 receives input signal Level Shift 2, generated by low side control circuit 4900 and the Reset Pullup FET 5320. In addition, Level Shift 2 Receiver 5310 receives a first level shift receiver control signal from HS_UVLO 5350 and a second level shift 2 receiver control signal from Level Shift 1 Receiver 5340. As discussed further below, based on these signals, Level Shift 2 Receiver 5310 generates first and second control signals, respectively for Reset and Blanking Pullup FETs 5320 and 5330.

In the illustrated embodiment, Reset Pullup FET 5320 receives the first control signal from Level Shift 2 Receiver 5310. Based on the received control signal, Reset Pullup FET 5320 selectively causes the voltage of the Level Shift 2 signal to go to Vboot.

In the illustrated embodiment, Blanking Pullup FET 5330 receives the second control signal from Level Shift 2 Receiver 5310. Based on the received control signal, Blanking Pullup FET 5330 selectively causes the voltage of the Level Shift 1 signal to go to Vboot.

In the illustrated embodiment, Level Shift 1 Receiver 5340 receives the Level Shift 1 signal from the low side control circuit 4900 and the Blanking Pullup FET 5330. In addition, Level Shift 1 Receiver 5340 receives the first level shift receiver control signal from HS_UVLO 5350 and the second control signal generated by Level Shift 2 Receiver 5310. As discussed further below, based on these signals, Level Shift 1 Receiver 5340 generates the second level shift 2 receiver control signal.

In the illustrated embodiment, HS_UVLO 5350, and as discussed further below, HS UVLO 5350 generates the first level shift receiver control signal for each of the Level Shift 2 Receiver and the Level Shift 1 Receiver. HS_UVLO 5350 may have the same or similar characteristics, features, components, and/or functionality as UVLO circuit 1415 of FIG. 18.

In the illustrated embodiment, Pullup FET 5370 also receives the second level shift 2 control signal from Level Shift 1 Receiver 5340. Pullup FET 5370 and Pulldown FET 5380 collectively control the state of HS driver input HS1 based on the first control signal generated by Level Shift 2 Receiver 5310 and on the second level shift 2 receiver control signal generated by Level Shift 1 Receiver 5340.

In the illustrated embodiment, HS Drive circuit 5360 receives the input signal HS1. Based on the HS1 signal, HS Drive circuit 5360 generates the gate drive signal, which controls the state of the HS gate. In some embodiments, HS Drive circuit 5360 comprises an inverter and the gate drive signal it generates is the logical inversion of the input signal HS1. In some embodiments, HS Drive circuit 5360 comprises a buffer and the gate drive signal it generates is a delayed version of the input signal HS1.

Figure 54:
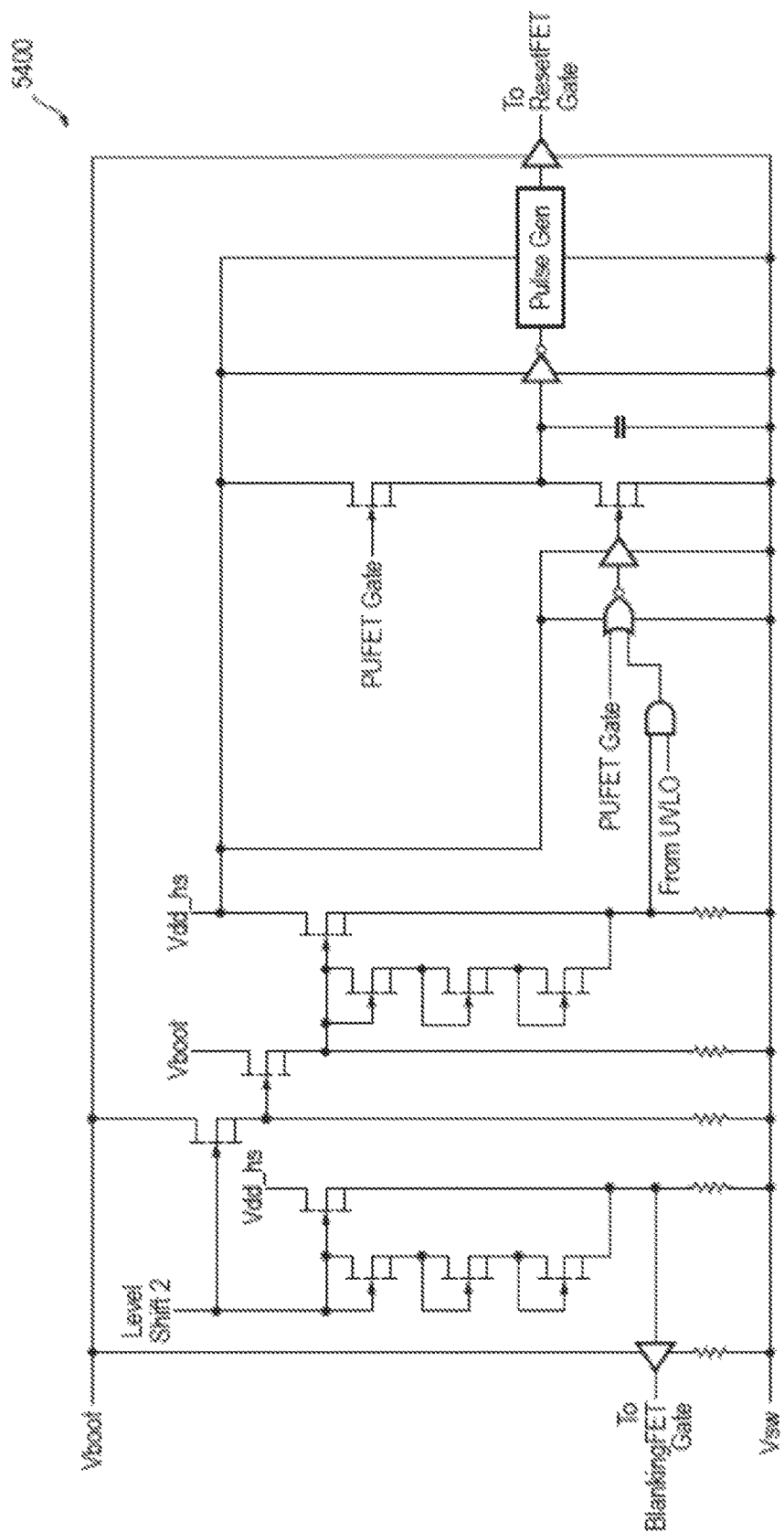
FIG. 54 is a schematic illustration of a Level Shift 2 Receiver.

FIG. 54 is a schematic illustration of a Level Shift 2 Receiver 5400, which is an embodiment of Level Shift 2 Receiver 5310 of FIG. 53.

Level Shift 2 Receiver 5400 receives input signal Level Shift 2, a first level shift receiver control signal from HS UVLO 5350 and a second level shift 2 receiver control signal PUFETGate from Level Shift 1 Receiver 5340. Based on these signals, Level Shift 2 Receiver 5400 generates first and second control signals, respectively for Blanking and Reset Pullup FETs 5320 and 5330.

As shown, the first control signal is a buffered and level shifted version of the input signal Level Shift 2.

The second control signal is a buffered and level shifted version of a pulse generated in response to high to low transitions in the input signal Level Shift 2 conditioned by the first level shift receiver control signal from HS UVLO 5350 and the second level shift 2 receiver control signal PUFETGate from Level Shift 1 Receiver 5340. The second level shift 2 receiver control signal prevents the HS gate from turning off in response to capacitive coupling of low to high transitions at the Vsw output node. The first level shift receiver control signal from HS UVLO 5350 prevents the HS gate from being on while the Vboot voltage is less than a threshold greater than the voltage at the Vsw output node.

Figure 55:
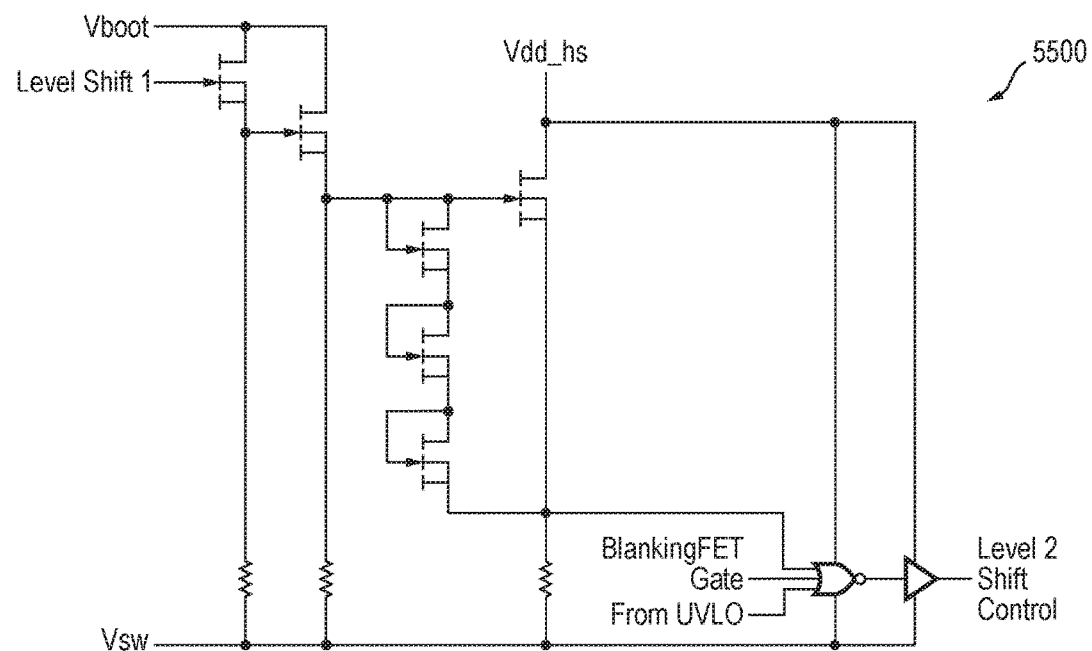
FIG. 55 is a schematic illustration of a Level Shift 1 Receiver.

FIG. 55 is a schematic illustration of a Level Shift 1 Receiver 5500, which is an embodiment of Level Shift 1 Receiver 5340 of FIG. 53.

Level Shift 1 Receiver 5500 receives the Level Shift 1 signal, the first level shift receiver control signal from HS UVLO 5350, and the second control signal generated by Level Shift 2 Receiver 5310. Based on these signals, Level Shift 1 Receiver 5500 generates the second level shift 2 receiver control signal.

As shown, the second level shift 2 receiver control signal is an inverted, buffered, and level shifted version of the Level Shift 1 signal conditioned by the first level shift receiver control signal from HS UVLO 5350, and the second control signal generated by Level Shift 2 Receiver 5310. The first level shift receiver control signal from HS UVLO 5350 prevents the HS gate from being on while the Vboot voltage is less than a threshold greater than the voltage at the Vsw output node. The second control signal generated by Level Shift 2 Receiver 5310 prevents the HS gate from turning on in response to capacitive coupling of voltage transitions at the Vsw output node.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A half bridge GaN circuit, comprising:
   a low side circuit, comprising:
      a low side switch comprising a low side switch control gate, a first source, and a first drain, and
      a low side switch driver, configured to control a conductivity state of the low side switch according to a first input signal;
   a high side circuit, comprising:
      a high side switch comprising a high side switch control gate, a second source, and a second drain, wherein the second source is connected to the first drain, and
      a high side switch driver referenced to a voltage at the second source, wherein the high side switch driver is configured to control a conductivity state of the high side switch according to a second input signal,
      wherein the high side switch driver is configured to prevent a change of conductivity state of the high side switch in response to voltage transients of the voltage of the second source,
   wherein the low side circuit further comprises a level shift circuit configured to receive the second input signal and to generate a level shift signal configured to control an output state of the high side switch driver.

2. The half bridge GaN circuit of claim 1, wherein the high side circuit further comprises a receiver circuit configured to receive the level shift signal and to generate a receiver output signal configured to control the output state of the high side switch driver.

3. The half bridge GaN circuit of claim 2, wherein the low side switch driver comprises a pulse generator configured to generate a pulse in response to signal a causing the low side switch to become non-conductive, and to transmit the pulse to the level shift circuit, and the level shift signal is configured to, in response to receiving the pulse, generate a blanking signal.

4. The half bridge GaN circuit of claim 3, wherein the receiver circuit is configured to, in response to receiving the blanking signal, generate a signal causing the high side switch to be nonconductive.

5. The half bridge GaN circuit of claim 1, wherein the level shift signal comprises a pulse generated in response to the second input signal transitioning from a high logic state to a low logic state.

6. The half bridge GaN circuit of claim 1, wherein the high side switch driver is configured to control the conductivity state of the high side switch according to a plurality of pulses, and wherein durations of on and off times of the high side switch are based on durations of the pulses.

7. The half bridge GaN circuit of claim 1, wherein the high side circuit further comprises a trigger circuit configured to, in response to a voltage of a first power supply referenced to the voltage of the second source being less than a threshold greater than the voltage of the second source, cause the high side switch to turn-off.

8. A half bridge GaN circuit, comprising:
   a low side circuit, comprising:
      a low side switch comprising a low side switch control gate, a first source, and a first drain, and
      a low side switch driver, configured to control a conductivity state of the low side switch according to a first input signal;
   a high side circuit, comprising:
      a high side switch comprising a high side switch control gate, a second source, and a second drain, wherein the second source is connected to the first drain, and
      a high side switch driver referenced to a voltage at the second source, wherein the high side switch driver is configured to control a conductivity state of the high side switch according to a plurality of pulses, and wherein durations of on and off times of the high side switch are based on durations of the pulses,
      wherein the low side circuit further comprises a level shift circuit configured to generate the pulses in response to a second input signal.

9. The half bridge GaN circuit of claim 8, wherein the high side circuit further comprises a receiver circuit configured to receive the pulses and to generate a receiver output signal configured to control an output state of the high side switch driver based on the pulses.

10. The half bridge GaN circuit of claim 9, wherein the low side switch driver comprises a pulse generator configured to generate a low side pulse in response to a signal causing the low side switch to become non-conductive, and to transmit the low side pulse to the level shift circuit, and wherein the level shift circuit is configured to, in response to receiving the low side pulse, generate a blanking signal.

11. The half bridge GaN circuit of claim 10, wherein the receiver circuit is configured to, in response to receiving the blanking signal, generate a signal causing the high side switch to be nonconductive.

12. The half bridge GaN circuit of claim 8, wherein each of the pulses are generated in response to the second input transitioning from a high logic state to a low logic state.

13. A half bridge GaN circuit, comprising:
a low side circuit, comprising:
a low side switch comprising a low side switch control gate, a first source, and a first drain, and
a low side switch driver, configured to control a conductivity state of the low side switch according to a first input signal;
a high side circuit, comprising:
a high side switch comprising a high side switch control gate, a second source, and a second drain, wherein the second source is connected to the first drain, and
a high side switch driver referenced to a voltage at the second source, wherein the high side switch driver is configured to control a conductivity state of the high side switch according to a second input signal, and
a trigger circuit configured to, in response to a voltage of a first power supply referenced to the voltage of the second source being less than a threshold greater than the voltage of the second source, cause the high side switch to turn-off,
wherein the low side circuit further comprises a level shift circuit configured to receive the second input signal and to generate a level shift signal configured to control an output state of the high side switch driver.

14. The half bridge GaN circuit of claim 13, wherein the high side circuit further comprises a receiver circuit configured to receive the level shift signal and to generate a receiver output signal configured to control the output state of the high side switch driver.

15. The half bridge GaN circuit of claim 14, wherein the low side switch driver comprises a pulse generator configured to generate a pulse in response to signal a causing the low side switch to become non-conductive, and to transmit the pulse to the level shift circuit, and the level shift signal is configured to, in response to receiving the pulse, generate a blanking signal.

16. The half bridge GaN circuit of claim 15, wherein the receiver circuit is configured to, in response to receiving the blanking signal, generate a signal causing the high side switch to be nonconductive.

17. The half bridge GaN circuit of claim 13, wherein the level shift signal comprises a pulse generated in response to the second input transitioning from a high logic state to a low logic state.

* * * * *